United States Patent [19]
Shibata et al.

[11] Patent Number: 5,761,139
[45] Date of Patent: Jun. 2, 1998

[54] SEMICONDUCTOR MEMORY HAVING REDUNDANCY MEMORY CELLS

[75] Inventors: Noboru Shibata, Yokohama; Hideo Kato; Yoshio Mochizuki, both of Kawasaki; Takafumi Ikeda, Yokohama, all of Japan

[73] Assignee: Kabushiki Kaisha Toshiba, Tokyo, Japan

[21] Appl. No.: 761,482

[22] Filed: Dec. 6, 1996

[30] Foreign Application Priority Data

Dec. 8, 1995 [JP] Japan .................. 7-320182

[51] Int. Cl.$^6$ .................................................. G11C 7/00
[52] U.S. Cl. .................................. 365/200; 365/104
[58] Field of Search ........................ 365/200, 52, 63, 365/94, 104

[56] References Cited

U.S. PATENT DOCUMENTS 5,124,948  6/1992  Takizawa et al. ............... 365/200
5,179,536  1/1993  Kasa et al. ....................... 365/200
5,535,161  7/1996  Kato .................................. 365/200
5,555,212  9/1996  Toshiaki et al. ................. 365/200

FOREIGN PATENT DOCUMENTS 4-134699  5/1992  Japan .

*Primary Examiner*—David C. Nelms
*Assistant Examiner*—Son Mai
*Attorney, Agent, or Firm*—Loeb & Loeb LLP

[57] ABSTRACT

A redundancy memory cell array is arranged at an end of a main memory cell array in the column direction. Common bit lines and common column lines are arranged on the main memory cell array and the redundancy memory cell array. A disconnection circuit is arranged between the main memory cell array and the redundancy memory cell array for connecting or disconnecting bit lines or column lines. A column selection switch is arranged at an end of the redundancy memory cell array. A redundancy circuit disconnects bit lines or column lines by means of a disconnection circuit when an address signal specifies a defective address.

51 Claims, 42 Drawing Sheets

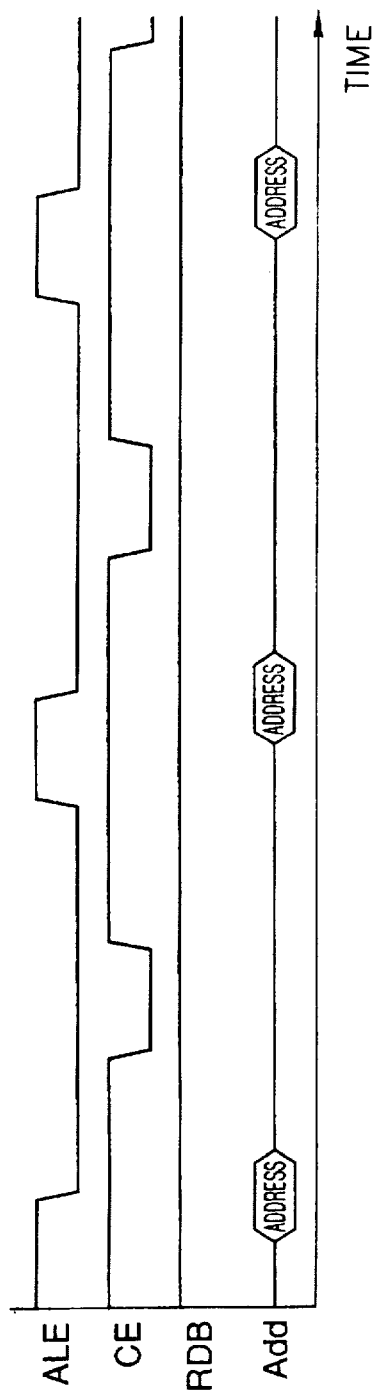
FIG. 29
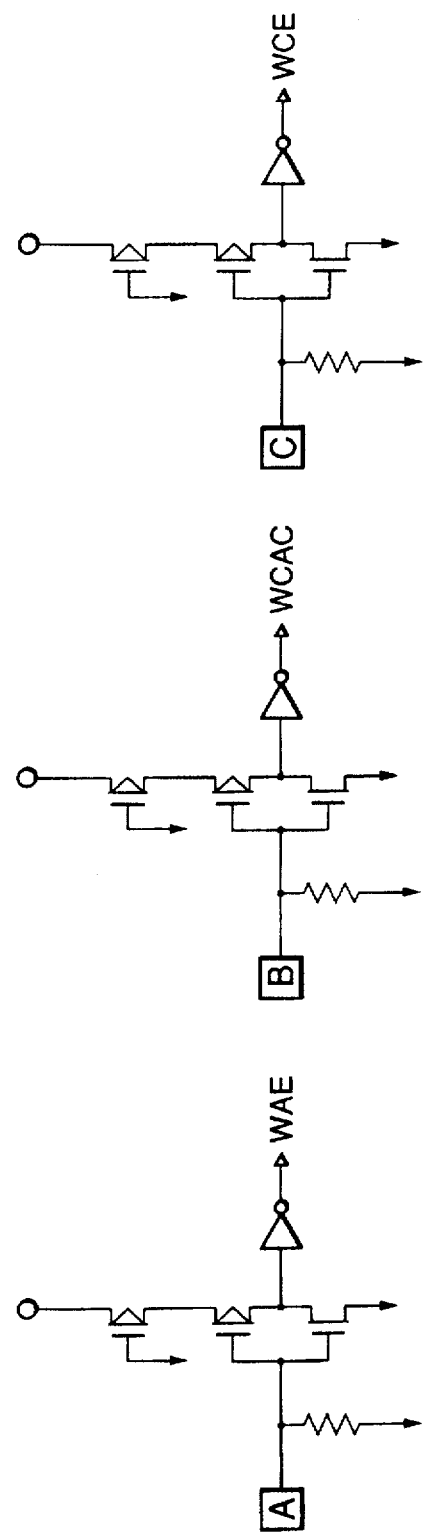
FIG. 30A
FIG. 30B
FIG. 30C

SEMICONDUCTOR MEMORY HAVING REDUNDANCY MEMORY CELLS

BACKGROUND OF THE INVENTION

1. Field of the Invention

This invention relates to a semiconductor memory device such as mask ROM.

2. Description of the Related Art

Each redundancy memory cell for relieving a defective memory cell in known mask ROMs comprises a fuse made of polysilicon, which is either cut or not for storing a data.

However, a redundancy memory cell comprising a fuse occupies a large area on the semiconductor chip carrying it thereon if compared with its counterpart comprising a MOS transistor. Additionally, a relatively high voltage has to be applied to the fuse when it is cut.

Therefore, the main memory cell array 1 and the redundancy memory cell array 2 are separated from each other in the known mask ROM as shown in FIG. 46 of the accompanying drawings.

Thus, the known mask ROM has to be additionally provided a redundancy memory cell decoder 2 for decoding addresses in order to select redundancy memory cells and a bus 3A, 3B for leading the data produced by the selected redundancy memory cells to a sense amplifier 16A, 16B.

In other words, the chip of the known mask ROM is formed to have a large surface area by the fact that each of the redundancy memory cells comprises a fuse.

SUMMARY OF THE INVENTION

In view of the above identified drawback of known semiconductor memory devices, it is therefore the object of the present invention to provide a semiconductor memory having redundancy memory cells that occupy only a reduced area on a memory chip so that they may be arranged with an improved floor plan on the memory chip particularly in terms of the circuit configuration of the redundancy circuits and the decoders and the pattern lay out of the memory device.

According to an aspect of the invention, the above object is achieved by providing a semiconductor memory comprising a main memory cell array, a row decoder for selecting a row of said main memory cell array according to a first input signal, a redundancy memory cell array arranged at an end of said main memory cell array in the column direction and sharing common bit lines and common column lines with said main memory cell array, a disconnection circuit arranged between said main memory cell array and said redundancy memory cell array for connecting the bit lines or the column lines of said main memory cell array to or disconnecting them from the bit lines or the column lines, whichever appropriate, of said redundancy memory cell array, a column selection switch arranged adjacently relative to said redundancy memory cell array for selecting a column of said main memory cell array according to a second input signal and a column of said redundancy memory cell array according to said first or second input signal and a redundancy circuit for selecting a row of said redundancy memory cell array according to said first or second input signal and disconnecting the bit lines or the column lines of said main memory cell array from the bit lines or the columns lines, whichever appropriate, of said redundancy memory cell array by means of said disconnection circuit for the operation of selecting a row of said redundancy memory cell array.

According to the invention, there is also provided a semiconductor memory comprising a main memory cell array, a row decoder for selecting a row of said main memory cell array, a redundancy memory cell array arranged at an end of said main memory cell array in the column direction and sharing common bit lines and common column lines with said main memory cell array, a disconnection circuit arranged between said main memory cell array and said redundancy memory cell array for connecting the bit lines or the column lines of said main memory cell array to or disconnecting them from the bit lines or the column lines, whichever appropriate, of said redundancy memory cell array and a column selection switch arranged adjacently relative to said redundancy memory cell array for selecting a column of said main memory cell array or a column of said redundancy memory cell array.

According to the invention, there is also provided a semiconductor memory comprising a pair of main memory cell arrays, a row decoder arranged between said pair of main memory cell arrays for selecting a row of said pair of main memory cell arrays, a pair of redundancy memory cell arrays arranged at an end of said pair of main memory cell arrays in the column direction and sharing common bit lines and common column lines with said pair of main memory cell arrays, a disconnection circuit arranged between said pair of main memory cell arrays and said pair of redundancy memory cell arrays for connecting the bit lines or the column lines of said pair of main memory cell arrays to or disconnecting them from the bit lines or the column lines, whichever appropriate, of said pair of redundancy memory cell arrays and a pair of column selection switches arranged adjacently relative to said pair of redundancy memory cell arrays for selecting a column of said pair of main memory cell arrays or a column of said pair of redundancy memory cell arrays.

According to the invention, there is also provided a semiconductor memory comprising a main memory cell array constituted by mask ROMs adapted to read operations, a redundancy memory cell array arranged at an end of said main memory cell array in the column direction, having bit lines or column lines commonly shared with said main memory cell array and constituted by PROMs having an only one polysilicon layer and a disconnection circuit arranged between said main memory cell array and said redundancy memory cell array for connecting or disconnecting the bit lines or the column lines of said main memory cell array and the bit lines or the column lines, whichever appropriate, of said redundancy memory cell array.

Each of said PROMs comprises a semiconductor substrate, a control gate constituted by a diffusion layer arranged in said semiconductor substrate and extending in the row direction, source/drain regions also constituted by said diffusion layer in said semiconductor substrate and arranged in the row direction and a floating gate formed on a channel between said control gate and said source/drain regions and constituted by an only one polysilicon layer.

According to the invention, there is also provided a semiconductor memory comprising a main memory cell array, a row decoder for selecting a row of said main memory cell array according to a first input signal, a redundancy memory cell array arranged at the end of said main memory cell array in the column direction and sharing common bit lines and common column lines with said main memory cell array, a disconnection circuit arranged between said main memory cell array and said redundancy memory cell array for connecting the bit lines or the column lines of said main memory cell array to or disconnecting them from the bit lines or the column lines, whichever appropriate, of said redundancy memory cell array, a column selection switch arranged adjacently relative to said redundancy memory cell array for selecting a column of said main memory cell array according to a second input signal and a column of said redundancy memory cell array according to said first or second input signal and a redundancy circuit for selecting a row of said redundancy memory cell array according to said first input signal and selecting a column of said redundancy memory cell array according to said second input signal in order to replace a row of said main memory cell array with a row of said redundancy memory cell array and for selecting a row of said redundancy memory cell array according to said second input signal and selecting a column of said redundancy memory cell array according to said first input signal in order to replace a column of said main memory cell array with a row of said redundancy memory cell array, the column lines of said main memory cell array and the column lines of said redundancy memory cell array being disconnected by said disconnection circuit for selecting a row of said redundancy memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 29 is timing chart for the writing an address for the purpose of the invention.

FIGS. 30A through 30C are circuit diagrams of write mode detection circuits that can be used for the purpose of the invention.

DETAILED DESCRIPTION OF THE PREFERRED EMBODIMENTS

Now, the present invention will be described by referring to the accompanying drawings that illustrate preferred embodiments of the invention.

[A] A first embodiment of the invention will be described mainly in terms of the structure of the main memory cell arrays, the floor plan of the memory chip, the configuration of the memory circuits and the pattern layout.

Figure 1:
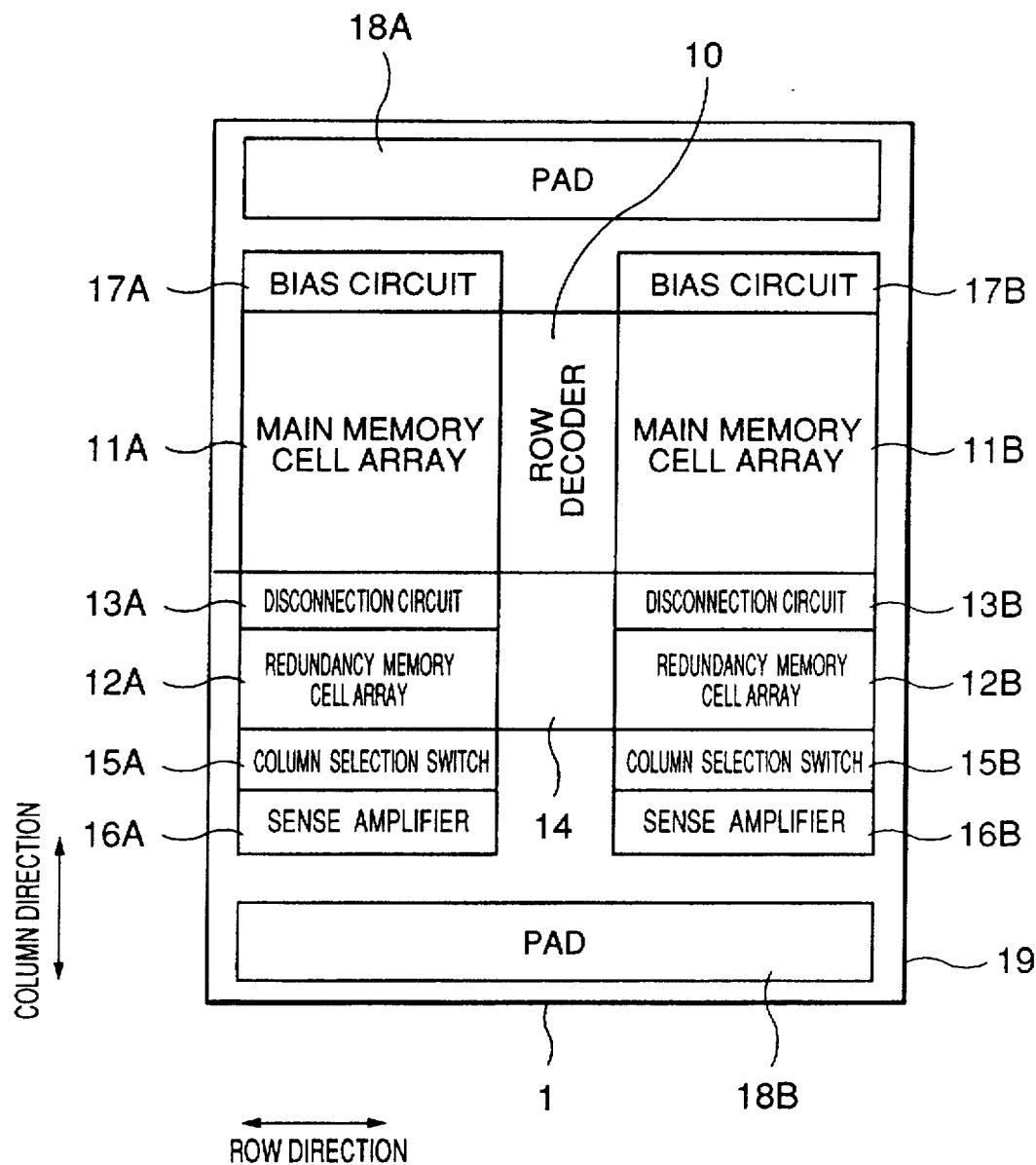
FIG. 1 schematically illustrates the floor plan of a first embodiment of semiconductor memory according to the invention.

FIG. 1 schematically illustrates the floor plan of the embodiment of semiconductor memory according to the invention.

A row decoder 10 is arranged between a pair of main memory cell arrays 11A and 11B. In other words, the paired main memory cell arrays 11A and 11B share a common row decoder 10.

A disconnection circuit 13A is arranged between the main memory cell array 11A and a corresponding redundancy memory cell array 12A. The disconnection circuit 13A electrically connects and disconnects the main memory cell array 11A and the redundancy memory cell array 12A. The specific configuration and the operation of the disconnection circuit 13A will be described in greater detail hereinafter.

Likewise, another disconnection circuit 13B is arranged between the main memory cell array 11B and a corresponding redundancy memory cell array 12B. The disconnection circuit 13B electrically connects and disconnects the main memory cell array 11B and the redundancy memory cell array 12B. The specific configuration and the operation of the disconnection circuit 13B will be described in greater detail hereinafter.

The main memory cell arrays 11A and 11B have a width in the row direction same as that of the redundancy memory cell arrays 12A and 12B.

In the following description, the row direction is defined as the direction parallel to the word lines of the main memory cell arrays (or the control gates of the redundancy memory cell arrays), whereas the column direction is defined as the direction parallel to the column lines or the bit lines of the main and redundancy memory cell arrays.

A redundancy circuit 14 is arranged between the combination of the redundancy memory cell array 12A and the disconnection circuit 13A and that of the redundancy memory cell array 12B and the disconnection circuit 13B. The redundancy circuit 14 replaces defective memory cells with redundancy memory cells and reads data from the redundancy memory cells.

A column selection switch 15A is arranged at a position adjacent to the redundancy memory cell array 12A and another column selection switch 15B is arranged at a position adjacent to the redundancy memory cell array 12B.

A sense amplifier 16A is arranged adjacently relative to the column selection switch 15A and another sense amplifier 16B is arranged next to the column selection switch 15B. A bias circuit 17A is arranged adjacently relative to the main memory cell array 11A and another bias circuit 17B is arranged next to the main memory cell array 11B.

Pads 18A and 18B are arranged respectively on opposite edges of the semiconductor chip 19.

With this floor plan, a number of bit lines (or column lines) are arranged and connected to the main memory cell array 11A, the redundancy memory cell array 12A, the disconnection circuit 13A, the column selection switch 15A, the sense amplifier 16A and the bias circuit 17A.

Similarly, a number of bit lines (or column lines) are arranged and connected to the main memory cell array 11B, the redundancy memory cell array 12B, the disconnection circuit 13B, the column selection switch 15B, the sense amplifier 16B and the bias circuit 17B.

Thus, the redundancy memory cell arrays 12A and 12B are arranged at respective positions adjacent to the main memory cell arrays 11A and 11B and have a width in the row direction same as that of the main memory cell arrays 11A and 11B.

Therefore, the column selection switch 15A that is located next to the redundancy memory cell array 12A can be shared by the main memory cell array 11A and the redundancy memory cell array 12A. It is not necessary to arrange a column selection switch to be exclusively used by the redundancy memory cell array 12A.

By the same token, the column selection switch 15B that is located next to the redundancy memory cell array 12B can be shared by the main memory cell array 11B and the redundancy memory cell array 12B. It is not necessary to arrange a column selection switch to be exclusively used by the redundancy memory cell array 12B.

Since a number of bit lines (or column lines) are commonly connected to the main memory cell array 11A, the redundancy memory cell array 12A, the disconnection circuit 13A, the column selection switch 15A, the sense amplifier 16A and the bias circuit 17A, it is not necessary to arrange an additional bus for transferring data from the memory cells of the redundancy memory cell array 12A to the corresponding amplifier.

Likewise, since a number of bit lines (or column lines) are commonly connected to the main memory cell array 11B, the redundancy memory cell array 12B, the disconnection circuit 13B, the column selection switch 15B, the sense amplifier 16B and the bias circuit 17B, it is not necessary to arrange an additional bus for transferring data from the memory cells of the redundancy memory cell array 12B to the corresponding amplifier.

Thus, the above floor plan designed for the purpose of the present invention can significantly reduce the semiconductor chip.

Figure 2:
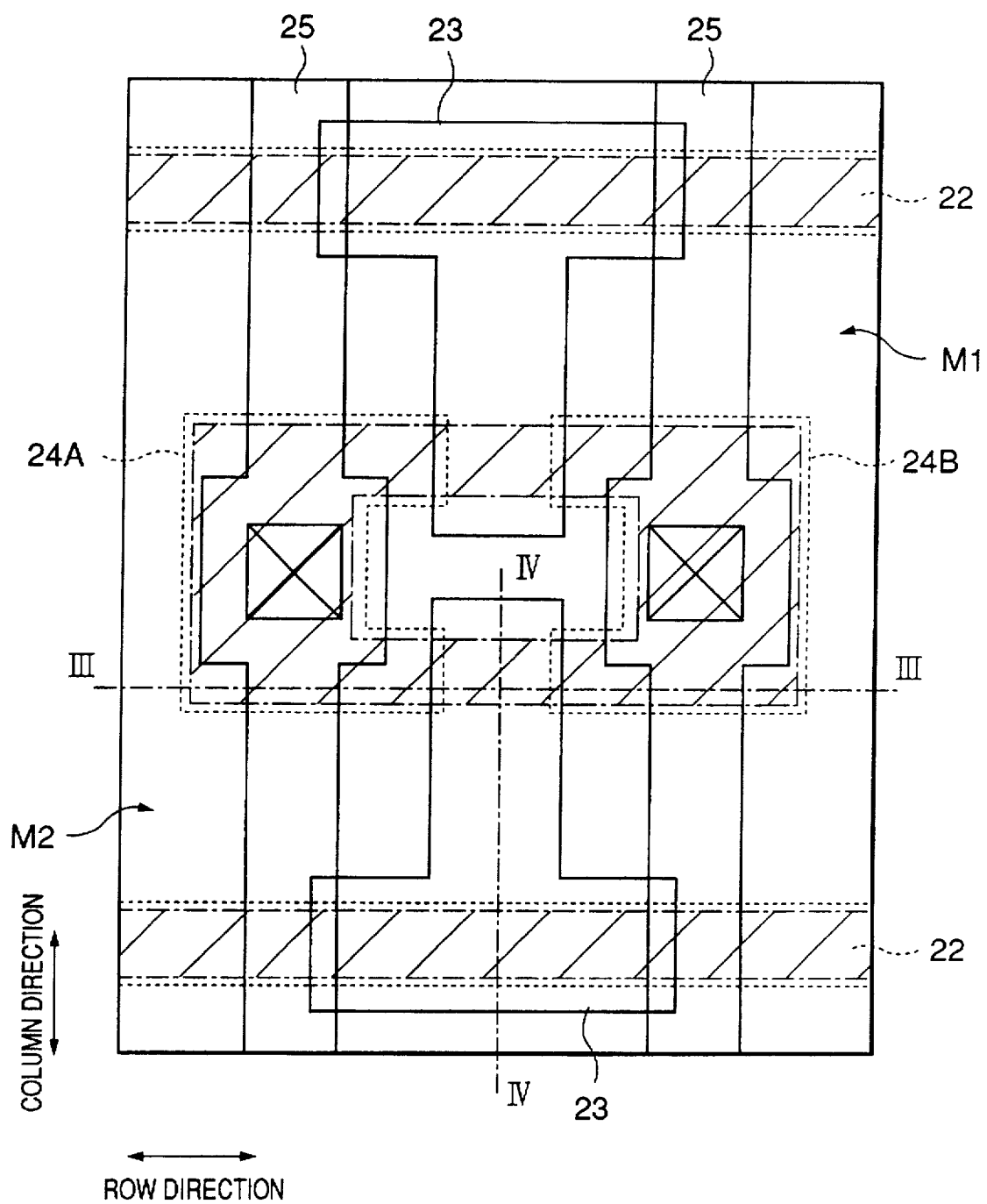
FIG. 2 is a schematic plan view of the embodiment of FIG. 1, showing the structure of part of the memory cells.

FIG. 2 is a schematic plan view of the embodiment of FIG. 1, showing the structure of part of the memory cells.

The shaded areas in FIG. 2 are generally referred to as SDG (source, gate and drain) regions. The word lines (control gates) and the source/drain regions of a redundancy memory cell array are formed by a buried $n^+$ diffusion layer.

Figure 3:
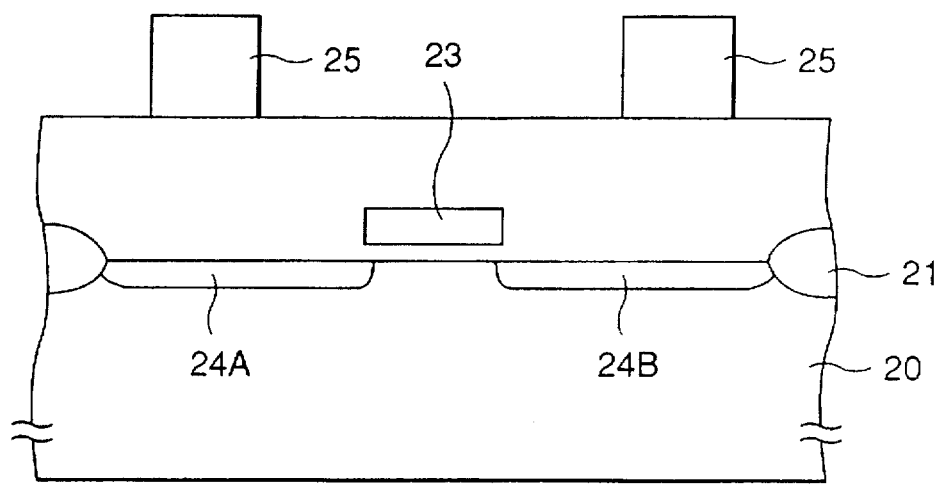
FIG. 3 is a sectional view taken along line III—III in FIG. 2.
Figure 4:
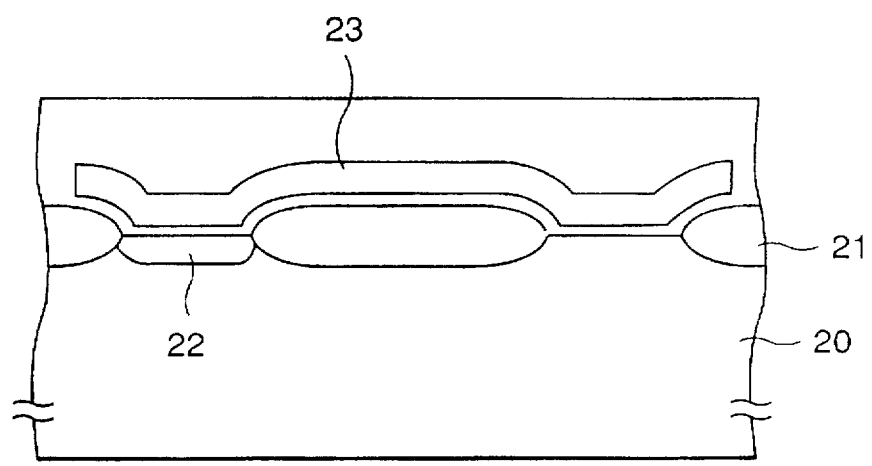
FIG. 4 is a sectional view taking along line IV—IV in FIG. 2.

FIG. 3 is a sectional view taken along line III—III in FIG. 2 and FIG. 4 is a sectional view taken along line IV—IV in FIG. 2, whereas FIG. is a circuit diagram of an equivalent circuit of a memory cell (PROM) that can be used for the embodiment of FIG. 1.

Thus, a PROM having an only one polysilicon layer is used for a redundancy memory cell for the embodiment of semiconductor memory (mask ROM) OF FIG. 1.

Figure 5:
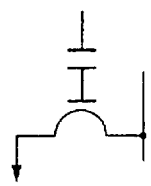
FIG. 5 is a circuit diagram of an equivalent circuit of a memory cell that can be used for the embodiment of FIG. 1.

Referring to FIGS. 3 through 5, a field oxide film 21 is formed on a p-type semiconductor substrate 20. A plurality of word lines (control gates) 22 are arranged on the semiconductor substrate 20 and extend in the row direction. The word lines 22 are formed by a buried $n^+$ diffusion layer and arranged at regular intervals.

A plurality of floating gates 23 are arranged on the word lines 22. The floating gates 23 are made of polysilicon containing an impurity and each of them has a T-shaped contour.

The channels of the transistors (memory cells) are formed directly under the respective floating gates 23 on the semiconductor substrate. A pair of source/drain regions 24A, 24B are formed at the opposite sides of each channel. The source/drain regions 24A, 24B are formed by a buried $n^+$ diffusion layer.

The source/drain regions 24A, 24B are connected to a plurality of bit lines (column lines) 25, which are made of aluminum and connected to main memory cells.

Each pair of adjacently disposed redundancy memory cells PROM) M1 and M2 shares a pair of common source/drain regions 24A, 24B.

If MOS transistors are used for the main memory cells in a semiconductor memory (mask ROM) comprising redundancy memory cells that are PROMs having an only one polysilicon layer, the bit lines (column lines) of the main memory cells can also be used as the bit lines (column lines) of the redundancy memory cells. Accordingly, the column selection switch of the main memory cells can be used as the column selection switch of the redundancy memory cells.

Thus, it is not necessary to arrange a column selection switch to be exclusively used for the redundancy memory cell arrays and hence the surface area of the semiconductor chip can be significantly reduced.

Additionally, since both the gates of the main memory cells and the floating gates of the redundancy memory cells can be formed by a only one polysilicon layer on the semiconductor substrate 20, the above embodiment involves a reduced number of manufacturing steps to suppress the manufacturing cost.

Figure 6:
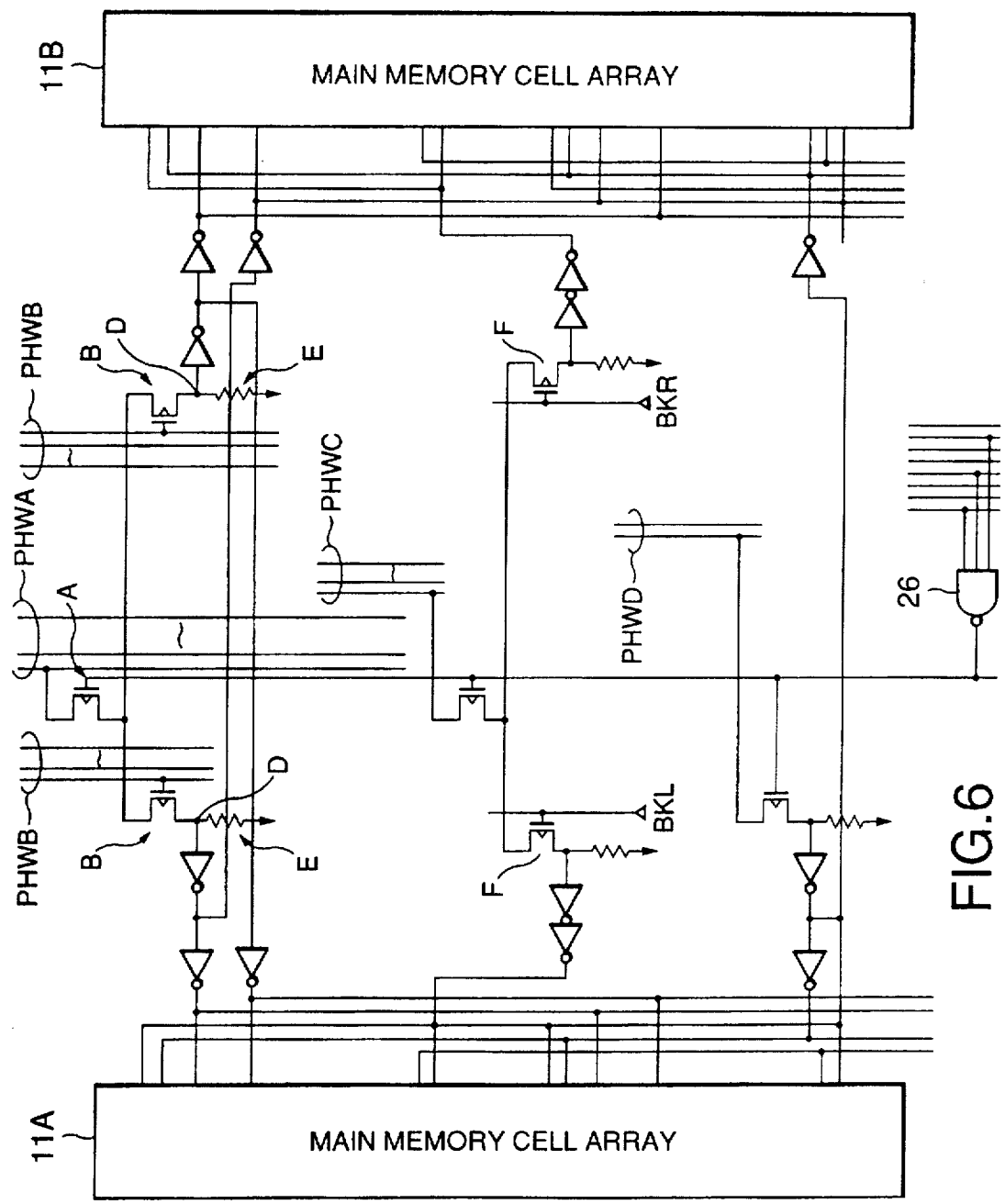
FIG. 6 is a circuit diagram of the row decoder of the above embodiment of semiconductor memory according to the invention.

FIG. 6 is a circuit diagram of the row decoder of the above embodiment of semiconductor memory according to the invention.

Assume that a signal line is selected out of a group of eight signal lines PHWA and high potential VDD is applied to the selected signal line, while low potential VSS is applied to the remaining seven signal lines. Then, both ROM transistors A and B are turned on the instant that low potential VSS is applied to a selected one of a group of eight signal lines PHWB. Consequently, the potential of node D goes to level "H" to bring that of a predetermined word line also to level "H".

When either one of the MOS transistors A and B is on and all the lines of the group PHWA are at level "L", the potential of all the word lines are at level "L".

Signal line groups PHWC and PHWD are used to select a word line out of a plurality of word lines. Reference numeral 26 denotes a main decoder.

Figure 7A:
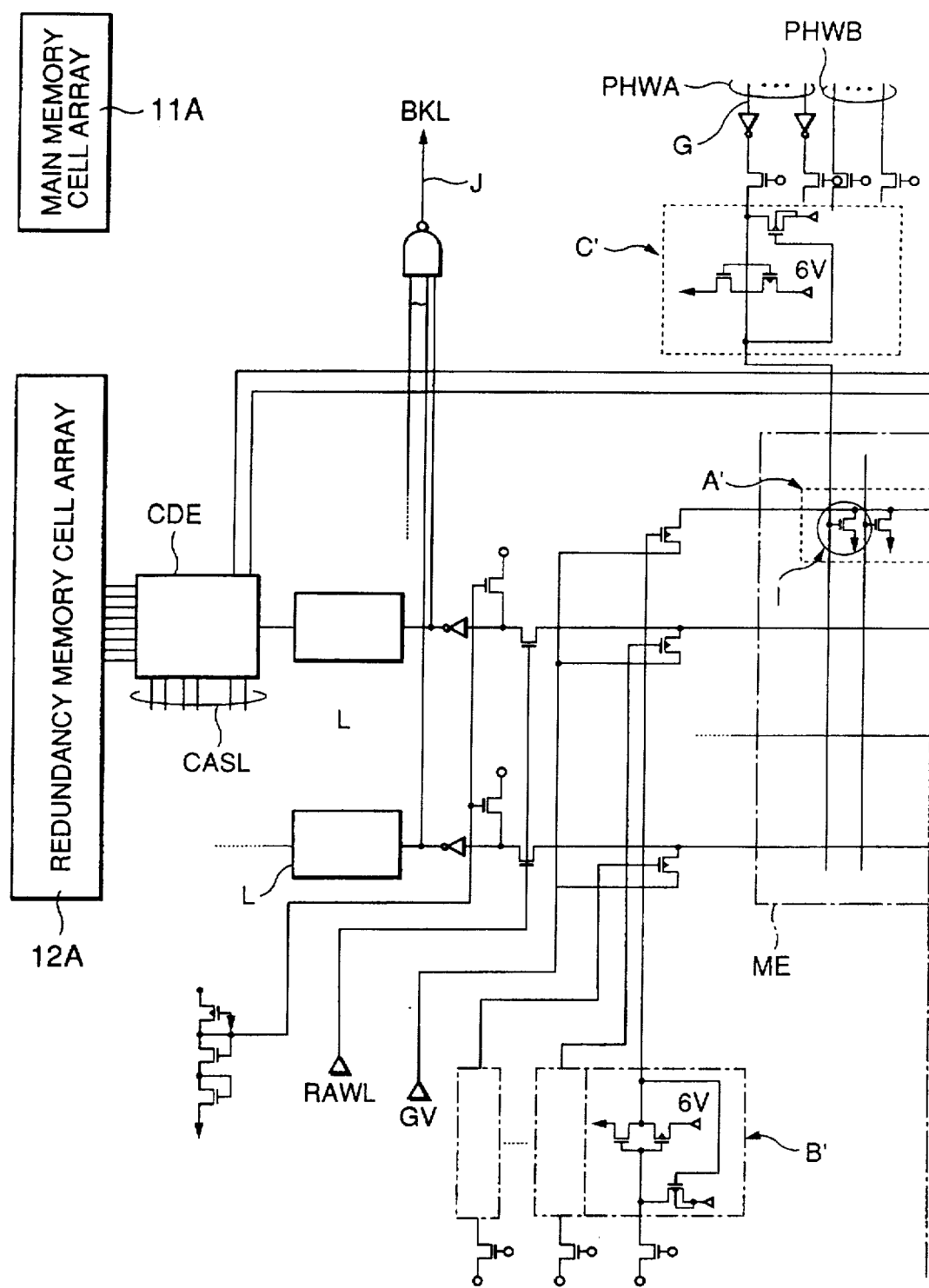
FIGS. 7A and 7B are circuit diagrams of the redundancy circuit of the above embodiment of semiconductor memory according to the invention.
Figure 7B:
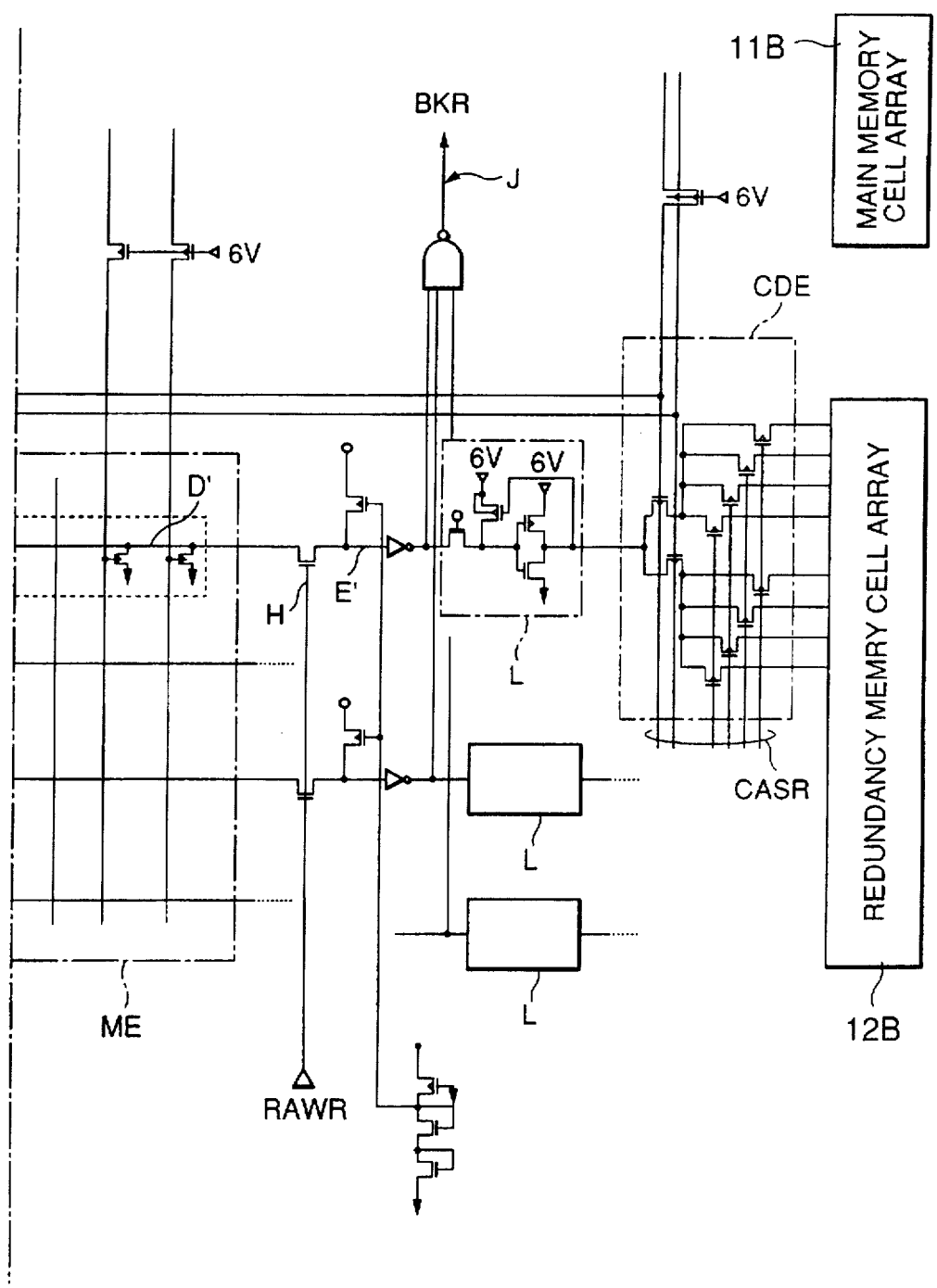

FIGS. 7A and 7B are circuit diagrams of the redundancy circuit of the above embodiment of semiconductor memory according to the invention.

In this embodiment, the redundancy circuit is so designed that all the memory cells connected to a single word line of the main memory cell arrays are replaced with redundancy memory cells.

Firstly, the technique to be used for storing the addresses necessary for replacing the memory cells with redundancy memory cells will be described.

Address signals are applied to an address pad. The address signals are then decoded by an address decoder, which generates signals to be applied to the signal line group PHWA from the address signals.

In this embodiment, no address signal is used for specifying a column because all the memory cells connected to a single word line of the main memory cell arrays are replaced with redundancy memory cells.

The address signal for selecting a word line of the main memory cell arrays and the address signal for selecting a word line of the redundancy memory cell arrays are stored in a memory section ME arranged in the redundancy memory cell arrays (and typically constituted by memory cells having a configuration same as that of the redundancy memory cells).

A level shifter circuit B' supply, for example, a predetermined bit line (the drains of memory cells) of the memory section ME with write potential VPP. Another level shifter circuit C' supply, for example, a predetermined word line (the control gates of memory cells) of the memory section ME with write potential VPP.

Electrons are injected into the floating gate of the memory cell to whose control gate the write potential VPP is applied out the memory cell group A' to whose drains the write potential VPP is applied. Thus, a data (address signal) is written into the memory cell as electrons are injected into its floating gate.

Now, the operation of selecting a redundancy memory cell and storing a data therein will be described.

As an address signal is entered from the outside of the memory chip (LSI), it is determined if the entered address signal agrees with the one stored in the memory section ME. The potential of node D goes to level "H" when the entered address signal agrees with the one stored in the memory section ME.

Then, the potential of node E also goes to level "H" and another level shifter L produced write potential VPP. The column selection switch CDE selects a single word line out of the plurality of word lines of the redundancy memory cell arrays.

Thus, the write potential VPP is applied to the selected single word line in the redundancy memory cell arrays.

Note that, if the dimension of the redundancy memory cells in the row direction is $2^n$ times as large as that of the main memory cells in that direction, a total of $2^n$ word lines (rows) are required in the redundancy memory cell arrays in order to relieve the entire memory cells of the main memory cell arrays connected to a single word line.

If such is the case, the column selection switch CDE selects a total of $2^n$ word lines of the redundancy memory cell arrays.

Figure 8:
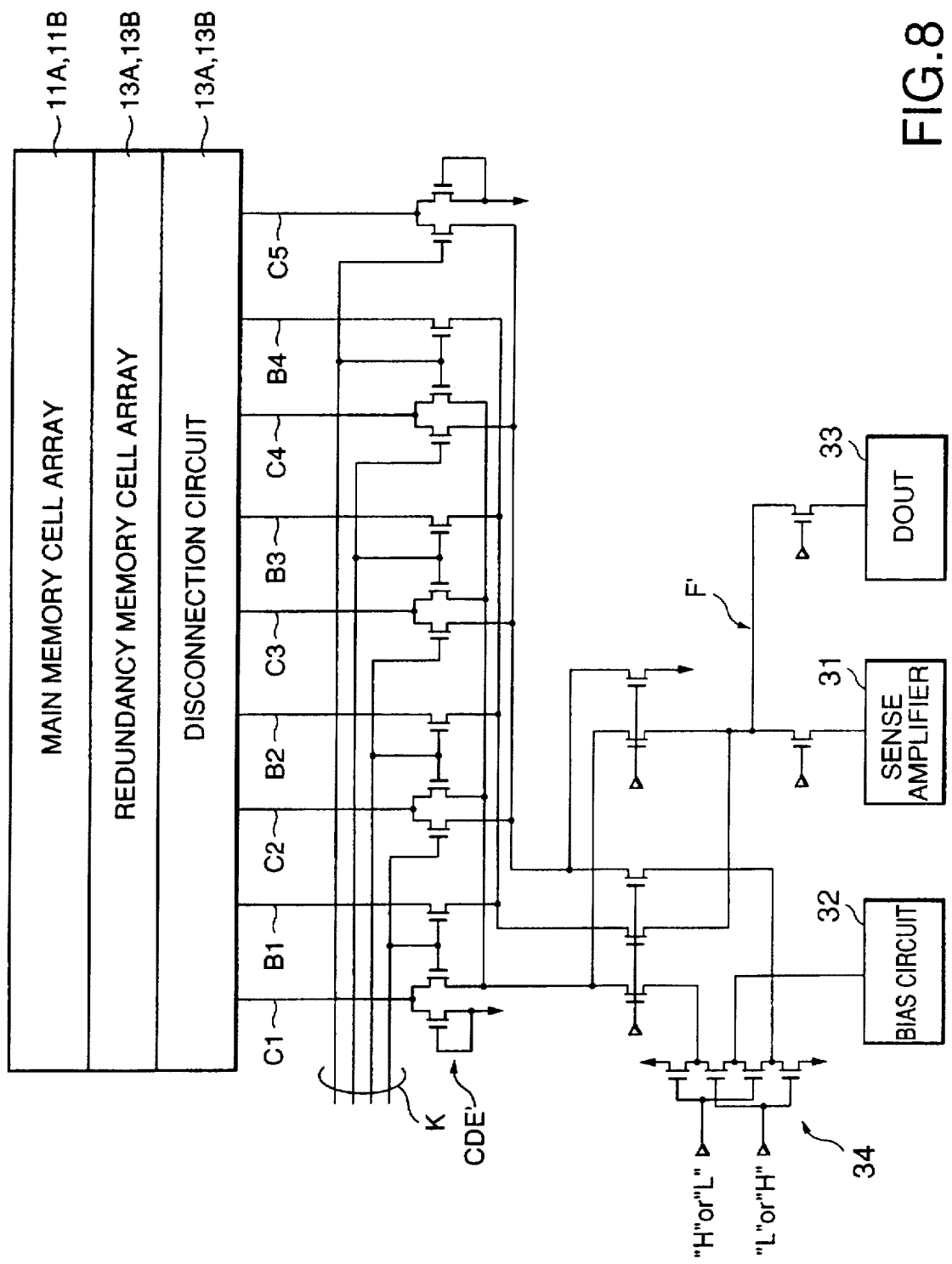
FIG. 8 is a circuit diagram of the column selection switch and its neighboring areas of the above embodiment of semiconductor memory according to the invention.

A predetermined potential is applied to bit lines B1 through B4 and column lines C1 through C5 of the columns selected by column selection switch CDE' as shown in FIG. 8.

The operation of reading data from redundancy memory cells proceeds in a manner as described below.

As an address signal is entered from the outside of the memory chip (LSI), it is decoded by the address decoder to produce a signal line group PHWA of eight signal lines.

If, for instance, one of the eight signal lines of the signal line group PHWA is selected, the potential (node G) of the selected signal line goes to level "H". While the supply potential of the level shifter C' is equal to write potential VPP for writing data into redundancy memory cells in this stage, it moves to ordinary potential VDD thereafter.

Thus, the potential of the word line of transistor I goes to level "H" and not electric current flows to the transistor I if a data is already stored there (electrons have already been injected into the floating gate). On the other hand, an electric current flow to the transistor I if no data is stored in the transistor I (no electrons has been injected into the floating gate).

Similarly, if all the transistors of group A' to be connected to a selected signal line of the signal lines of signal line group PHWB for selecting a main address already store respective data, no electric current flows to the transistors of group A' and the potential of node D moves to level "H".

If, however, there is at least a transistor that does not store a data among the transistors of group A', the potential of node D goes to level "L" because an electric current flows to that transistor.

For reading data from redundancy memory cells, the potential of node J is brought to level "H" and the main memory cell arrays are disconnected from the sense amplifiers by means of the disconnection circuits in order to prevent any data from being read out of the main memory cell arrays.

Figure 9:
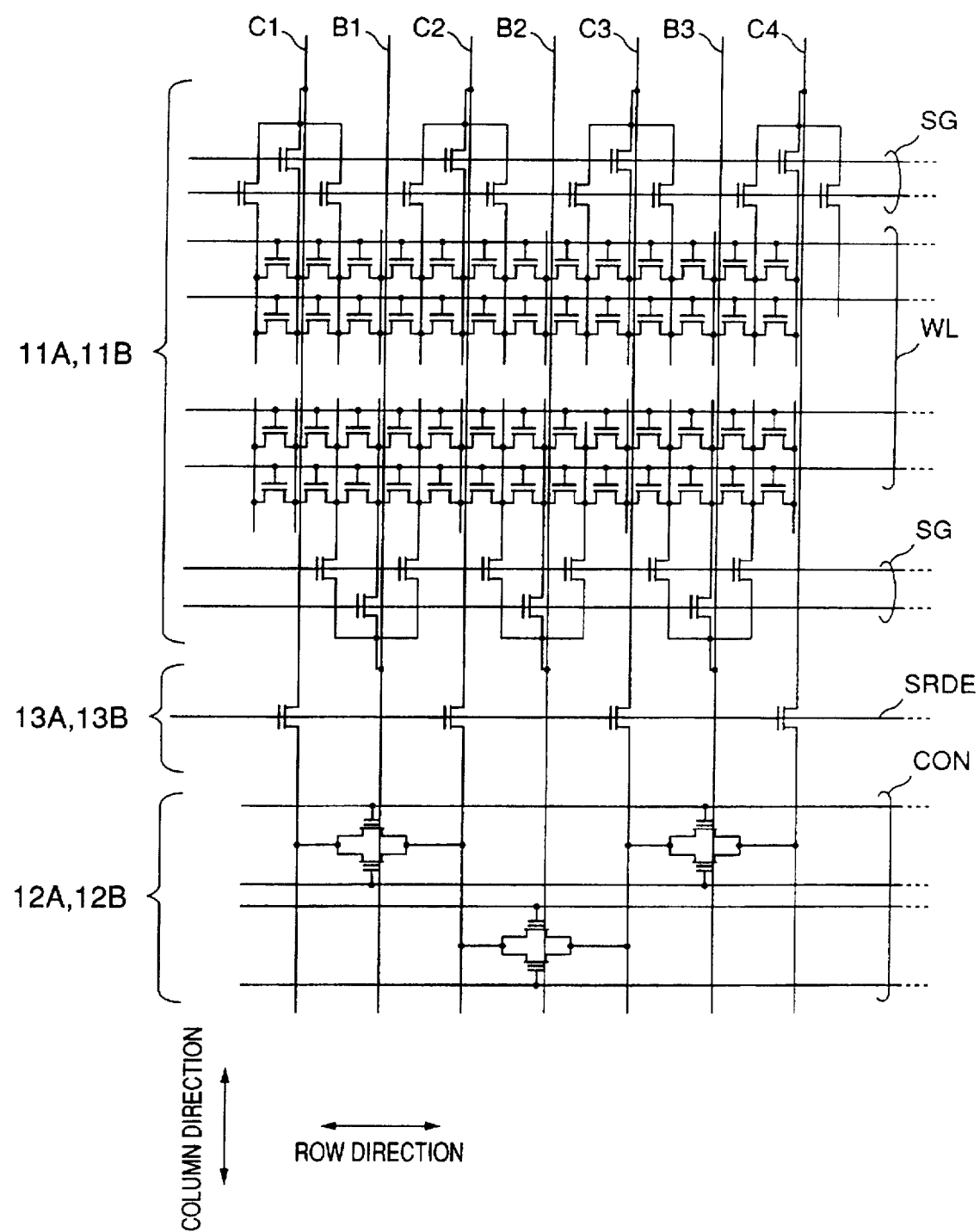
FIG. 9 is a circuit diagram of the memory cell arrays of the above embodiment of semiconductor memory according to the invention.
Figure 10:
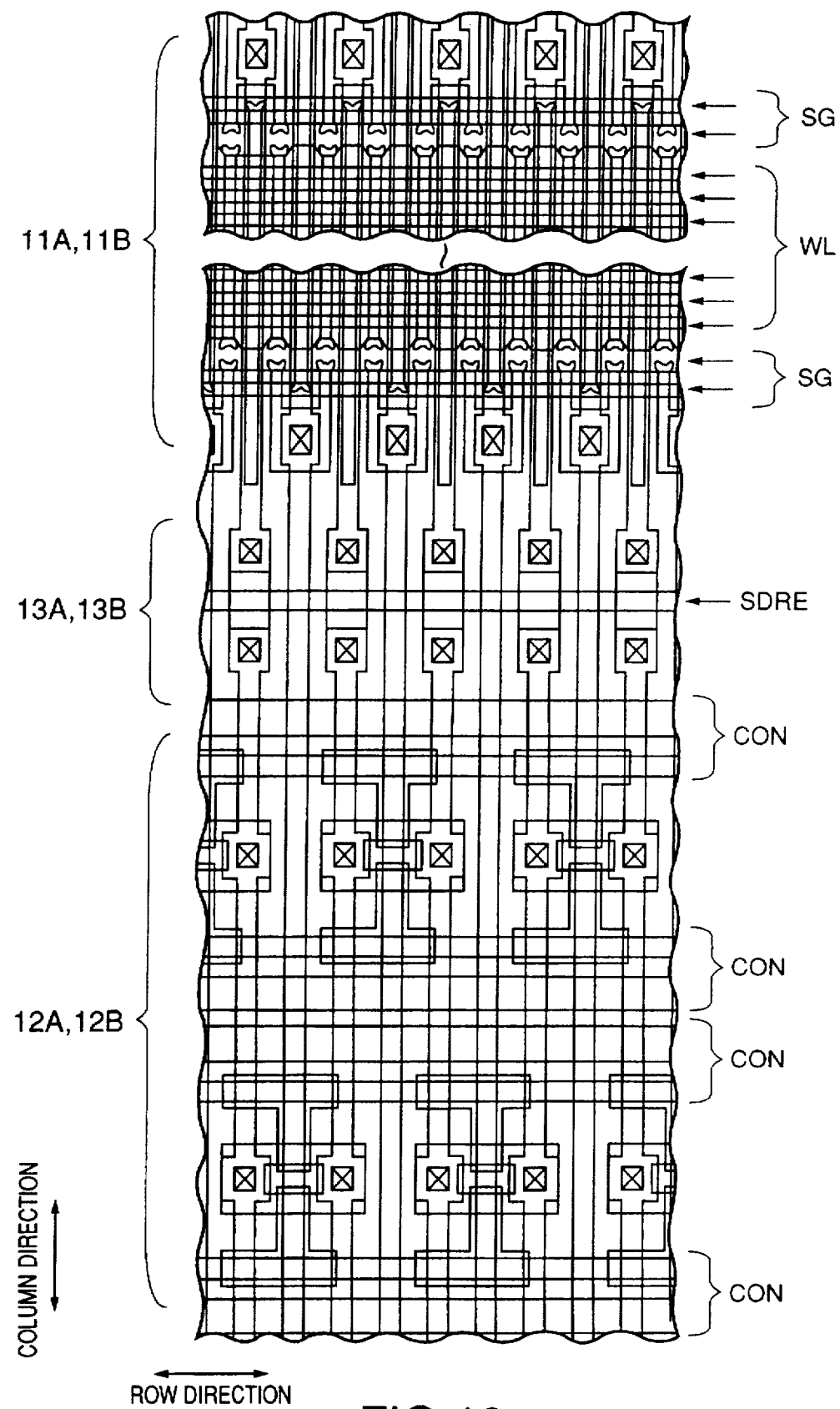
FIG. 10 is a plan view of the memory cell arrays of the above embodiment of semiconductor memory according to the invention, showing their structures.

FIGS. 9 and 10 shows the configuration of the memory cell arrays of the above embodiment of semiconductor memory according to the invention.

FIG. 9 is a circuit diagram of the main memory cell arrays, the redundancy memory cell arrays and the disconnection circuits, showing how they are connected with each other. FIG. 10 is a plane view of the main memory cell arrays, the redundancy memory cell arrays and the disconnection circuits of the embodiment, showing their mutual positional relationships.

Since the dimension of the redundancy memory cell arrays in the row direction is eight times as large as that of the main memory cell arrays in that direction, the main memory cell arrays will show a width same as that of the redundancy memory cell array in the row direction if the main memory cell arrays are made to have 64 columns, whereas the redundancy memory cell arrays have 8 columns.

The column lines C1, C2, of the main memory cell arrays 11A and 11B are same as the respective column lines C1, C2, of the redundancy memory cell arrays 12A and 12B. In other words, they are common column lines. The disconnection circuits 13A and 13B are arranged between the main memory cell arrays 11A and 11B and the redundancy memory cell arrays 12A and 12B.

The disconnection circuits 13A and 13B operate to prevent write potential VPP from being applied to the main memory cells when data are written into redundancy memory cells and, at the same time, data from being transferred from the main memory cell arrays to the sense amplifiers when they are read out of redundancy memory cells.

The column selection switch operates in a manner as briefly described below when data are read out of main memory cells.

Referring to FIG. 8, if, for example, signal lines K are selected, a single bit line B1 is connected to a sense amplifier 31 and one of the column lines C1 and C2 flanking the bit line B1 is connected to a bias circuit 32 and the other is grounded.

In an operation of reading data from the redundancy memory cell arrays 12A and 12B, the data of the redundancy memory cell connected between the column line C1 and the sense amplifier column line C2 is actually read out because either the column line C1 or the sense amplifier column line C2 is connected to the ground potential VSS.

[B] The embodiments of the invention as will be described hereinafter are semiconductor memories designed to relieve the main memory cells both in the row direction and in the column direction by means of redundancy memory cells arranged only in the row direction.

Figure 11:
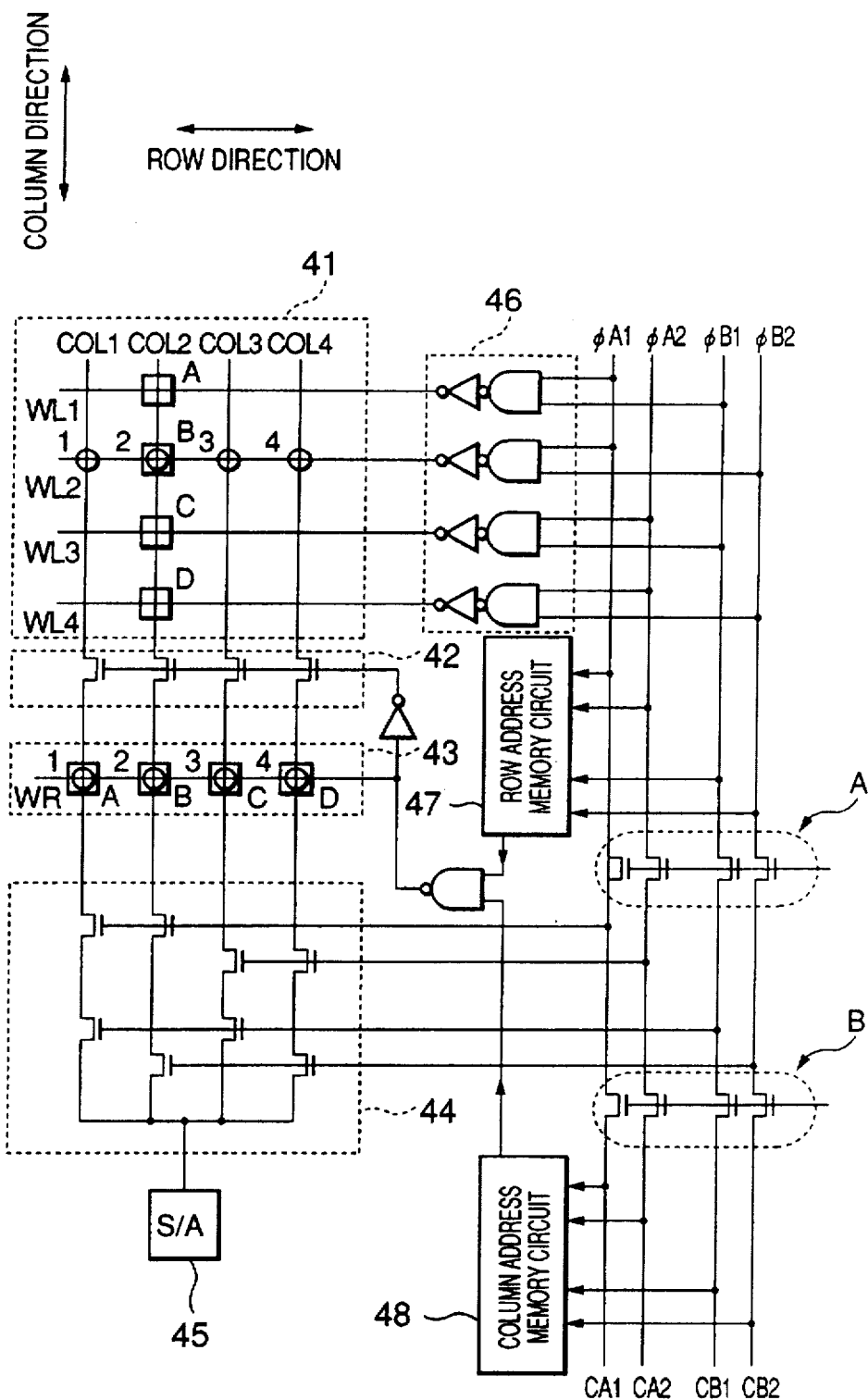
FIGS. 11 and 12 are circuit diagrams of the redundancy sections of two different embodiments of semiconductor memory according to the invention.

FIG. 11 is a circuit diagram of a second embodiment of semiconductor memory according to the invention.

This embodiment is designed to relieve the main memory cells of a memory cell array both in the row direction and in the column direction by means of a redundancy memory cell array arranged at an end of the main memory cell array in the column direction (or the row direction).

In the following, assume, for the purpose of simplification, that the main memory cell array has four rows and four columns and a redundancy memory cell array is arranged at an end of the main memory cell array in the column direction.

The four column lines COL1 through COL4 are arranged on the main memory cell array 41, the redundancy memory cell array 43 and the column selection switch 44.

The main memory cell array 41 comprises MOS transistors arranged in the form of a matrix of four rows and four columns and having different respective threshold values. The disconnection circuit 42 also comprises MOS transistors. The redundancy memory cell array 43 comprises PROMs arranged in the form of a matrix of four rows and a single column and having different respective threshold values. The column selection switch 44 connects a selected one of the four column lines COL1 through COL4 to a sense amplifier 45.

The four word lines WL1 through WL4 of the main memory cell array 41 are connected to a row decoder 46. The row decoder 46 may typically comprise pairs of a NAND circuit and an inverter circuit that are connected in series. Output signals φA1, φA2, φB1 and φB2 of a row predecoder are given to the row decoder 46. Then, the row decoder 46 selects a word line according to the output signals (φA1, φA2, φB1 and φB2 and high potential VDD is applied to the selected word line.

The output signals φA1, φA2, φB1 and φB2 of the row predecoder are also sent to a row address memory circuit 47.

When the main memory cell array 41 has a defective memory cell, row address memory circuit 47 stores the row address for selecting the row (word line) where the defective memory cell is located.

If the supplied output signals φA1, φA2, φB1 and φB2 are for selecting the row (word line) having the defective memory cell, the row address memory circuit 47 produces an output signal with level "L".

Thus, all the MOS transistors of the disconnection circuit 42 are turned off and the column lines COL1 through COL4 are disconnected between the main memory cell array 41 and the redundancy memory cell array 43.

Note that all the transistors of the transistor group A are turned off and those of the transistor group B are turned on for relieving memory cells in the row direction.

Also note that output signals CA1, CA2, CB1 and CB2 of the column predecoder are supplied to the column selection switch 44 when the main memory cell array 41 has a defective memory cell and a memory cell relieving operation is conducted in the row direction, whereas output signals CA1, CA2, CB1 and CB2 of the column predecoder are supplied only to the column address memory circuit 48 when a memory cell relieving operation is conducted in the column direction.

The column address memory circuit 48 stores the column address for selecting the column (column line) where the defective memory cell is located.

If the supplied output signals CA1, CA2, CB1 and CB2 are for selecting the column (column line) having the defective memory cell, the column address memory circuit 48 produces an output signal with level "L".

Thus, all the MOS transistors of the disconnection circuit 42 are turned off and the column lines COL1 through COL4 are disconnected between the main memory cell array 41 and the redundancy memory cell array 43.

Note that all the transistors of the transistor group A are turned on and those of the transistor group B are turned off for relieving memory cells in the column direction.

The above described embodiment of semiconductor memory operates in a manner as described below.

Assume firstly that memory cells are to be relieved in the row direction. Assume also that the four memory cells 1 through 4 connected to the word line WL2 are replaced with redundancy memory cells. Then, the data of output signals φA1, φA2, φB1 and φB2 for selecting the word line WL2 are stored in the row address memory circuit 47. The transistors of the group A are turned on, whereas those of the group B are turned off.

As the output signals φA1, φA2, φB1 and φB2 are supplied from the row predecoder, the row address memory circuit 47 determines if the output signals φA1, φA2, φB1 and φB2 are for selecting the word line WL2 or not.

If it is determined that the output signals φA1, φA2, φB1 and φB2 are for selecting the word line WL2, the row address memory circuit 47 produces an output signal with level "L". Thus, all the MOS transistors of the disconnection circuit 42 are turned off and the column lines COL1 through COL4 are disconnected between the main memory cell array 41 and the redundancy memory cell array 43.

Consequently, the word line WL2 is selected by the row decoder 46 and the data of the memory cells 1 through 4 are produced to the column lines COL1 through COL4 but, since the column lines COL1 through COL4 are disconnected by the disconnection circuit 42, the data are not fed to the sense amplifier 45.

On the other hand, a potential at level "H" is applied to the word lines (control gates if the redundancy memory cells are single layer PROMs) WR of the redundancy memory cell array and the data of the redundancy memory cells 1 through 4 are produced to the column lines COL1 through COL4.

Additionally, the output signals CA1, CA2, CB1 and CB2 of the column predecoder are fed to the column selection switch 44 and only a single column line is connected to the sense amplifier 45. Therefore, only the data of the selected column are amplified by the sense amplifier 45 and transmitted to the outside.

Now, how memory cells are relieved in the column direction will be discussed. Assume that the four memory cells A through D connected to the column line COL2 are replaced with redundancy memory cells. Then, the column address memory circuit 48 stores the data of the output signals CA1, CA2, CB1 and CB2 until the column line COL2 is selected. The transistors of the group A are turned off, whereas those of the group B are turned on.

As column address memory circuit 48 receives the output signals CA1, CA2, CB1 and CB2 of the column predecoder, it determines if the output signals CA1, CA2, CB1 and CB2 are for selecting the column line COL2 or not.

If it is determined that the output signals CA1, CA2, CB1 and CB2 are for selecting the column COL2, the column address memory circuit 48 produces an output signal with level "L". Thus, all the MOS transistors of the disconnection circuit 42 are turned off and the column lines COL1 through COL4 are disconnected between the main memory cell array 41 and the redundancy memory cell array 43.

On the other hand, a potential at level "H" is applied to the word lines (control gates if the redundancy memory cells are single layer PROMs) WR of the redundancy memory cell array and the data of the redundancy memory cells 1 through 4 are produced to the column lines COL1 through COL4.

Additionally, the output signals φA1, φA2, φB1 and φB2 of the row predecoder are fed to the column selection switch 44 and only a single column line is connected to the sense amplifier 45. Therefore, only the data of the selected column are amplified by the sense amplifier 45 and transmitted to the outside.

In other words, for relieving memory cells in the column direction, four data in the column direction are produced from redundancy memory cells and then a single row is selected by the column selection switch 44 (or row decoder to say more appropriately).

Now, assume that the main memory cell array 41 does not have any defective memory cell.

Then, no row address data are stored in the row address memory circuit 47 and no column address data are stored in the column address memory circuit 48 so that consequently the output signals of the row address memory circuit 47 and those of the column address memory circuit 48 are always at level "H".

Therefore, all the MOS transistors of the disconnection circuit 42 are on. In other words, the data of the memory cells connected to the word line selected by the row decoder 46 are produced to the column lines COL1 through COL4 and only a single data selected out of these data by the column selection switch 44 is fed to the sense amplifier 45.

With the embodiment having the above described configuration, the redundancy memory cell array is arranged at an end of the main memory cell array in the column direction and no redundancy memory cell array has to be arranged in the row direction if memory cells are to be relieved both in the row direction and in the column directions.

With the above described embodiment, for example, memory cells are relieved in the row direction by reading data from the memory cells of the redundancy memory cell array in the row direction and selecting a column by means of the column selection switch. On the other hand, memory cells are relieved in the column direction by reading data from the memory cells of the redundancy memory cell array in the column direction, entering the output signals of the row predecoder into the column selection switch and selecting a row by means of the column selection switch.

Thus, with this embodiment, memory cells can be relieved both in the row direction and in the column direction without using a semiconductor chip having a large surface area.

Figure 12:
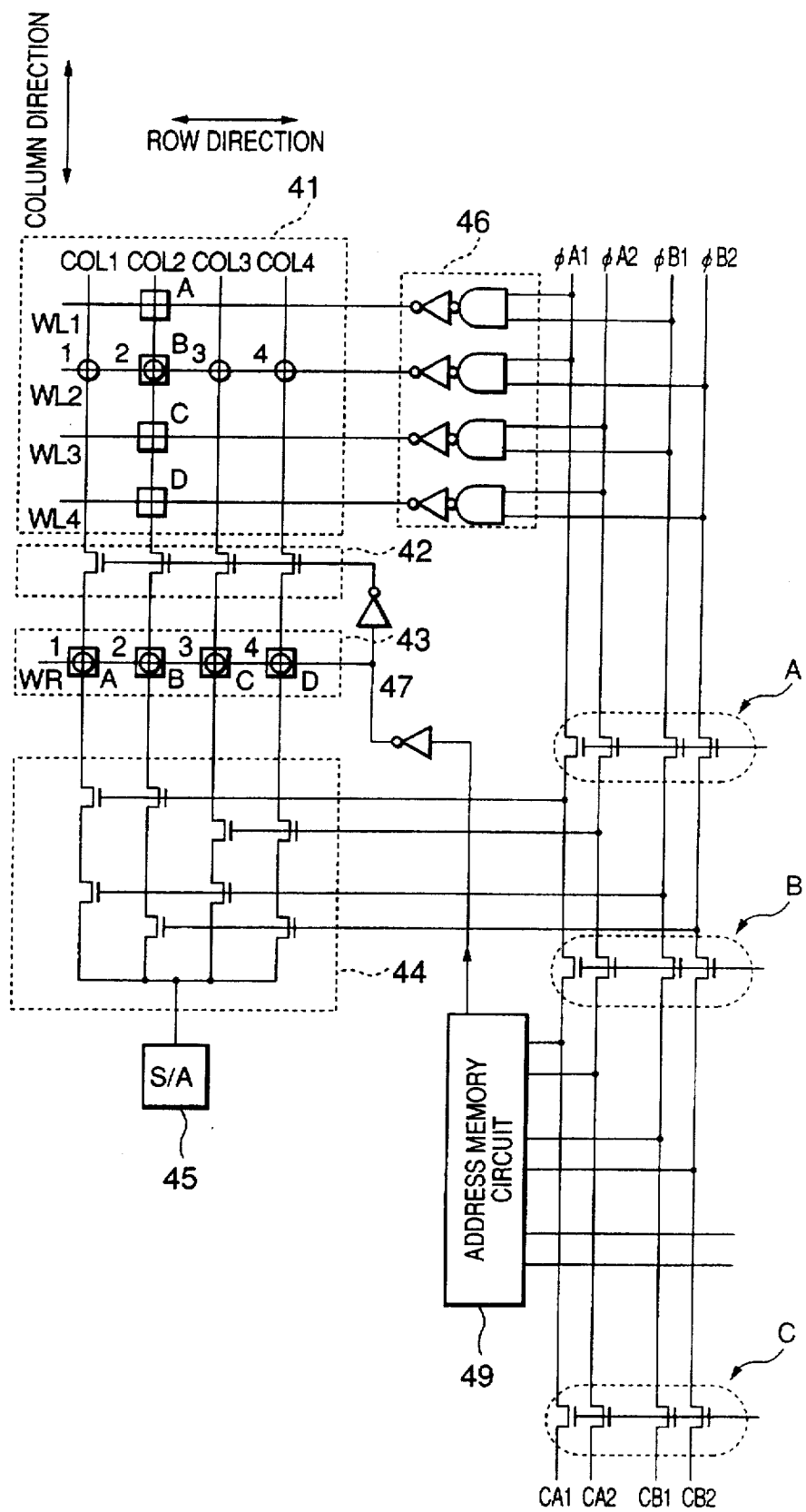

FIG. 12 is a circuit diagram of a third embodiment of semiconductor memory according to the invention.

Like the second embodiment, this embodiment is designed to relieve the memory cells of main memory cell array both in the row direction and in the column direction by means of a redundancy memory cell array arranged at an end of the main memory cell array in the column direction (or the row direction).

In the following, assume, for the purpose of simplification, that the main memory cell array has four rows and four columns and a redundancy memory cell array is arranged at an end of the main memory cell array in the column direction.

The four column lines COL1 through COL4 are arranged on the main memory cell array 41, the redundancy memory cell array 43 and the column selection switch 44.

The main memory cell array 41 comprises MOS transistors arranged in the form of a matrix of four rows and four columns and having different respective threshold values. The disconnection circuit 42 also comprises MOS transistors. The redundancy memory cell array 43 comprises PROMs arranged in the form of a matrix of four rows and a single column and having different respective threshold values. The column selection switch 44 connects a selected one of the four column lines COL1 through COL4 to a sense amplifier 45.

The four word lines WL1 through WL4 of the main memory cell array 41 are connected to a row decoder 46. The row decoder 46 may typically comprise pairs of a NAND circuit and an inverter circuit that are connected in series. Output signals φA1, φA2, φB1 and φB2 of a row predecoder are given to the row decoder 46. Then, the row decoder 46 selects a word line according to the output signals φA1, φA2, φB1 and φB2 and high potential VDD is applied to the selected word line.

The output signals φA1, φA2, φB1 and φB2 of the row predecoder are also sent to a row address memory circuit 49.

When the main memory cell array 41 has a defective memory cell and memory cells are to be relieved in the row direction, address memory circuit 49 stores the row address for selecting the row (word line) where the defective memory cell is located.

If the supplied output signals φA1, φA2, φB1 and φB2 are for selecting the row (word line) having the defective memory cell, the address memory circuit 49 produces an output signal with level "L".

Thus, all the MOS transistors of the disconnection circuit 42 are turned off and the column lines COL1 through COL4 are disconnected between the main memory cell array 41 and the redundancy memory cell array 43.

Note that output signals CA1, CA2, CB1 and CB2 of the column predecoder are supplied to the column selection switch 44 when the main memory cell array 41 has a defective memory cell and a memory cell relieving operation is conducted in the row direction, whereas output signals CA1, CA2, CB1 and CB2 of the column predecoder are supplied only to the address memory circuit 49 when a memory cell relieving operation is conducted in the column direction.

When the main memory cell array 41 has a defective memory cell and is to be relieved in the column direction, the address memory circuit 49 stores the column address for selecting the column (column line) where the defective memory cell is located.

If the supplied output signals CA1, CA2, CB1 and CB2 are for selecting the column (column line) having the defective memory cell, the address memory circuit 49 produces an output signal with level "L".

Thus, all the MOS transistors of the disconnection circuit 42 are turned off and the column lines COL1 through COL4 are disconnected between the main memory cell array 41 and the redundancy memory cell array 43.

Note that this embodiment differs from the second embodiment in that the row address memory circuit and the column address memory circuit of the second embodiment are combined to a single address memory circuit for selecting a redundancy memory cell.

The above described embodiment of semiconductor memory operates in a manner as described below.

Assume firstly that memory cells are to be relieved in the row direction. Assume also that the four memory cells 1 through 4 connected to the word line WL2 are replaced with redundancy memory cells. Then, the data of output signals φA1, φA2, φB1 and φB2 for selecting the word line WL2 are stored in row address memory circuit 47.

As shown in Table 1 below, the transistors of the groups A and B are turned on, whereas those of the group C are turned off.

As the output signals φA1, φA2, φB1 and φB2 are supplied from the row predecoder, the address memory circuit 49 determines if the output signals φA1, φA2, φB1 and φB2 are for selecting the word line WL2 or not.

If it is determined that the output signals φA1, φA2, φB1 and φB2 are for selecting the word line WL2, the address memory circuit 49 produces an output signal with level "L". Thus, all the MOS transistors of the disconnection circuit 42 are turned off and the column lines COL1 through COL4 are disconnected between the main memory cell array 41 and the redundancy memory cell array 43.

Consequently, the word line WL2 is selected by the row decoder 46 and the data of the memory cells 1 through 4 are produced to the column lines COL1 through COL4 but, since the column lines COL1 through COL4 are disconnected by the disconnection circuit 42, the data are not fed to the sense amplifier 45.

On the other hand, a potential at level "H" is applied to the word lines (control gates if the redundancy memory cells are single layer PROMs) WR of the redundancy memory cell array and the data of the redundancy memory cells 1 through 4 are produced to the column lines COL1 through COL4.

Thereafter, the transistors of the groups B and C are turned on, whereas those of the group A are turned off as shown in Table 1.

Additionally, the output signals CA1, CA2, CB1 and CB2 of the column predecoder are fed to the column selection switch 44 and only a single column line is connected to the sense amplifier 45. Therefore, only the data of the selected column are amplified by the sense amplifier 45 and transmitted to the outside.

Now, how memory cells are relieved in the column direction will be discussed. Assume that the four memory cells A through D connected to the column line COL2 are replaced with redundancy memory cells. Then, the column address memory circuit 48 stores the data of the output signals CA1, CA2, CB1 and CB2 until the column line COL2 is selected.

As shown in Table 1, the transistors of the groups A and C are turned on, whereas those of the group B are turned off.

As address memory circuit 49 receives the output signals CA1, CA2, CB1 and CB2 of the column predecoder, it determines if the output signals CA1, CA2, CB1 and CB2 are for selecting the column line COL2 or not.

If it is determined that the output signals CA1, CA2, CB1 and CB2 are for selecting the column COL2, the address memory circuit 49 produces an output signal with level "L".

Thus, all the MOS transistors of the disconnection circuit 42 are turned off and the column lines COL1 through COL4 are disconnected between the main memory cell array 41 and the redundancy memory cell array 43.

On the other hand, a potential at level "H" is applied to the word lines (control gates if the redundancy memory cells are single layer PROMs) WR of the redundancy memory cell array and the data of the redundancy memory cells 1 through 4 are produced to the column lines COL1 through COL4.

Additionally, the output signals φA1, φA2, φB1 and φB2 of the row predecoder are fed to the column selection switch 44 and only a single column line is connected to the sense amplifier 45. Therefore, only the data of the selected column are amplified by the sense amplifier 45 and transmitted to the outside.

In other words, for relieving memory cells in the column direction, a single column is selected and four data in the column direction are produced from redundancy memory cells before a single row is selected by the column selection switch 44 (or row decoder to say more appropriately).

Now, assume that the main memory cell array 41 does not have any defective memory cell.

As shown Table 1, all the transistors of the groups B and C are turned on, whereas those of the group A are turned off.

Then, no row address data nor column address data are stored in the address memory circuit 49 so that consequently the output signals of the address memory circuit 49 are always at level "H".

Therefore, all the MOS transistors of the disconnection circuit 42 are on. In other words, the data of the memory cells connected to the word line selected by the row decoder 46 are produced to the column lines COL1 through COL4 and only a single data selected out of these data by the column selection switch 44 is fed to the sense amplifier 45.

TABLE 1

|  | Relief in Row Direction | | Relief in Column Direction | | For |
| --- | --- | --- | --- | --- | --- |
|  | For Row Detection | For Row Relief Lead | For Column Detection | For Column Relief Lead | Main Cell Array Lead |
| Transistor Group A | ON | OFF | ON | ON | OFF |
| Transistor Group B | ON | ON | OFF | OFF | ON |
| Transistor Group C | OFF | ON | ON | ON | ON |

With the embodiment having the above described configuration, the redundancy memory cell array is arranged at an end of the main memory cell array in the column direction and no redundancy memory cell array has to be arranged in the row direction if memory cells are to be relieved both in the row direction and in the column directions.

With the above described embodiment, for example, memory cells are relieved in the row direction by reading data from the memory cells of the redundancy memory cell array in the row direction and selecting a column by means of the column selection switch. On the other hand, memory cells are relieved in the column direction by reading data from the memory cells of the redundancy memory cell array in the column direction, entering the output signals of the row predecoder into the column selection switch and selecting a row by means of the column selection switch.

Thus, with this embodiment, memory cells can be relieved both in the row direction and in the column direction without using a semiconductor chip having a large surface area.

[C] The following embodiments of the invention will be described mainly in terms of the floor plan of the memory chip, the configuration of the memory chip and the pattern layout.

Figure 13A:
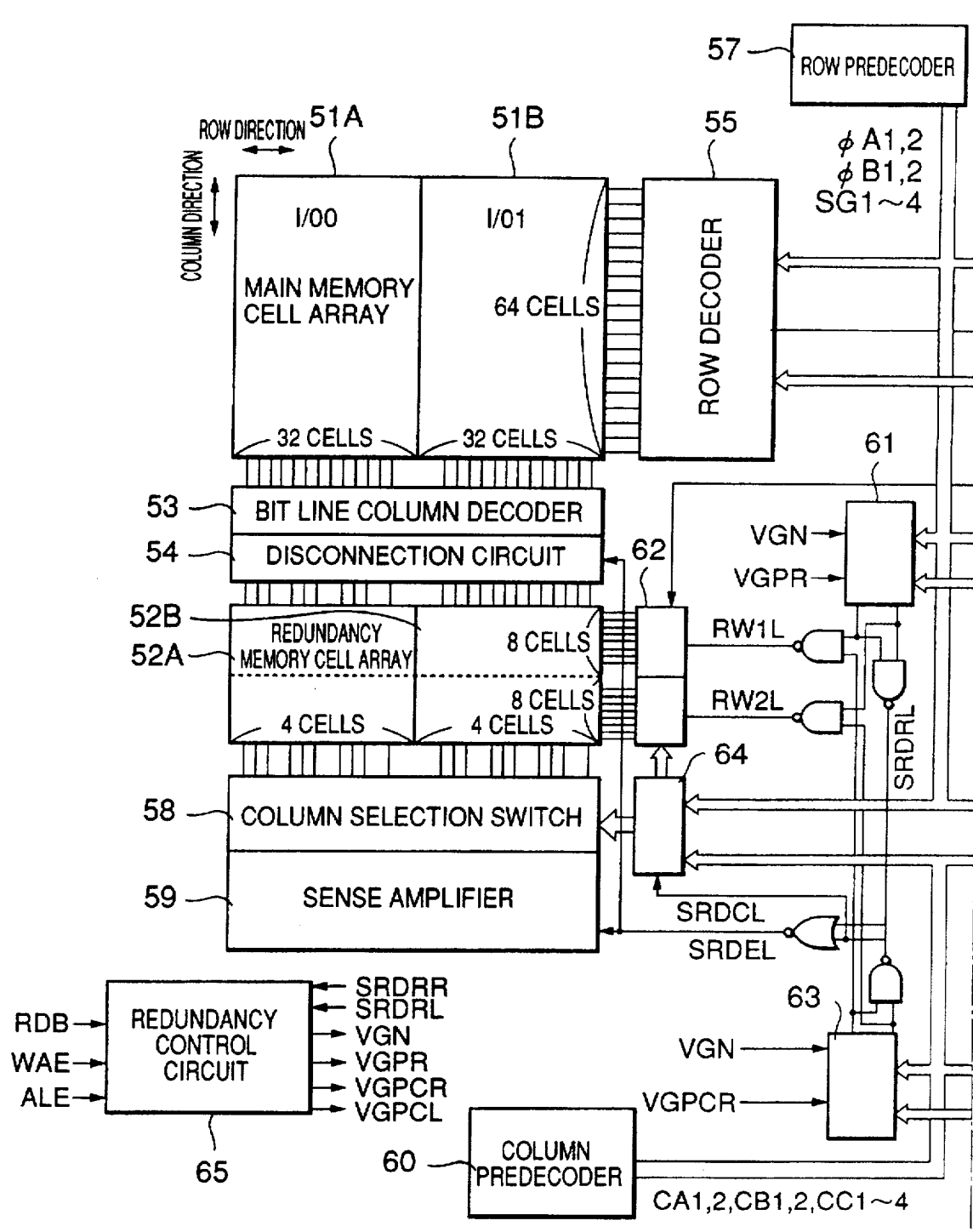
FIGS. 13A and 13B are block diagrams of a fourth embodiment of semiconductor memory according to the invention.
Figure 13B:
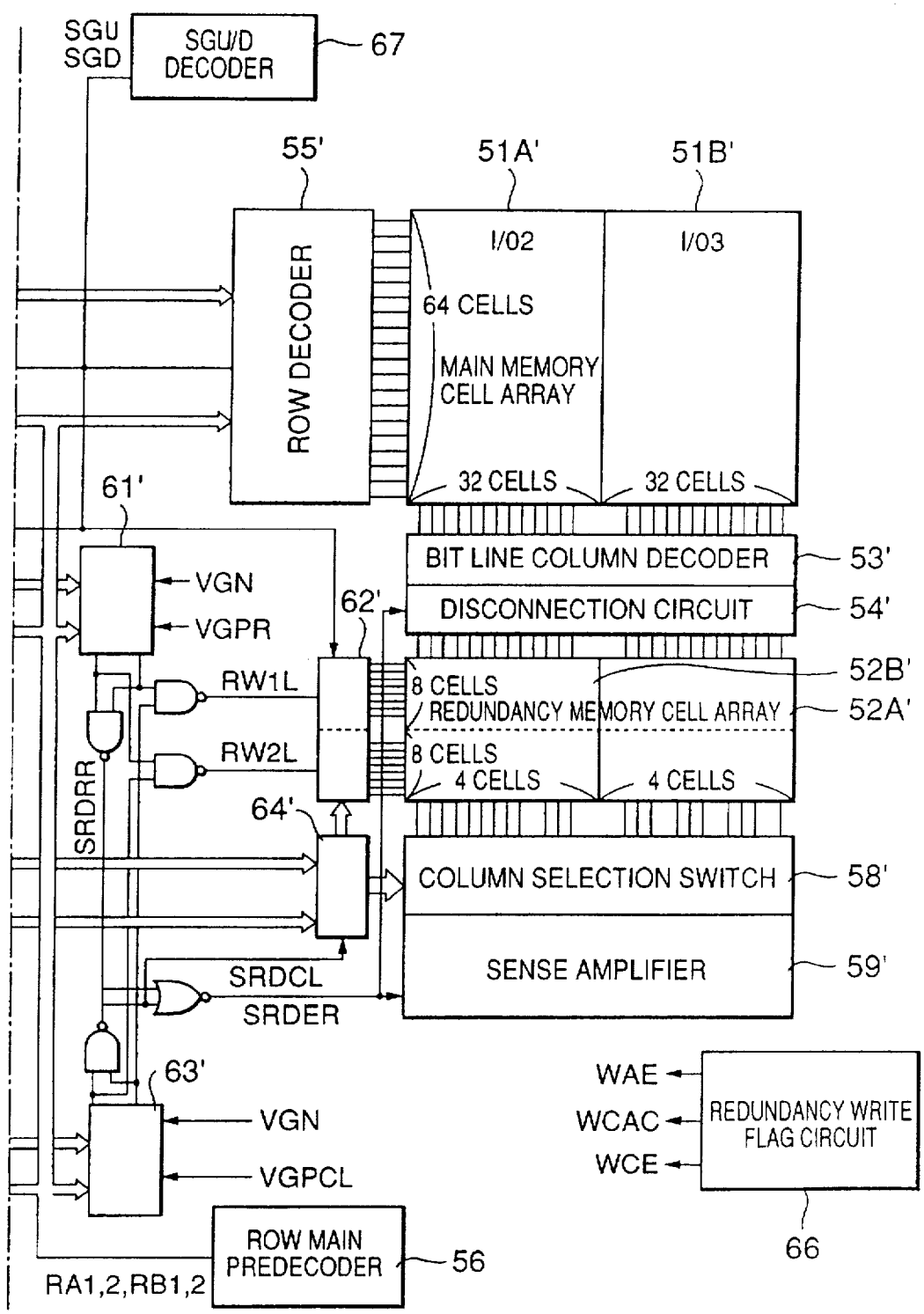

FIGS. 13A and 13B are block diagrams of a fourth embodiment of semiconductor memory according to the invention.

This embodiment is applicable to mask ROMs. In order to simplify the following description, assume that main memory cell arrays having thirty two cells in the row direction and sixty four cells in the column direction along with four input/output (I/O) terminals. It is designed to be relieved for a word line (sixty four cells) in terms of rows and for two row-directional cells and sixteen column-directional cells.

Firstly the configuration of the embodiment of semiconductor memory will be described.

The main memory cell arrays 51A, 51B, 51A' and 51B' of the embodiment comprise a plurality of MOS transistors having different threshold values depending on if a data is stored there or not. Similarly, the redundancy memory cell arrays 52A, 52B, 52A' and 52B' of the embodiment comprise a plurality of PROMs having different threshold values depending on if a data is stored there or not.

With such an arrangement, the main memory cell arrays and the redundancy memory cell arrays can share column lines and column selection switches so that the main and redundancy memory cell arrays can be brought close to each other to reduce the size of the semiconductor chip.

Since the main memory cells comprise MOS transistors and the redundancy memory cells comprise PROMs that are dimensionally different from the ROM transistors, the dimension of the PROMs in the row direction may well be made $2^n$ times as large as that of the main memory cells.

Thus, in this embodiment, if the dimension of the PROMs in the row direction is made eight times as large as that of the main memory cells and thirty two cells are arranged per row of the main memory cell arrays, the pitch of the columns of the redundancy memory cell arrays will be eight times as high as that of the columns of the main memory cell arrays when four cells are arranged per row of the redundancy memory cell arrays so that the redundancy memory cell arrays will have a width equal to that of the main memory cell arrays in the row direction.

Bit line column selection switches 53 and 53' and disconnection circuits 54 and 54' are arranged between the main memory cell arrays 51A, 51B, 51A' and 51B' and the redundancy memory cell arrays 52A, 52B, 52A' and 52B'.

The bit line column selection switches 53 and 53' are designed to reduce the number of columns of the main memory cell arrays 51A, 51B, 51A' and 51B' before connect them to the redundancy memory cell arrays 52A, 52B, 52A' and 52B' because the number of columns of the main memory cell arrays 51A, 51B, 51A' and 51B' are much larger than that of the redundancy memory cell arrays 52A, 52B, 52A' and 52B'.

Disconnection circuits 54 and 54' disconnect column lines between the main memory cell arrays and the redundancy memory cell arrays when data are written into or read out of memory cells of the redundancy memory cell arrays 52A, 52B, 52A' and 52B'.

Row decoders 55 and 55' select a word line of the main memory cell arrays 51A, 51B, 51A' and 51B' according to the output signals of row main predecoder 56 and row predecoder 57.

Column selection switch 58 selects a column line according to the output signal of column predecoder 60. Sense amplifier 59 amplifies the data read out of the main memory cell arrays or the redundancy memory cell arrays. The data of the sense amplifier 59 is produced to the outside by way of an output circuit.

Row address memory circuits 61 and 61' store a signal for selecting a defective row of the main memory cell arrays, compare the signal with the output signals of the row main predecoder 56 and the row predecoder 57 and produces an output signal with level "L" if they agree with each other.

Column address memory circuits 63 and 63' store a signal for selecting a defective block of the main memory cell arrays, compares the signal with the output signals of the row main predecoder 56 and the column predecoder 60 and produces an output signal with level "L" if they agree with each other.

Selection circuits 62 and 62' select one of a plurality of control gates of the redundancy memory cell arrays according to the output signals of the row address memory circuits 61 and 61' or those of the column address memory circuits 63 and 63'.

Address conversion circuits 64 and 64' select one of the plurality of control gates of the redundancy memory cell arrays according to the output signals of the column address memory circuits 63 and 63' and controls the column selection switch 58 according to the output signal of the row predecoder 57 or the column predecoder 60. Redundancy control circuit 65, redundancy write flag circuit 66 and SGU/D decoder 67 generate a predetermined control signal and feed it to a predetermined circuit.

Figure 14:
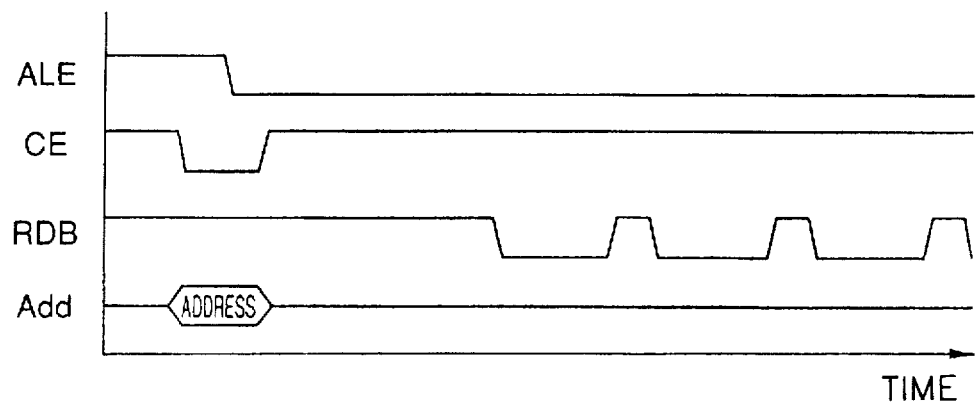
FIG. 14 is a graph showing the read sequence of the embodiment of FIGS. 13A and 13B.

FIG. 14 is a graph showing the read sequence of the embodiment of FIGS. 13A and 13B.

The address signal brought to an address pin is latched at the falling edge of an address latch enable signal ALE and applied to the row main decoder 56, the row predecoder 57, the column predecoder 60 and the SGU/D decoder 67.

The output of the row predecoder 57 will be signals $\phi A1$, $\phi A2$, $\phi B1$, $\phi B2$ and SG1 through SG4. If SG1 is selected here, only it is brought to level "H", whereas SG2 through SG4 are held to level "L".

In this way, either one of $\phi A1$ and $\phi A2$, either one of $\phi B1$ and $\phi B2$ and one of SG1 through SG4 are brought to level "H" to select a word line.

Figure 15:
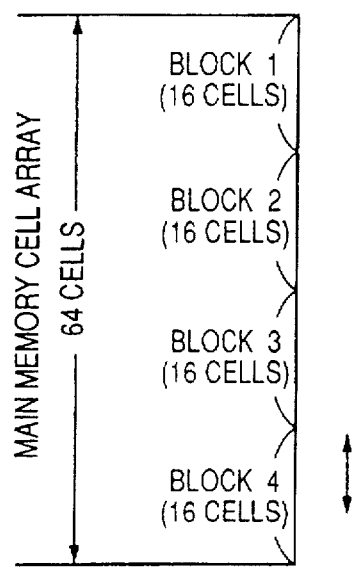
FIGS. 15 and 16 are schematic illustrations showing how the main memory cell arrays can be divided into blocks and banks in the above embodiment.

FIG. 15 is a schematic illustration showing how the main memory cell arrays are divided into four blocks for selecting a word line.

Each of the main memory cell arrays has sixty four cells in the column direction and divided into four blocks 1 through 4 in the column direction. Each block has 16 cells.

As shown in Table 2, a block is selected by carrying out logical operations on four signals of RA1, RA2, RA3 and RA4.

TABLE 2

|  | RA1 | RA2 | RB1 | RB2 |
|---|---|---|---|---|
| Block 1 | H | L | H | L |
| Block 2 | H | L | L | H |
| Block 3 | L | H | H | L |
| Block 4 | L | H | L | H |

Figure 16:
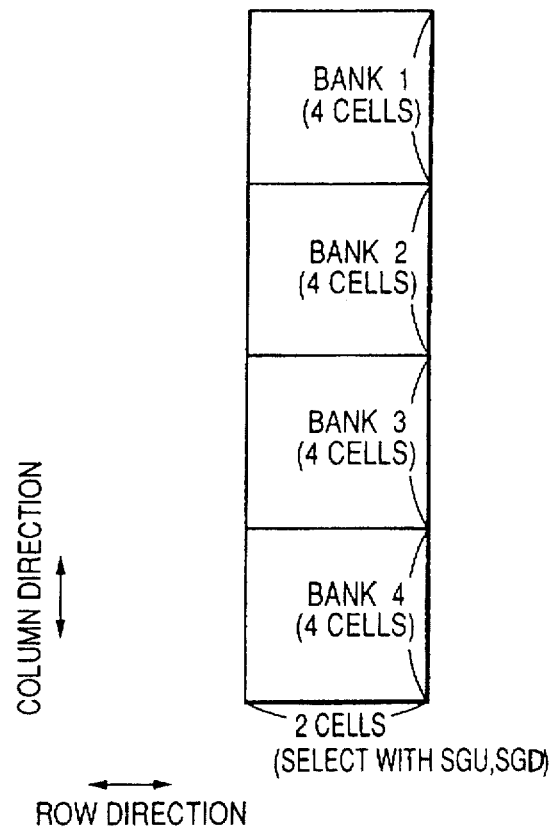

FIG. 16 is a schematic illustration showing how the blocks of the main memory cell arrays can be further divided into banks for selecting a word line.

Assume here that each bank has four cells in the column direction and two cells in the row direction.

As shown in Table 3, a bank is selected by carrying out logical operations on four signals of SG1 through SG4 and using SGU and SGD. SG1 through SG4 are used for selecting four cells in the column direction, whereas SGU and SGD are used for selecting two cells in the row direction.

TABLE 3

|  | SG1 | SG2 | SG1 | SG2 |
|---|---|---|---|---|
| Bank 1 | H | L | L | L |
| Bank 2 | L | H | L | L |
| Bank 3 | L | L | H | L |
| Bank 4 | L | L | L | H |

Figure 17:
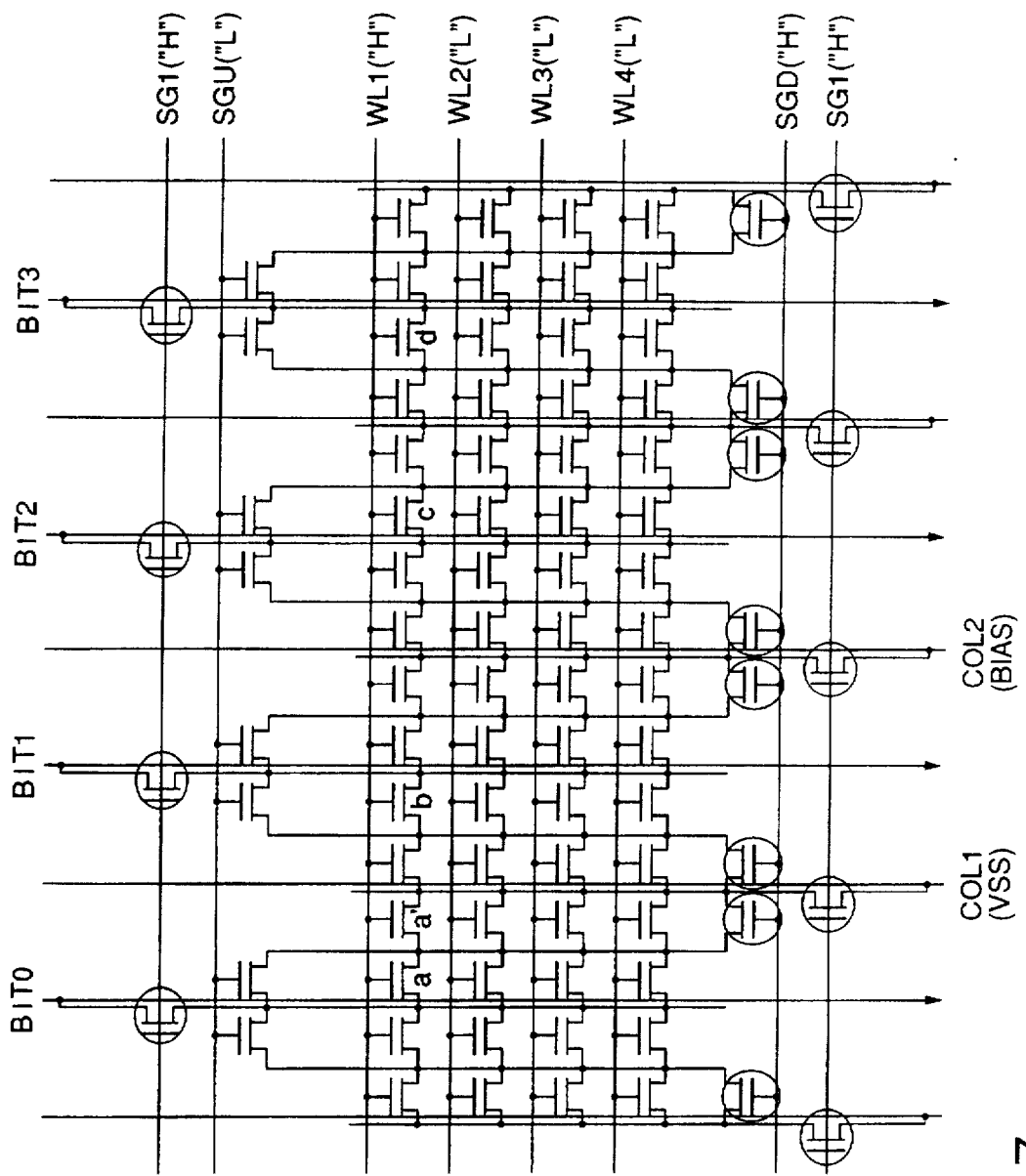
FIG. 17 is a circuit diagram of an equivalent circuit of a bank-type mask ROM.

FIG. 17 is a circuit diagram of an equivalent circuit of a bank-type mask ROM as shown in FIGS. 15 and 16.

A bank has four cells in the column direction and two cells in the row direction. Bit lines BIT0 through BIT3 and column lines COL1 through COL4 are arranged alternately between the banks.

The data of the selected memory cell of each bank is read out onto the bit lines BIT0 through BIT3. The ground potential VSS or a bias potential is applied to the column lines COL1×COL4 and a bank is selected according to the potential applied to the column lines COL1 through COL4.

If each of the main memory cell arrays has thirty two cells in the row direction, the number of banks in the row direction is sixteen and the number of bit lines is eight. Thus, a total of eight cells are selected and a total of eight data are read out from the selected eight cells.

As shown in Table 4, a word line is selected by carrying out logical operations on four signals of $\phi A1$, $\phi A2$, $\phi B1$, $\phi B2$.

TABLE 4

|  | $\phi A1$ | $\phi A2$ | $\phi B1$ | $\phi B2$ |
|---|---|---|---|---|
| WL 1 | H | L | H | L |
| WL 2 | H | L | L | H |
| WL 3 | L | H | H | L |
| WL 4 | L | H | L | H |

As shown in Table 5, either one of the two cells of each bank in the row direction is selected by using two signals SGU and SGD.

TABLE 5

| Memory Cell | SGU | SGD |
|---|---|---|
| a' | H | L |
| a | L | H |

• when WL1 is selected

Now, the method of selecting a memory cell and the scheme for reading out data therefrom will be described by referring to FIG. 17.

Word line WL1 is selected by using four signals of $\phi A1$, $\phi A2$, $\phi B1$, $\phi B2$ and brought to level "H", whereas the remaining word lines WL2 through 4 are held to level "L".

Then, for instance, the ground potential is applied to column line COL1 and a bias potential is applied to column line COL2. Consequently, the data stored in the memory cells arranged between bit line BIT1 and column line COL1 are ready for being read out.

When SG1 is brought to level "H", while SGU is held to level "L" and SGD is brought to level "H", the MOS transistors marked by circles are turned on to select the memory cell b.

Thus, the data stored in the memory cell b is read out onto the bit line BIT1.

If data (data "1") is actually stored in the memory cell b, a large threshold value is assigned to the memory cell b so that the memory cell b not brought into an on-state if a level "H" potential is applied to the word line WL1. Therefore, the potential of the bit line BIT1 is held to the precharge level of "H" and data "1" is read out onto the bit line BIT1.

If, on the other hand, no data (or data "0") is stored in the memory cell b, a small threshold value is assigned to the memory cell b so that the memory cell b is brought into an on-state if a level "H" potential is applied to the word line WL1. Therefore, the potential of the bit line BIT1 is brought to the potential of level "L" (the ground potential VSS) by way of the column line COL1 and data "0" is read out onto the bit line BIT1.

Figure 18:
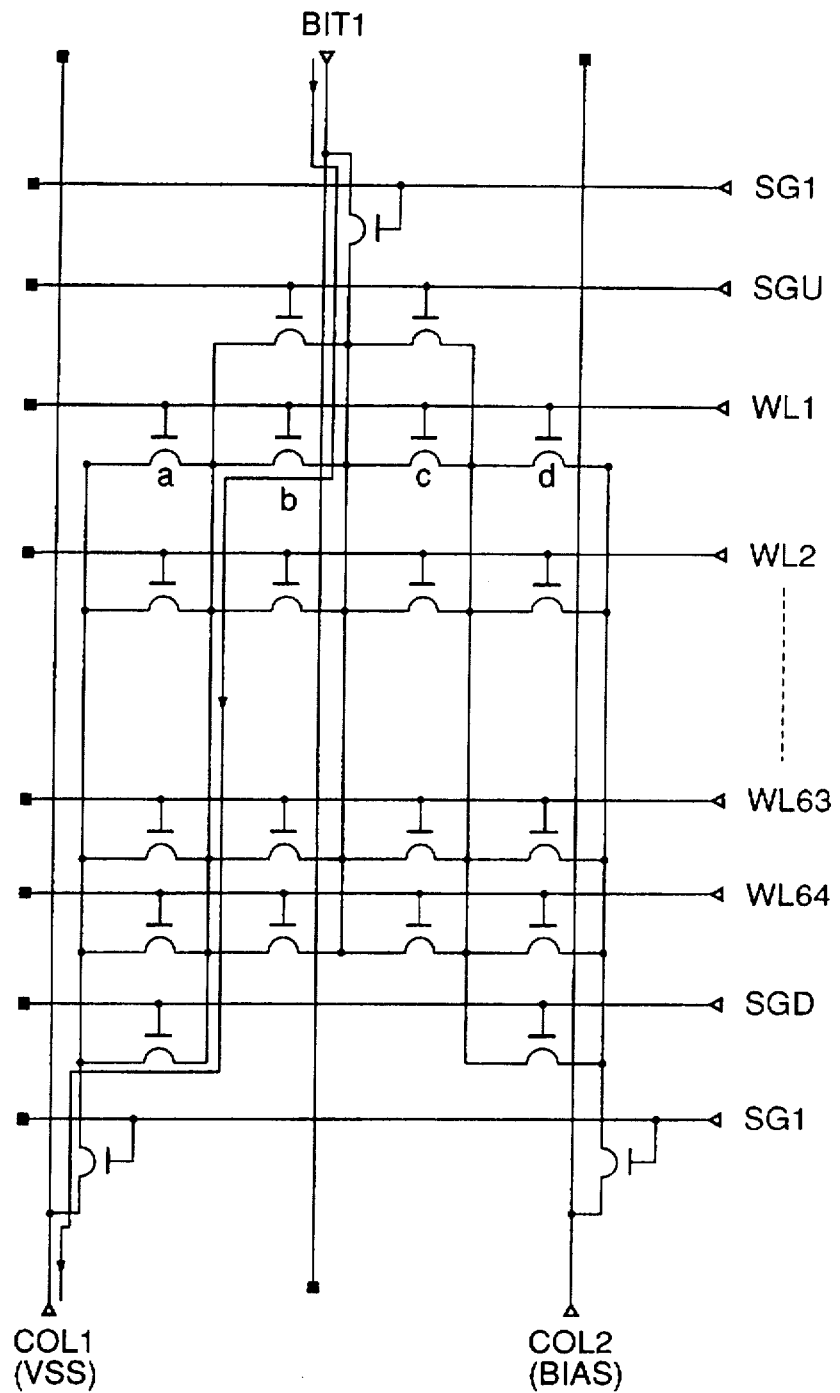
FIG. 18 is a schematic illustration of part of the main memory cell arrays of the above embodiment of semiconductor memory according to the invention.
Figure 19:
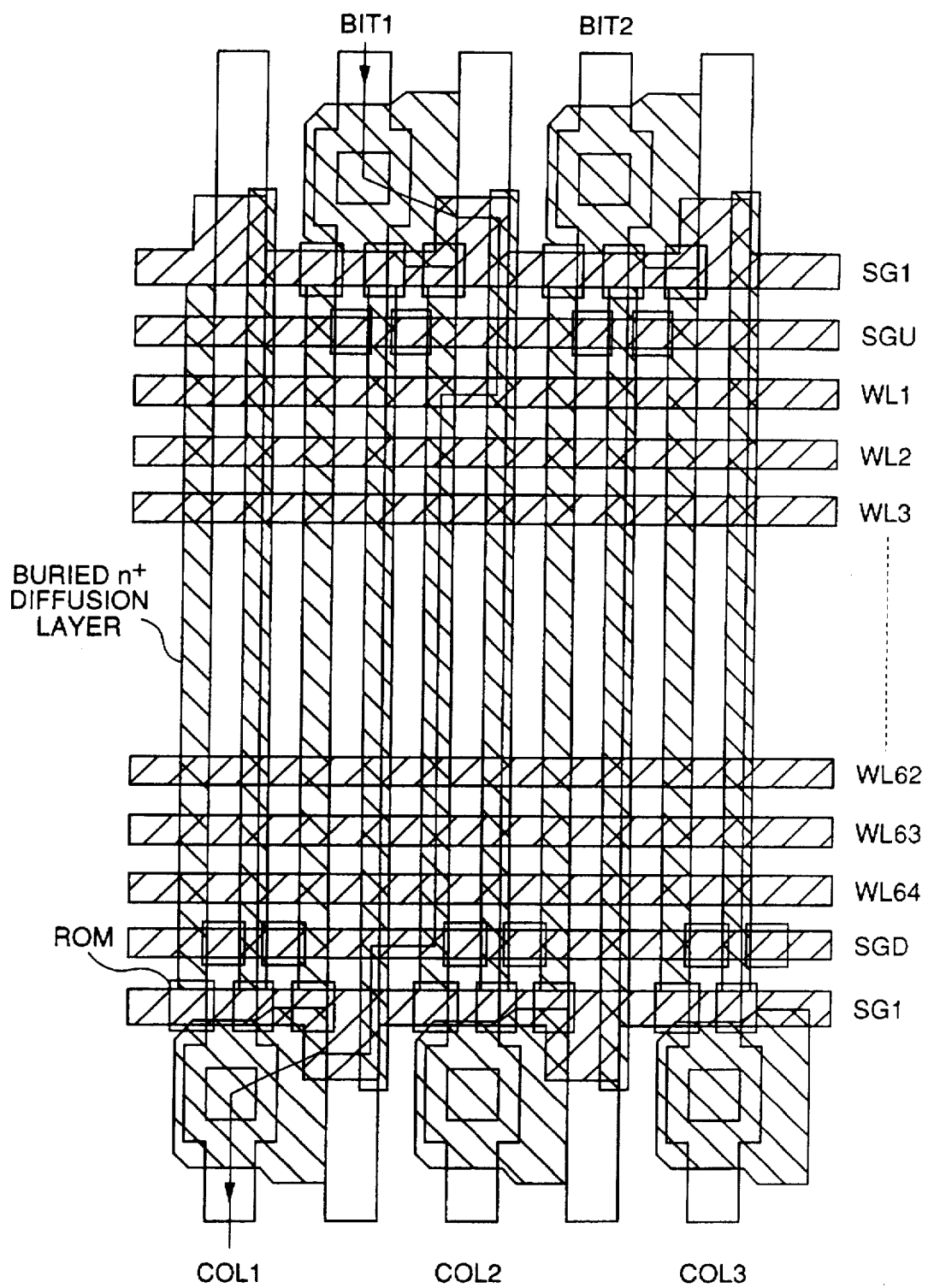
FIG. 19 is a plan view of the circuit of FIG. 18, illustrating its pattern formed on a semiconductor substrate.

FIG. 18 is a schematic illustration of part of the main memory cell arrays of the above embodiment of semiconductor memory and FIG. 19 is a plan view of the circuit of FIG. 18, illustrating its pattern formed on a semiconductor substrate.

The bit lines BIT1 and BIT 2 and the column lines COL1, COL2 and COL3 are typically made of aluminum, whereas the lines SG1, SGU and SGD and the word lines WL1 through WL64 are typically made of tungsten silicide. The remaining elements are typically formed by a buried $n^+$ diffusion layer that is buried in the semiconductor substrate.

If the memory cell b storing data "0" is selected, it is brought into an on-state and the potential of the bit line BIT1 falls so that data "0" is read out onto the bit line BIT1.

Table 6 below illustrates the relationship between the selected word line and the potentials of signals SG1, SGU and SGD and those of column lines COL1 and COL2.

TABLE 6

| Memory Cell | SG1 | SGU | SGD | WL1 | COL1 | COL2 |
|---|---|---|---|---|---|---|
| a | H | H | L | H | Vss | Bias |
| b | H | L | H | H | Vss | Bias |
| c | H | L | H | H | Bias | Vss |
| d | H | H | L | H | Bias | Vss |

Figure 20:
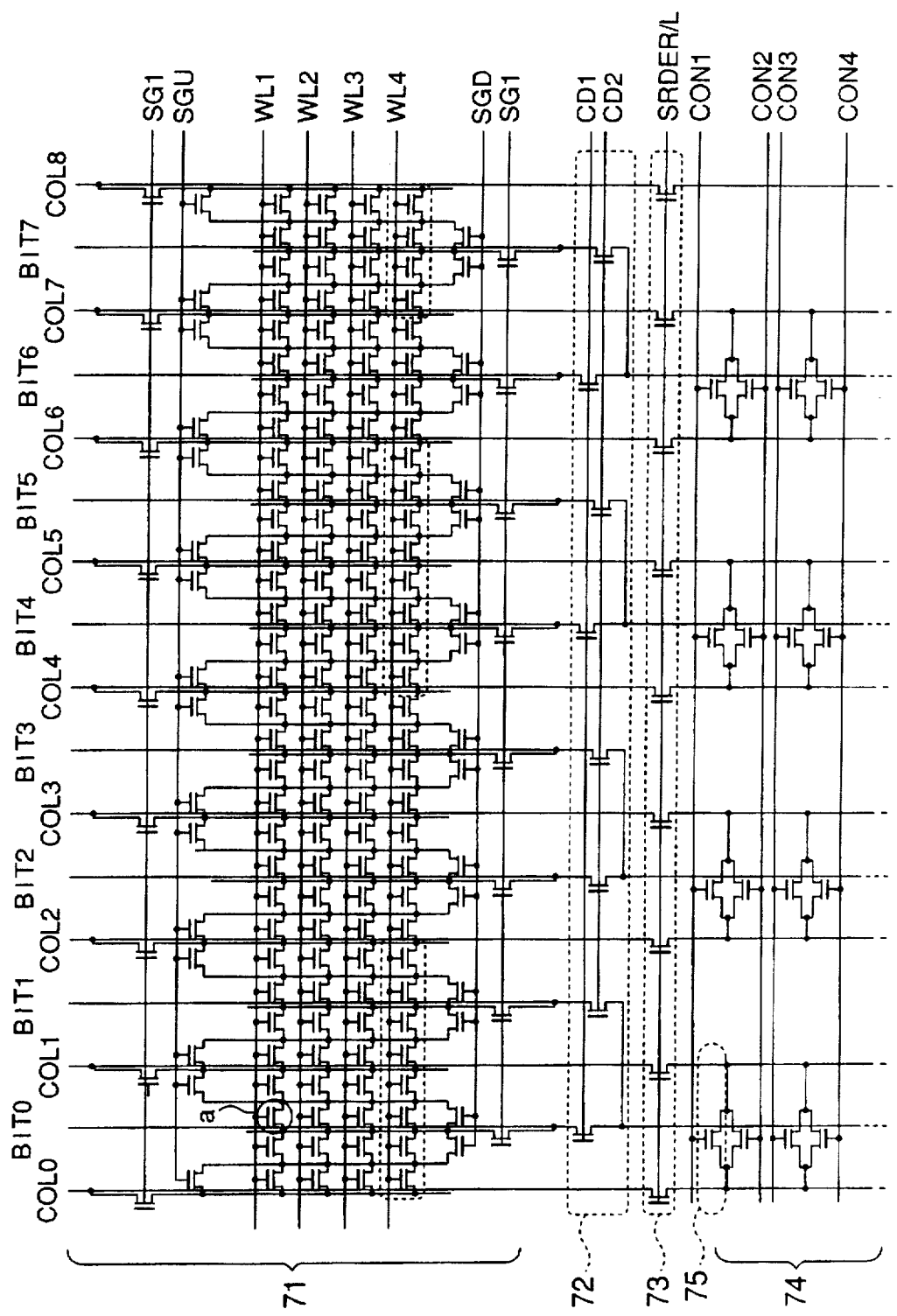
FIG. 20 is a circuit diagram of the main memory cell array section and the redundancy memory cell array section of the above embodiment of semiconductor memory according to the invention.
Figure 21:
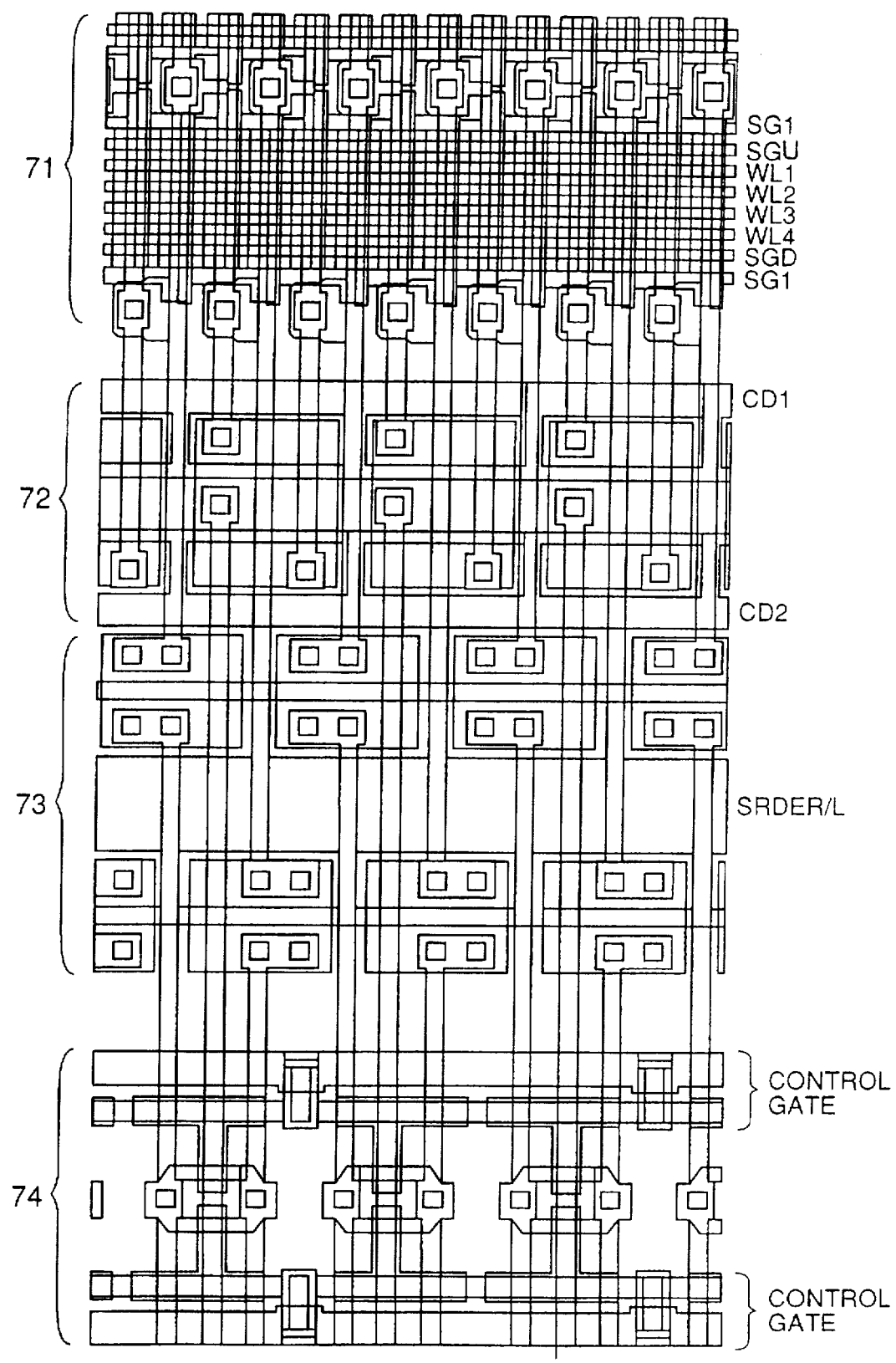
FIG. 21 is plane view of the circuit of FIG. 20, illustrating its pattern formed on a semiconductor memory chip.
Figure 22:
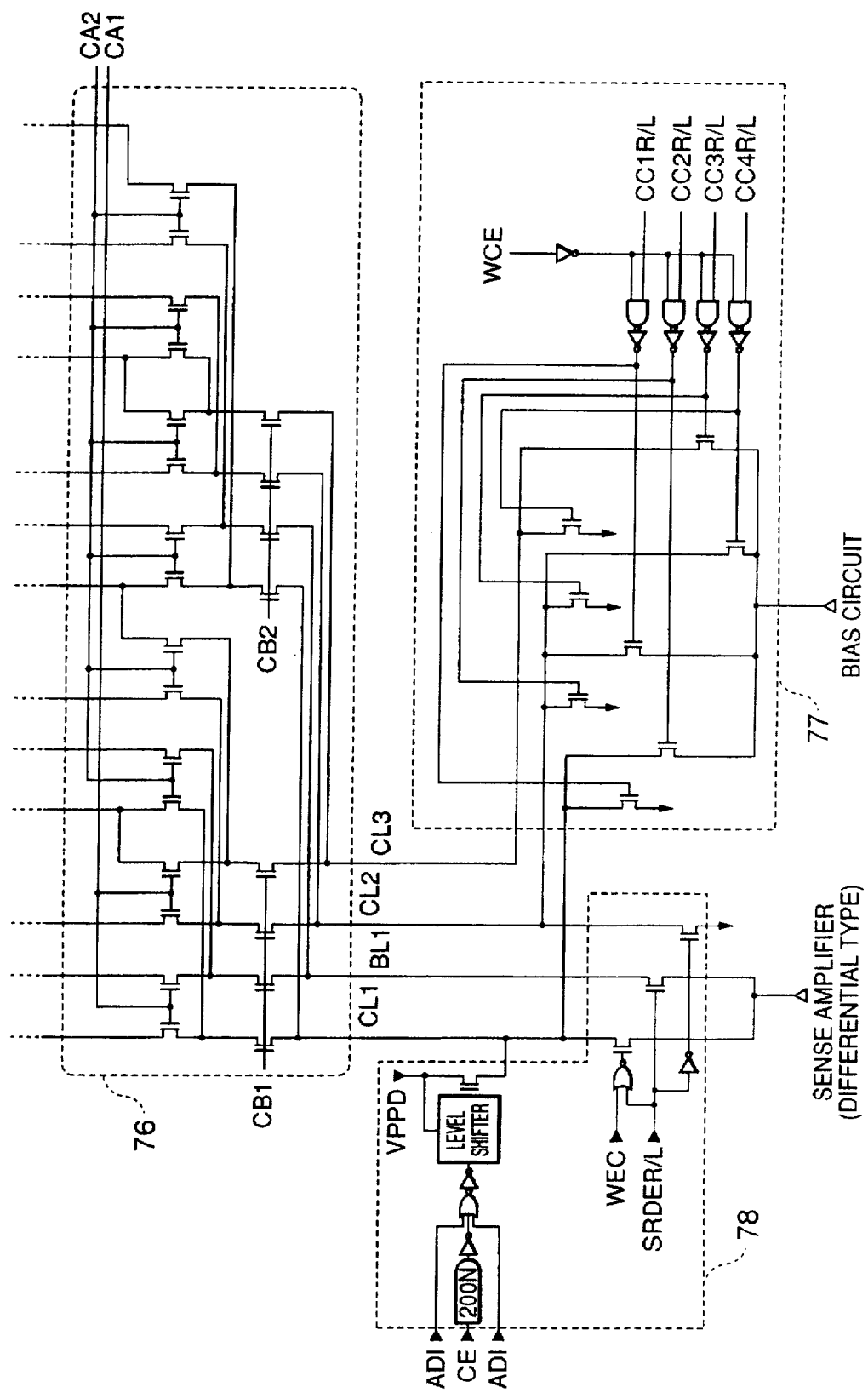
FIG. 22 a circuit diagram of the column selection switch section, the write circuit section and the read circuit section of the embodiment of semiconductor memory of FIG. 20.

FIG. 20 is a circuit diagram of the main memory cell array section and the redundancy memory cell array section of the above embodiment of semiconductor memory according to the invention. FIG. 21 is plane view of the circuit of FIG. 20, illustrating its pattern formed on a semiconductor memory chip. FIG. 22 a circuit diagram of the column selection switch section, the write circuit section and the read circuit section of the embodiment of semiconductor memory of FIG. 20.

The symbol R/L affixed to a signal (e.g., any of signals CC1 through CC4) signifies that, if memory cell arrays are divided and arranged on the left and right sides on a chip (e.g., memory cell arrays 51A and 51B are arranged on the left side, while memory cell array 51A' and 51B' are arranged on the right side in FIGS. 13A and 13B), the memory cell arrays on the left side and those on the right side can be controlled independently by means of different signals.

Column lines COL0 through COL8 and bit lines BIT0 through BIT7 are alternately arranged in main memory cell array 71, extending in the column direction. Similarly, column liens COL0 through COL8 and bit lines BIT0, BIT2, BIT4 and BIT6 are alternately arranged in redundancy memory cell array 74, extending in the column direction.

A bit line column selection switch 72 and a disconnection circuit 73 are arranged between the main memory cell array 71 and the redundancy memory cell array 74. The bit line selection switch 72 is designed to select four bit lines out of the eight bit lines. The disconnection circuit 73 is designed to disconnect the column lines COL0 through COL8 between the main memory cell array and the redundancy memory cell array when data are written and read for the redundancy memory cell array 75.

Column selection switch 76 is designed to select a word line out of four bit lines and three column lines out of nine column lines. Bias decoder 77 is designed to apply a bias potential supplied from a bias source to a predetermined column line and the ground potential to the predetermined remaining column lines according to signals CC1R/L through CC4R/L.

The sense amplifier in FIG. 22 is of a differential type and designed to reads data out of memory cells by detecting changes in the potential of bit line BL1 or column line CL1.

Write circuit 78 is designed to apply write potential VPP to a column line and disconnect the (differential type) sense amplifier and the column line when data is written into a redundancy memory cell.

In the embodiment of semiconductor memory having a configuration as described above, the redundancy memory cells and the main memory cells share common column lines. SRDER/L of the write circuit 78 is brought to level "H" when data is read out of a memory cell of the main memory cell array and brought to level "L" when data is written into or read out of a redundancy memory cell.

Signal WCE for recognizing a data writing operation is brought to level "H" when a desired potential is applied to the pad of the data write mode detection circuit of FIG. 30.

Now, the operation of writing data into a redundancy memory cell will be described below.

Firstly, all the MOS transistors of the disconnection circuit 73 are brought into an off-state in order to prevent write potential VPP from being applied to the main memory cell.

The column line CL1 and the sense amplifier are disconnected by the write circuit 78 and the write potential VPP is applied to the column CL1, while ground potential VSS is applied to the column line CL2. Since WCE is brought to level "H", all the transistors of the bias decoder 77 are turned off.

Two adjacently located columns are selected by the column selection switch 76 and write potential VPP is applied to one of the two columns, while ground potential VSS is applied to the other column. Additionally, one of the control gates CON1 through CON4 of the redundancy memory cell array 74 is selected and write potential VPP is applied to the selected control gate.

If, for instance, CON1 is selected and write potential VPP is applied to the column line COL0, while ground potential VSS is applied to the column line COL1, electrons are injected into the floating gate of the redundancy memory cell array 75 to write data there.

Data are read out of the main memory cell arrays in a manner as described below.

Firstly, all the MOS transistors of the disconnection circuit 73 are brought into an on-state.

Then, the column line CL1 and the sense amplifier are disconnected and the bit line BL1 and the sense amplifier are connected by the write circuit 78. The column lines CL1 the column line COL1 is brought to the ground potential to select memory cell 75, then the data stored in the memory cell 75 is read out and transmitted to the sense amplifier.

Table 7 below summmarily shows the levels of different signals for writing and reading data.

TABLE 7

|  | SRDE R/L | CC1 | CC2 | CC3 | CC4 | CD1 | CD2 |
|---|---|---|---|---|---|---|---|
| Data Read-out from Main Memory Cell | H | H | L | L | L | H | L |
|  | H | L | H | L | L | H | L |
|  | H | L | L | H | L | L | H |
|  | H | L | L | L | H | L | H |
| Data Read-out from Main Memory Cell | L |  |  |  |  |  |  |
| Data Write in Redundancy Memory Cell | L |  |  |  |  |  |  |

|  | CL1 | CL2 | CL3 | BL1 | COL0 | BIT0 | COL1 | BIT1 | COL2 |
|---|---|---|---|---|---|---|---|---|---|
| Data Read-out from Main Memory Cell | Vss | Rapid | Floating | S/A | Vss | S/A | rapid | S/A |  |
|  | Rapid | Vss | Floating | S/A | Rapid | S/A | Vss | S/A |  |
|  | Floating | Vss | Rapid | S/A |  |  | Vss |  | Rapid |
|  | Floating | Rapid | Vss | S/A |  |  | Rapid |  | Vss |
| Data Read-out from Main Memory Cell | Vss |  | S/A |  |  |  |  |  |  |
| Data Write in Redundancy Memory Cell | Vss |  | VPPD (Data 1) Floating |  |  |  |  |  |  | through CL3 are brought to either the bias potential or the ground potential by means of the bias circuit and the bias decoder 77.

Thereafter, two adjacently located columns are selected by the column selection switches 72 and 76 and the bias potential is applied to one of the two columns, while ground potential VSS is applied to the other column. One of the word lines WL1 through WL4 is selected and brought to a high potential.

If, for example, the word line WL1 is selected and the column line COL0 is brought to the bias potential, while the column line COL1 is brought to the ground potential so that SG1 and SGU are put to level "H", whereas SGD is held to level "L", then memory cell a is selected and the data stored in the memory cell a is read out and transmitted to the sense amplifier.

On the other hand, data are read out of the redundancy memory cell arrays in a manner as described below.

Firstly, all the MOS transistors of the disconnection circuit 73 are brought into an off-state.

Then, the column line CL1 and the sense amplifier are connected and the bit line BL1 and the sense amplifier are disconnected by the write circuit 78 to bring the column line CL2 to the ground potential. Two adjacently located columns are selected by the column selection switch 76 and ground potential VSS is applied to one of the two columns. Additionally, one of the control gates of the redundancy memory cell array 74 is selected and brought to a high potential.

If, for example, the control gate CON1 is selected and the column line COL0 is connected to the sense amplifier, while Note that the control gates of the redundancy memory cells are made of a buried n⁺ diffusion layer, they have a large resistance and a large capacity. Therefore, they may be produced by forming narrow and straight tungsten silicide (WSi) layers on the semiconductor substrate and electrically short-circuiting the buried n⁺ diffusion layer and the tungsten silicide layers at different positions.

The buried n⁺ diffusion layer (control gates) and the tungsten silicide layers may easily be short-circuited in this embodiment because the number of bit lines on the redundancy memory cell arrays is smaller than that of bit lines on the main memory cell arrays.

Figure 23:
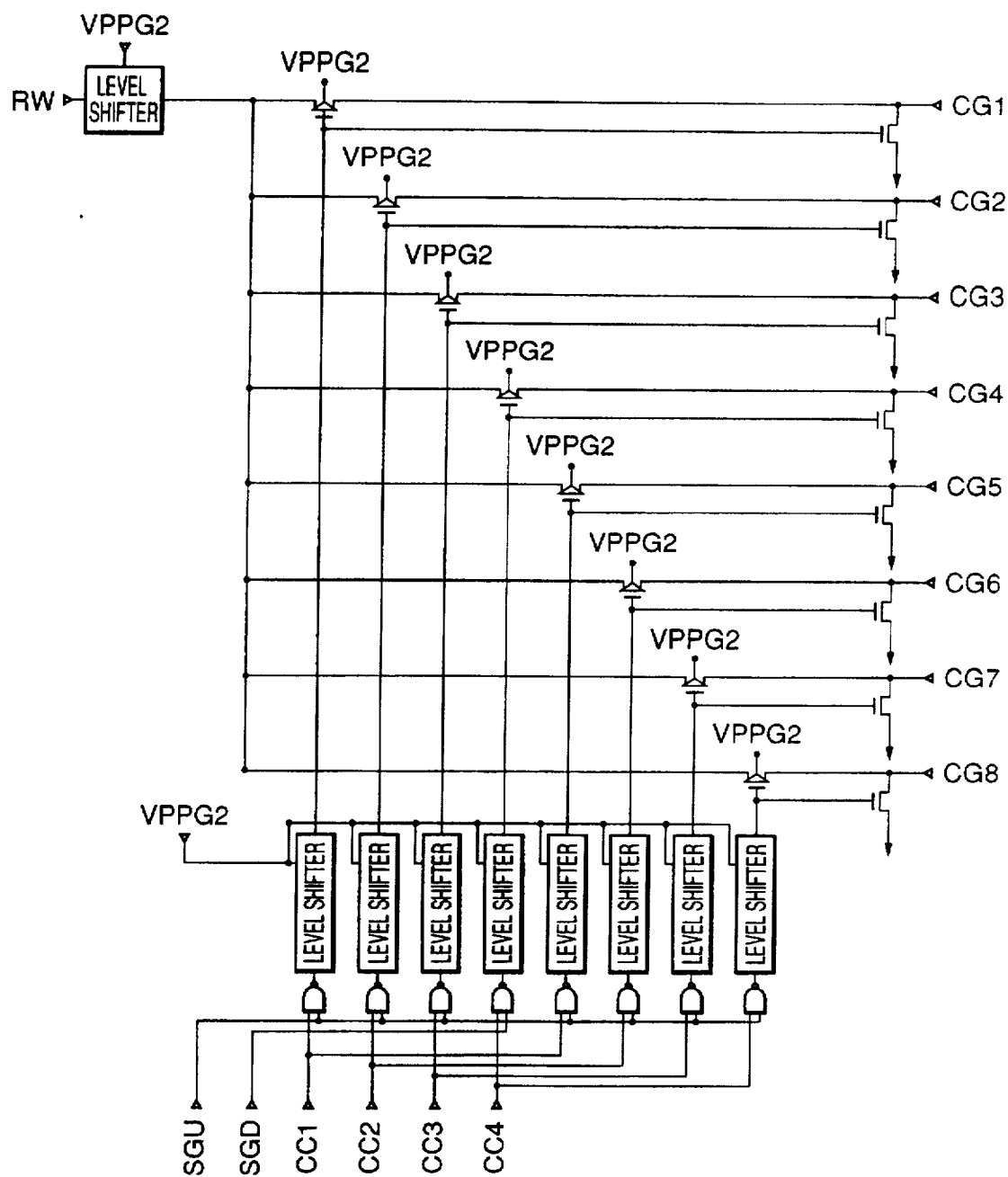
FIG. 23 is a circuit diagram of a control gate selection circuit that can be used for redundancy memory cell arrays for the purpose of the present invention.

FIG. 23 is a circuit diagram of a control gate selection circuit that can be used for redundancy memory cell arrays for the purpose of the above embodiment.

The eight cells in the direction of the main memory cell array correspond to a single cell in the row direction of the redundancy memory cell array in the circuit of FIG. 20. Therefore, the redundancy memory cell array is required to have eight rows in order to relive a single row of the main memory cell array.

Thus, a total of eight control gate have to be controlled in the redundancy memory cell array in order to relieve a single row of the main memory cell array. To do this, signals CC1 through CC4 (FIG. 22), SGU and SGD (FIG. 20) for decoding eight memory cells adjacently arranged along the row direction in the main memory cell array are taken into the control gate selection circuit and put under control for switching control gates.

Figure 24:
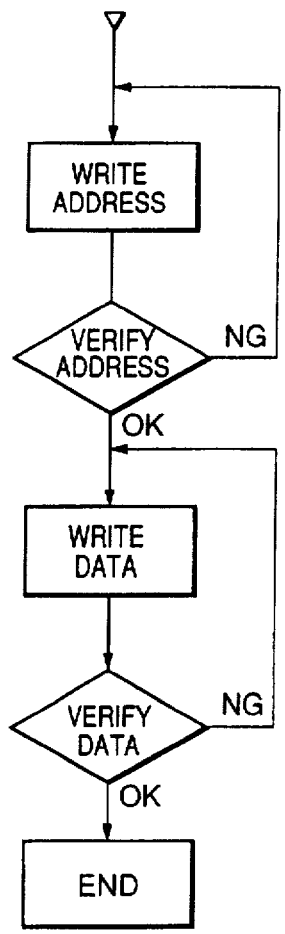
FIG. 24 is a flow chart illustrating the sequence of operation for relieving main memory cells.

FIG. 24 is a flow chart illustrating the sequence of operation for relieving main memory cells.

Firstly, the address for selecting a row of the main memory cell array to be relieved is written into a PROM for storing an address. Then, an operation of verifying that the address is properly written into the PROM is carried out. If the address for selecting the row of the main memory cell array to be relieved is not stored in the PROM, a rewrite operation is repeated until it is properly written into the PROM.

If it is verified that the address is correctly stored, the data of the address is written into the corresponding redundancy memory cell. Then, an operation of verifying that the data is properly stored in the redundancy memory cell is carried out. If the data of the address is not stored in the redundancy memory cell, a rewrite operation is repeated until it is properly written into the memory cell.

Then, the above operation is repeated until all the addresses and their data are written.

Now, the operation of writing an address for selecting a row or a block of the main memory cell array to be relieved into a PROM for storing the address will be briefly described.

Signals φA, φB, SG, RA and RB for specifying addresses in the row direction are entered into the row address memory circuit. Signals CA, CB and for specifying addresses in the column direction and row main addresses RA and RB for selecting columns (blocks) are entered into the column address memory circuit.

Figure 25:
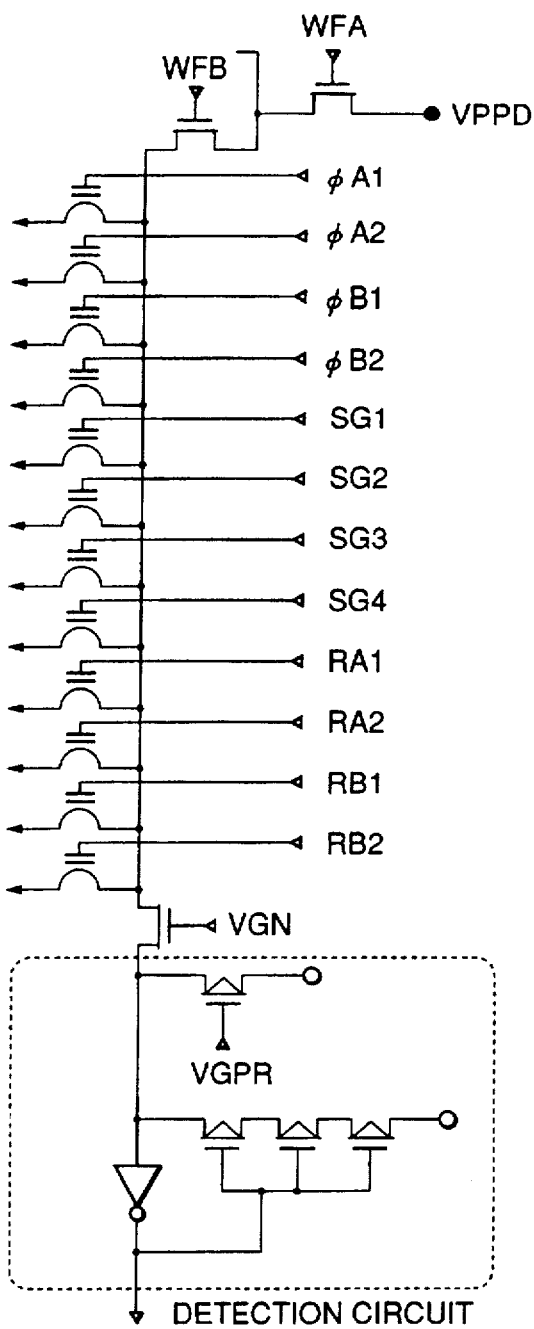
FIG. 25 is a circuit diagram of a row address memory circuit that can be used for the purpose of the invention.
Figure 26:
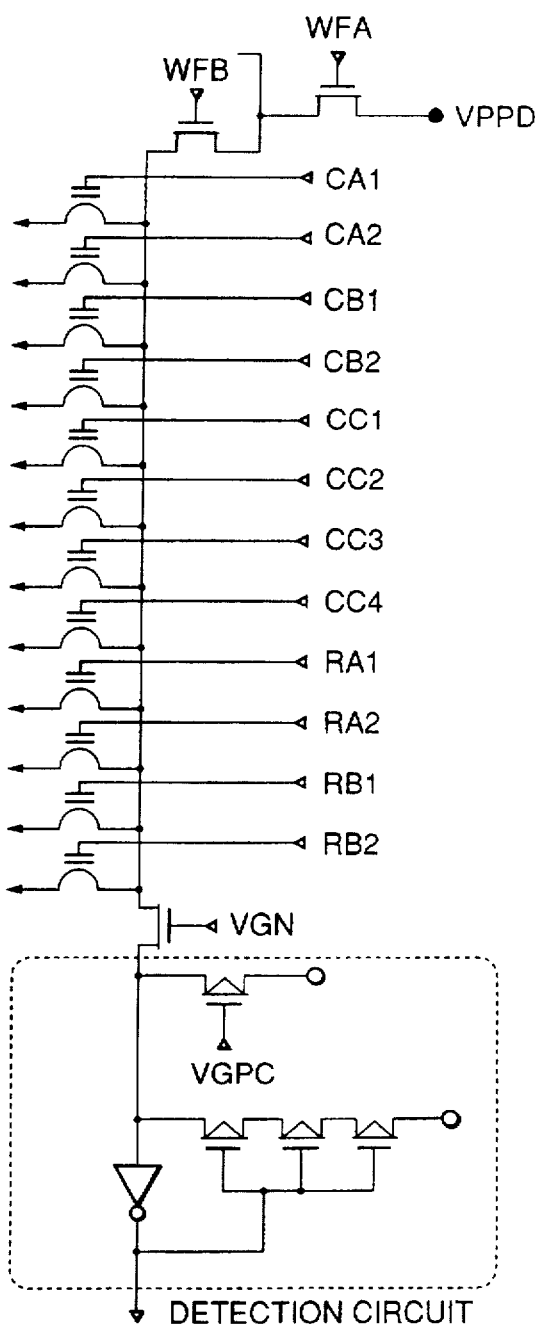
FIG. 26 is a circuit diagram of a column address memory circuit that can be used for the purpose of the invention.

FIG. 25 is a circuit diagram of a row address memory circuit and FIG. 26 is a circuit diagram of a column address memory circuit that can be used for the above embodiment.

Each of the address memory circuits receives signals from twelve signal lines (of which five are held to level "H"). If a defective address is written in an address storing PROM, the gate of the memory cell is brought to a high potential (e.g., 6V).

Figure 27:
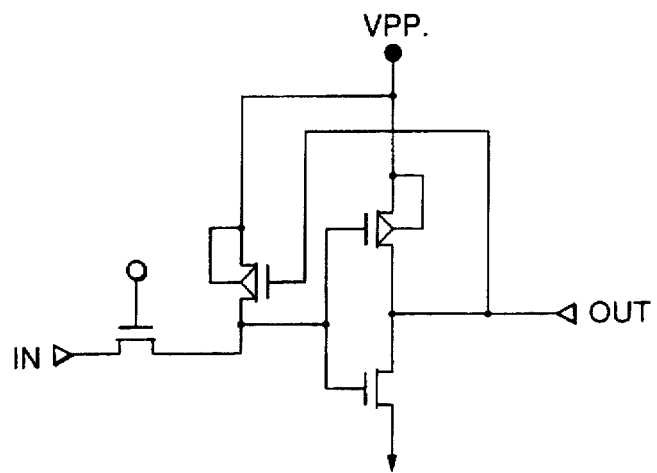
FIG. 27 is a circuit diagram of a level shifter that can be used for the purpose of the invention.

A level shifter as shown in FIG. 27 is used for such a level shift operation. The level shifter produces a high potential output signal when the high potential of the power source VPP is applied to it.

Figure 28:
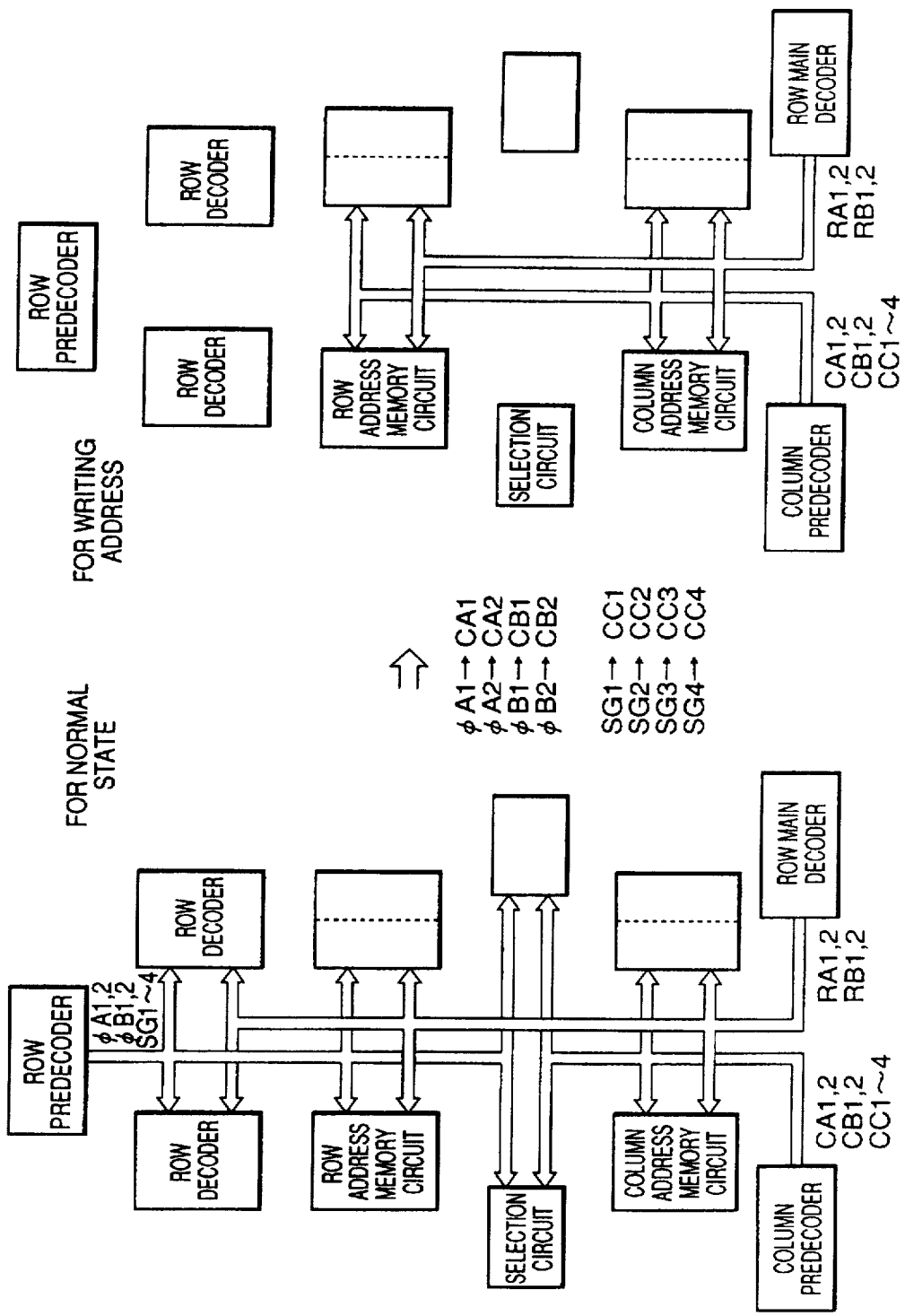
FIG. 28 is a block diagram that can be used for writing an address for the purpose of the invention.

FIG. 28 is a block diagram that can be used for writing an address for the above embodiment.

A total of twelve decode lines are connected to each of the row address memory circuit and the column address memory circuit. More specifically, output signals CA, CB and CC are used for the column predecoder and output signals φA, φB and SG of the row predecoder are not used. With such an arrangement, the use of a level shifter for the output signals of the row predecoder can be avoided.

FIG. 29 is a timing chart for writing an address for the above embodiment and FIGS. 30A through 30C are circuit diagrams of write mode detection circuits that can be used for the above embodiment.

A test signal rises when a predetermined potential is applied to the pads A through C of the write mode detection circuit and signal WAE for recognizing an address writing operation is brought to level "H". As the signal WAE is brought to level "H", the type of signal is switched from the one used in the normal operation mode to the one used in the write address mode.

Then, as an address latch enable signal falls, the address of the memory cell to be relieved and the address for specifying the eight address memory cells, two at each lateral side for the row and the column, are latched. Outputs WFA1, WFA2, WFB1 and WFB2 of the decoder for specifying the address memory cells will be used.

As shown in Table 8, 6V is applied to write potential VPPG1 and 3V and 8V are applied respectively to VPPG2 and VPPD.

TABLE 8

|  | Data Write in Address Memory cell | Address Check | Data Write in Data Memory Cell | Lead |
| --- | --- | --- | --- | --- |
| VPPG1 | 6V | 3V | 3V | 3V |
| VPPG2 | 3V | 3V | 6V | 3V |
| VPPD | 8V | 3V | 8V | 3V |
| VDD | 3V | 3V | 3V | 3V |

When CE is brought from level "H" to level "L" under this condition, only the line selected by the column predecoder and the row main decoder is brought to level "H". The potential of level "H" will have to be 6V in order to pass through the level shifter of FIG. 27. Thus, only the gate of the memory cell whose address is stored in the address memory circuits of FIGS. 25 and 26 is brought to 6V.

Then, CE is brought down to level "L" and after a delay of about 200 nm given rise to by a delay circuit, the selected WFA and WFB are brought up to level "H". Note that a level shifter is provided for decoder outputs WFA and WFB and hence the potential of VPPD is brought to 8V.

The delay circuit is arranged in order to put the time when a potential is applied to the drain of the EPROM behind the time when a potential is applied to the gate thereof. Thus, VPPD is fed to the drain of a single address memory cell group.

Figure 31:
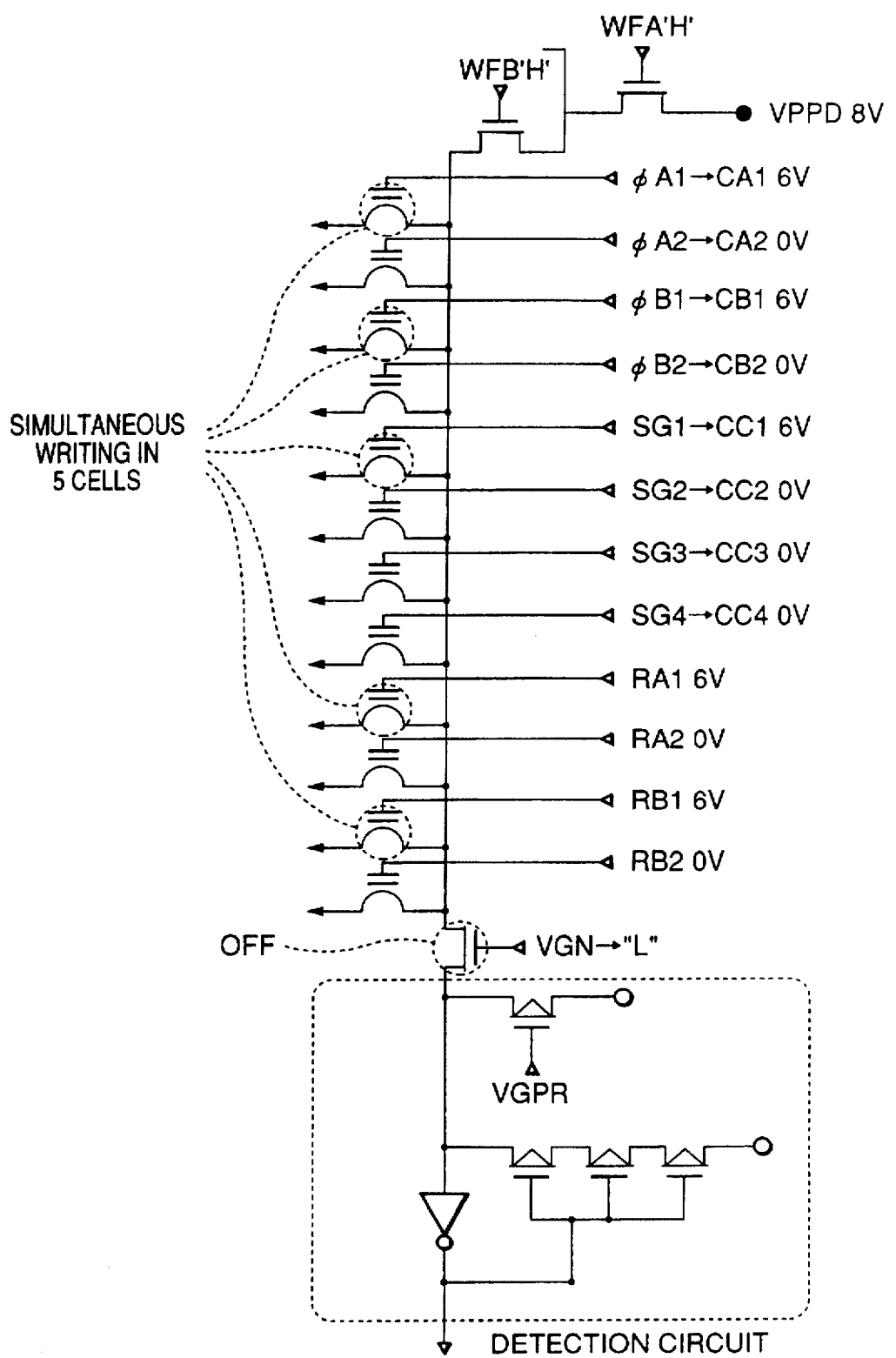
FIG. 31 is a diagram showing the potentials of different signals for a write operation.

FIG. 31 is a diagram showing the potentials of different signals for a write operation.

With the diagram of FIG. 31, data are written into only five cells simultaneously. Since address write recognition signal WA is at level "H", VGN is brought to level "L" and the potential of VPPD is not detected by the detection circuit. All the addresses to be relieved are stored by following the sequence of FIG. 29.

Now, an address check operation will be described below.

Figure 33:
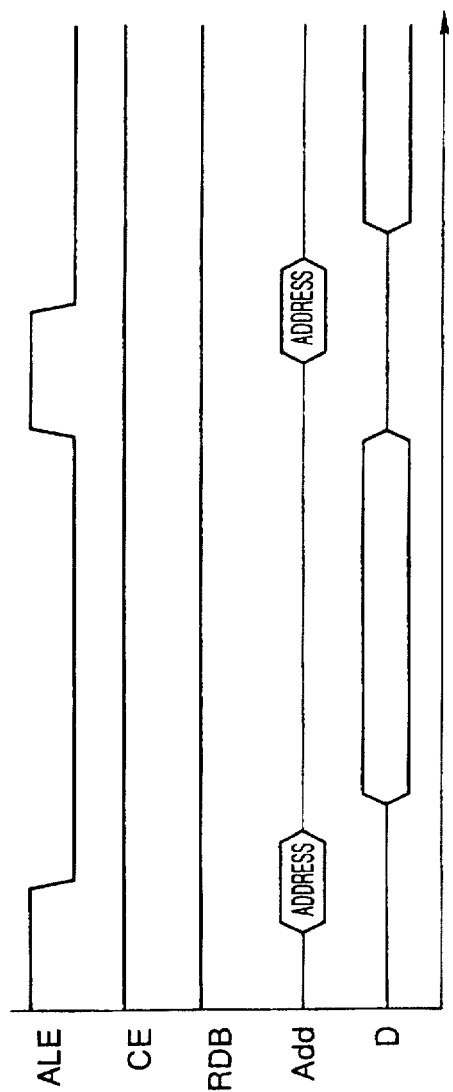
FIG. 33 is a graph showing the address check sequence.

FIG. 33 illustrate the sequence of an address check operation. Like an address write operation, address check signal WCAC is brought to level "H" when a potential is applied to the pad of the mode signal detection circuit of FIG. 30.

As shown in Table 8 above, VDD is applied to VPPG1, VPPG2 and VPPD.

Then, the addresses of the memory cells to be relieved that are stored in advance are latched at the rising edge of an address latch enable signal.

Figure 34A:
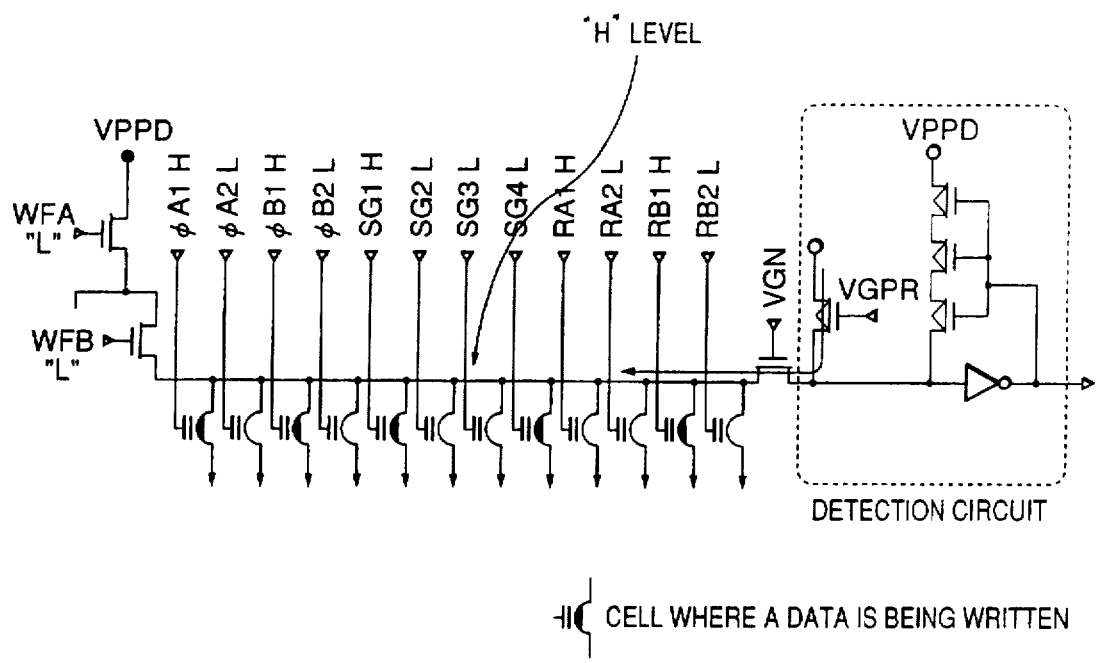
FIGS. 34A and 34B are illustrations showing an address detecting operation.
Figure 34B:
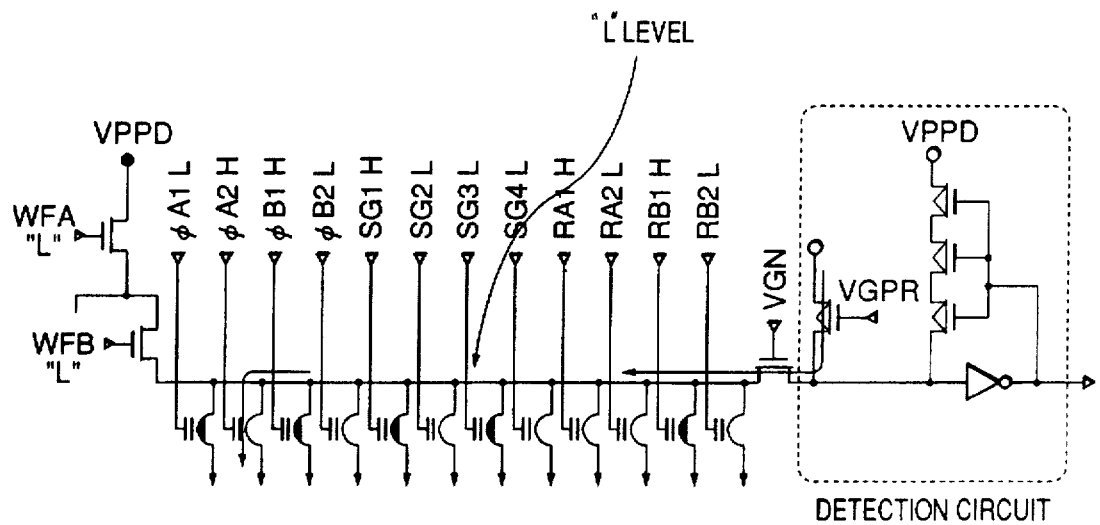

FIGS. 34A and 34B illustrate an address detecting operation. As shown in FIGS. 34A and 34B, as a result of the latch, the output of the predecoder is entered into the address memory cell group.

Figure 35A:
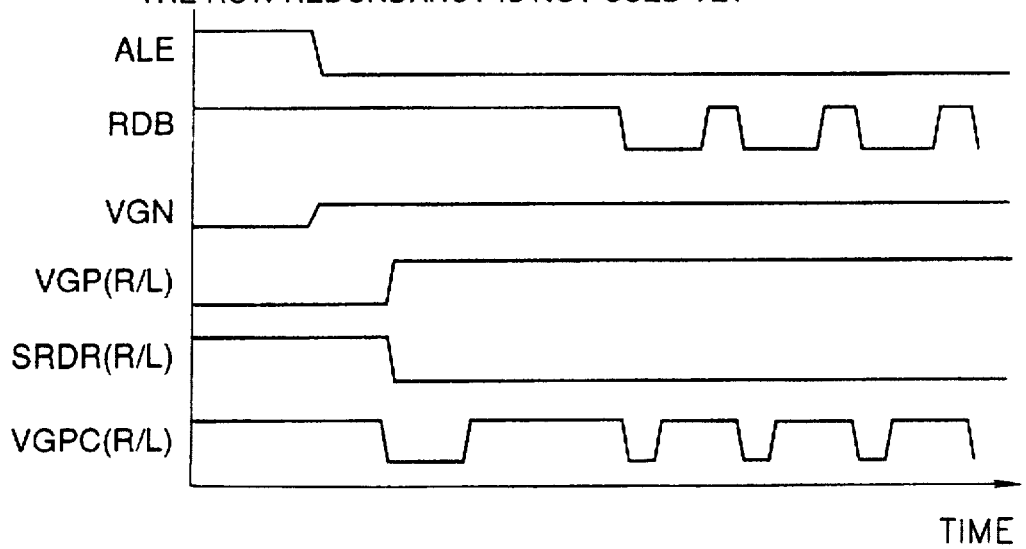
FIGS. 35A and 35B are illustrations showing the sequence of operation of the redundancy control circuit.
Figure 35B:
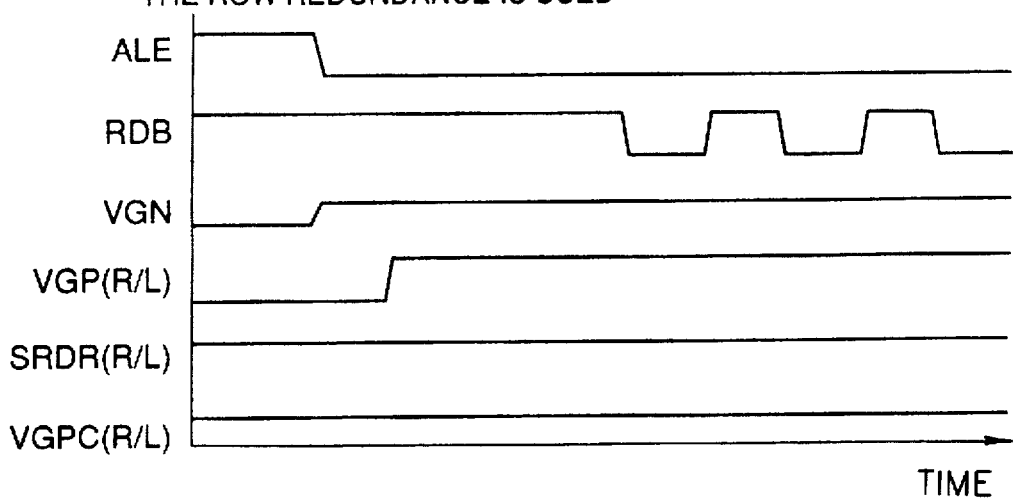

FIGS. 35A and 35B illustrate the sequence of operation of the redundancy control circuit.

Figure 32:
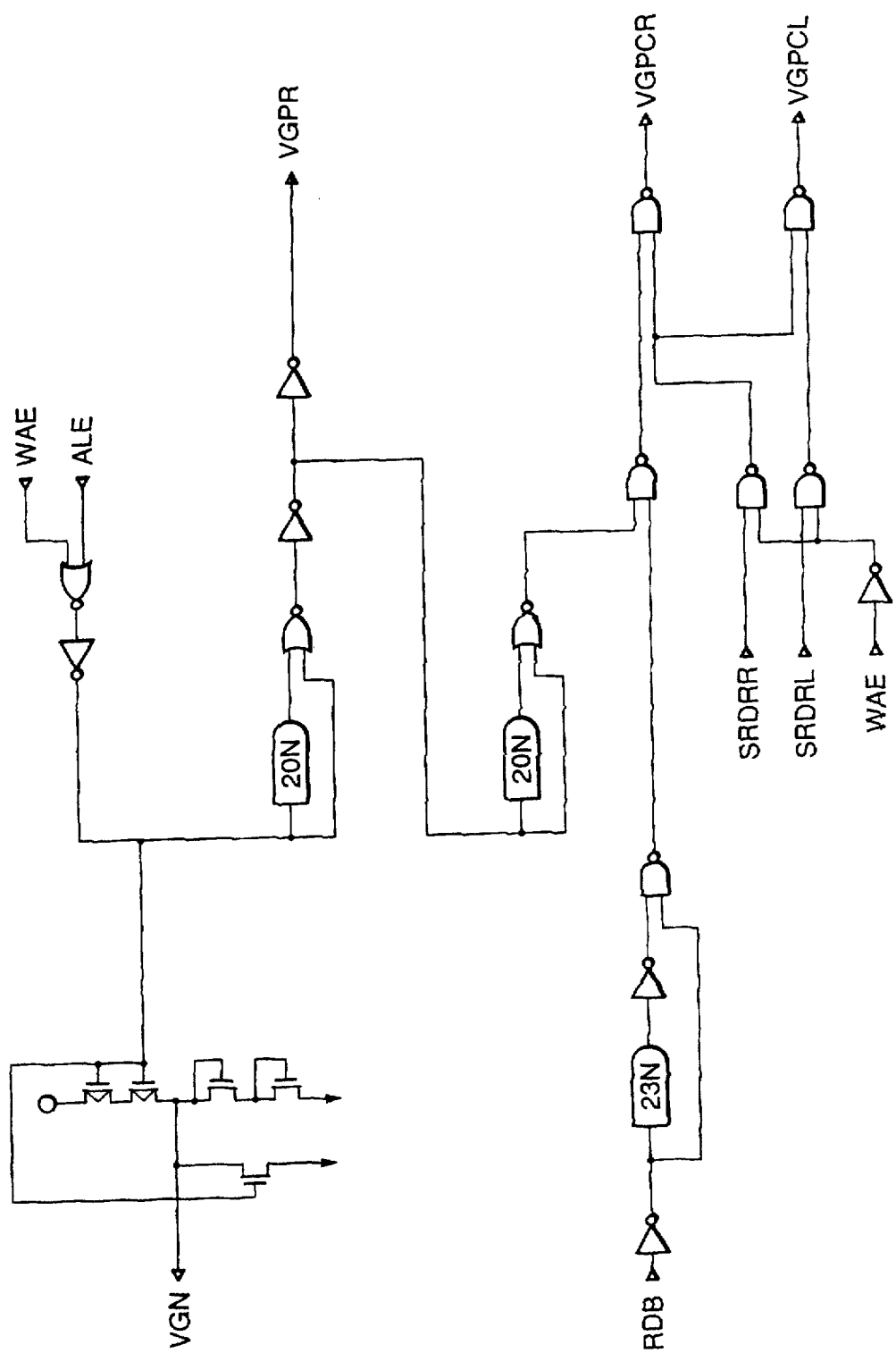
FIG. 32 is a circuit diagram of a redundancy control circuit that can be used for the purpose of the invention.

Referring to FIG. 32 showing a circuit diagram of a redundancy control circuit that can be used for the above embodiment, VGN is brought to an intermediary potential when ALE is put to level "L". To begin with, a row redundancy condition is detected. FIGS. 34A and 34B illustrate this operation. Since VGPR is at level "L", the drain commonly connected to the memory cells for storing addresses is precharged. Assume that lines φA1, φB1, SG1, RA1 and RB1 are subjected to a write operation. If φBA1, φB1, SG1, RA1 and RB1 are at level "H" and all the remaining lines are at level "L", no electric current flows from any PROM so that the potential of the common drain is brought to level "H".

If, on the other hand, different addresses are entered and φA2 is at level "H", while φA1 is at level "L", then the PROM using φA2 as gate has a low threshold value and hence an electric current is allowed to flow to bring the potential of the common drain to level "L". Additionally, any PROM where a write operation is not satisfactorily carried out is also turned on to allow an electric current to flow so that consequently the common drain is brought to level "L".

If VGPR is brought from level "L" up to level "H", the precharge is stopped and the output signals are brought to level "L" if the common drain is at level "H", whereas they are brought to level "H" if the common drain is at level "L".

The output is then given to the NAND circuit whose block diagram is shown in FIGS. 13A and 13B. If all the output signals are at level "H", or the addresses written into the cells for storing row addresses do not agree with the input addresses, or the threshold value for the PROM written into the memory cell for storing addresses is not sufficiently brought to level "H", the output signal SRDRR/L is brought to level "L".

Since the signal is then entered into the redundancy control circuit of FIG. 32 to bring VGPCR/L to level "L", it starts detecting a block (column) redundancy state. The method used for the detection is same as the one used for detecting a row redundancy state.

If, on the other hand, the addresses written into the cells for storing row addresses agree with the input addresses, the output signal SRDRR/L is brought to level "H". If the signal is entered into the redundancy control circuit of FIG. 32, VGPCR/L does not go to level "L" and no detection occurs for a block redundancy state.

The operation of detecting a row redundancy state and a block redundancy state proceeds in a manner as described above. As for output signals, if a redundancy detection is carried out by passing through the logic circuit of FIGS. 13A and 13B, the output of the logic circuit, SRDER/L, is brought to level "H". If, on the other hand, a redundancy detection is not carried out, SRDER/L is brought to level "L".

The symbol R/L appended to SRDE is designed to relieve the memory cells of the main memory cell array disposed to the left (I/01, I/02) and those of the main memory cell array disposed to the right (I/03, I/04) relative to the row decoder (by means of redundancy memory cells).

Thus, it will be seen that a write operation is carried out when input addresses same as the addresses stored in the memory cells for storing addresses are entered and SRDER/L is at level "L", whereas no write operation is carried out when SRDER/L is at level "H".

Data are written into the main memory cell arrays in a manner as described below.

Figure 36:
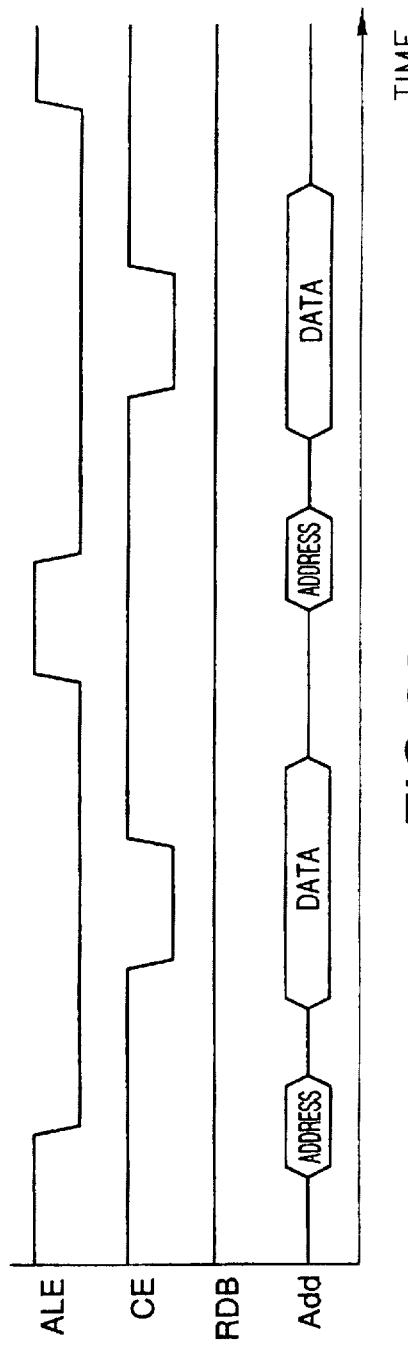
FIG. 36 is a timing chart to be used for writing data for the purpose of the invention.

FIG. 36 is a timing chart to be used for writing data in the above embodiment.

As in the case of the operation of writing addresses, data write signal WCE is brought to level "H" by applying a predetermined potential to each of the pads A through C of the mode signal detection circuits of FIGS. 30A through 30C.

As shown in Table 8 above, 3V, 6V, 8V and 3V are applied respectively to VPPG1, VPPG2, VPPD and VDD.

Then, the addresses of the memory cells to be relieved that are stored in advance are latched at the falling edge of address latch enable signal ALE and, as they agree with the addresses stored by the address write operation, signal SRDE is brought to level "L" by following the operational sequence for address check.

As shown in FIGS. 13A and 13B, each of the redundancy memory cell arrays is provided with two address memory circuits arranged adjacently relative to the memory cell array, one for rows and one for columns. The output of each of the address memory circuits for rows and columns is then given to the NAND circuit of FIGS. 13A and 13B. The output of the NAND circuit, RWi, is at level "L" when both of the outputs of the two address memory circuits are at level "H", or when the addresses stored in the address memory cells do not agree with the input addresses. On the other hand, RW is at level "H" when the output of either the address memory circuit for rows or the address memory circuit for columns is at level "L", or when the redundancy memory cell arrays are used.

Signal RW is then entered into the redundancy memory cell control gate control circuit as shown in FIG. 23 and one of the control gates is brought to level "H" by signals CCiL/R and SGU/D. Additionally, since the redundancy memory cell control gate control circuit is provided with a level shifter as shown in FIG. 27, the control gate at level "H" is used for VPPG2.

The operation of selecting a column is carried out for redundancy memory cells as in the case of the column selecting operation for main memory cells.

Figure 37:
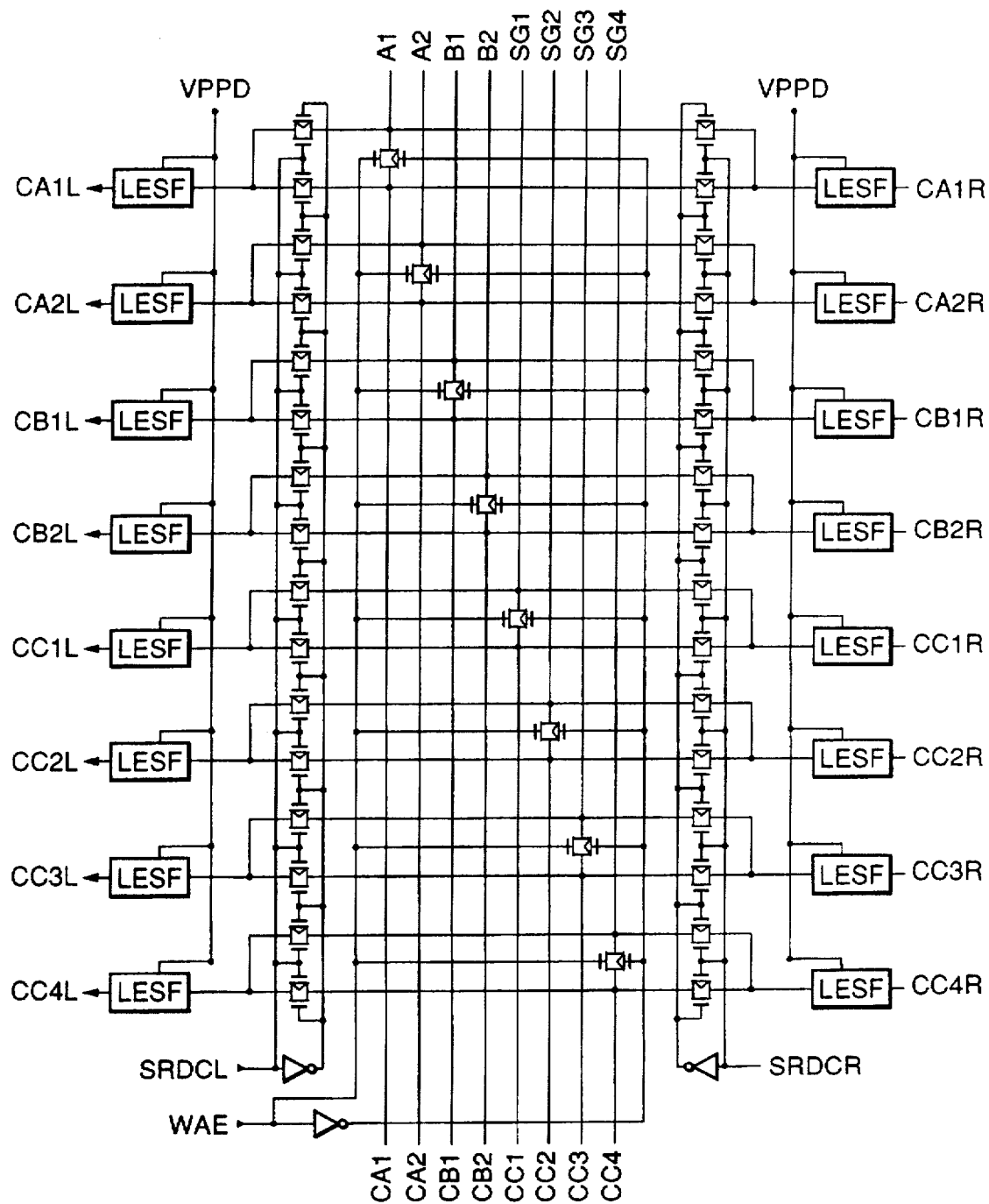
FIG. 37 is a circuit diagram of the column preaddress conversion circuits 64 and 64' in FIGS. 13A and 13B.

FIG. 37 is a circuit diagram of the column preaddress conversion circuits 64 and 64' in FIGS. 13A and 13B.

For the normal read operation and for the operation of reading data from row redundancy cells, output signals CA, CB and CC are produced from the column predecoder because signal SRDCR/L is at level "L".

For the operation of reading data from block redundancy cells, on the other hand, output signals φA, φB and SG are produced because signal SRDCR/L is at level "H". Then, output signals CAiR/L and CBiR/L are entered into the column selection switch and CCiR/L is entered into the control gate selection circuit to select memory cells in the column direction.

The column preaddress conversion circuit is also provided at the output with a level shifter as shown in FIG. 27 and the output with level "H" is used for write potential VPPD. Thus, redundancy memory cells are selected with the above described column selecting operation.

As shown in the timing chart of FIG. 36, the data for the memory cell to be relieved is obtained at the address pin after entering the address.

If CE is brought to level "L" and the data ADi given earlier is at level "H", CL1 is made to go to VPP by the write circuit 78 shown in FIG. 22 and the drain of a redundancy memory cell is also made to go to VPP by the column selection switch 76 for write operation. If ADi is at level "L", no write operation occurs because VPP is not applied to the drain of the redundancy memory cell. A predetermined data is written in the redundancy memory cell in this way.

Then, an operation of verifying the data written into the redundancy memory cell is carried out and a rewrite operation is repeated until it is properly written into the memory cell.

When the data is read out of the redundancy memory cell, the address of the cell is given to access the memory cell in the redundancy memory cell array and, at the same time, -the address memory circuit detects the address.

This method is same as the one described for address check. A redundancy operation mode is automatically selected to select a redundancy memory cell. The method of selecting a data cell is same as the one described above for selecting a memory cell to write a data therein.

However, note that, while a column line is connected to VPP for writing data, a column line is connected to the sense amplifier for reading data.

The time required for the operation of selecting a memory cell is longer for the redundancy memory cell array than for the main memory cell array. However, the time for reading a data from a redundancy memory cell can be prevented from becoming too long by reducing the time for accessing a redundancy memory cell.

Figure 38A:
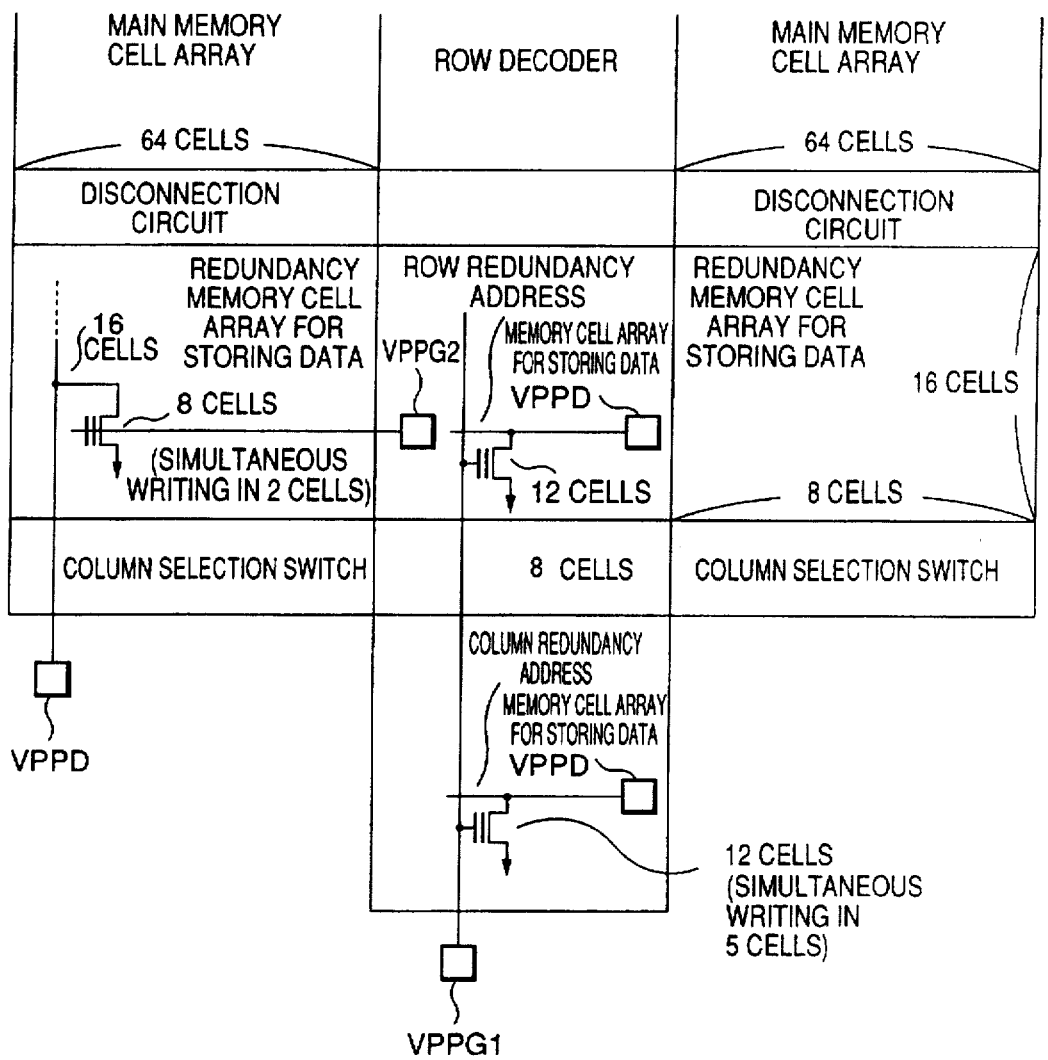
FIGS. 38A and 38B are illustrations showing the power sources to be used for a semiconductor memory according to the invention.
Figure 38B:
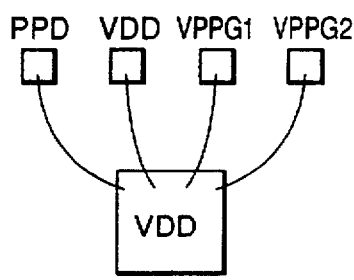

After the verifying operation is over, the pads for VPPG1, VPPG2, VPPD and VDD are connected to the single VDD pad by means of bonding wires so that only VDD is applied to the VDD pad for normal operation as shown in FIGS. 38A and 38B.

Figure 39A:
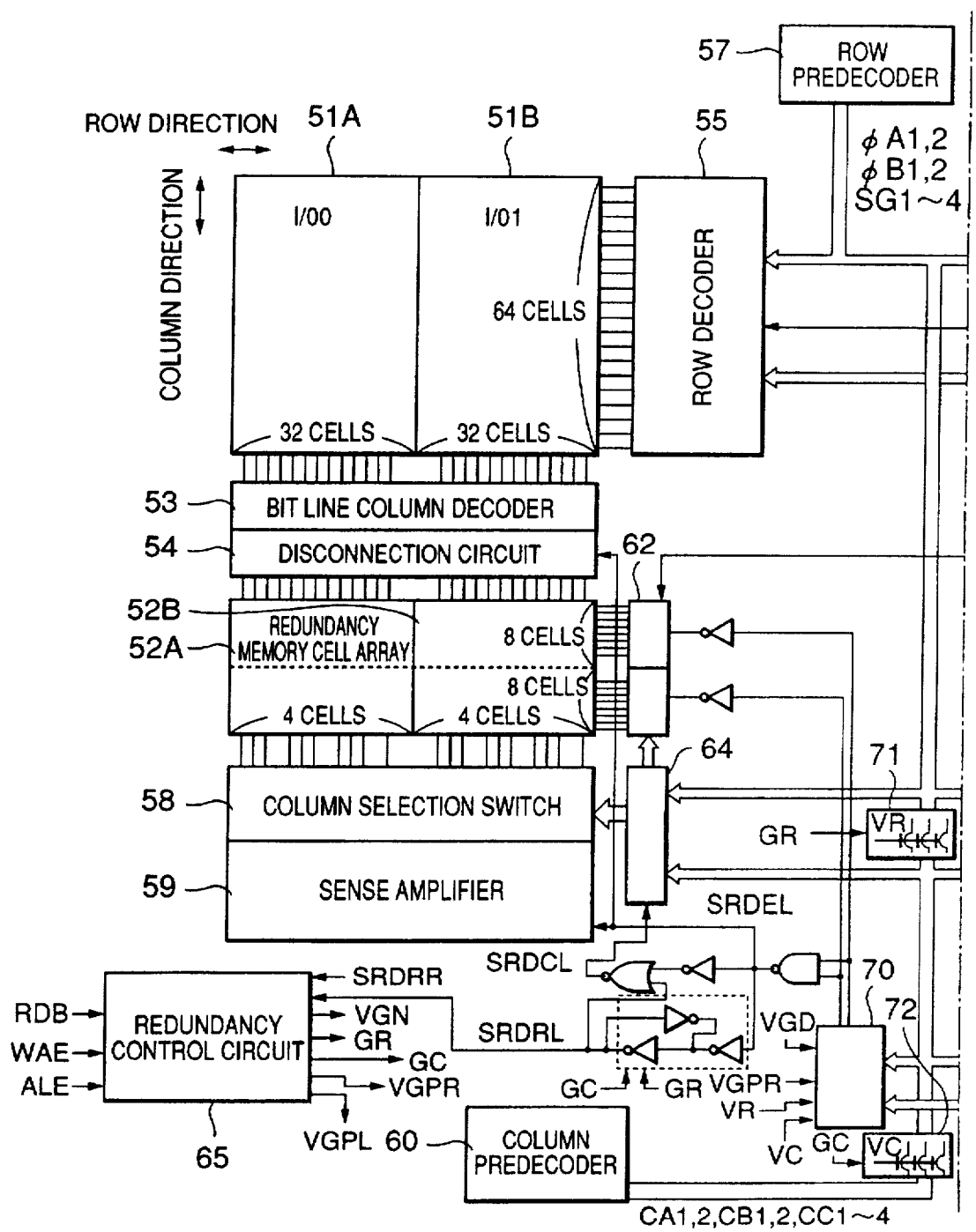
FIGS. 39A and 39B are block diagrams of another embodiment of semiconductor memory according to the invention.
Figure 39B:
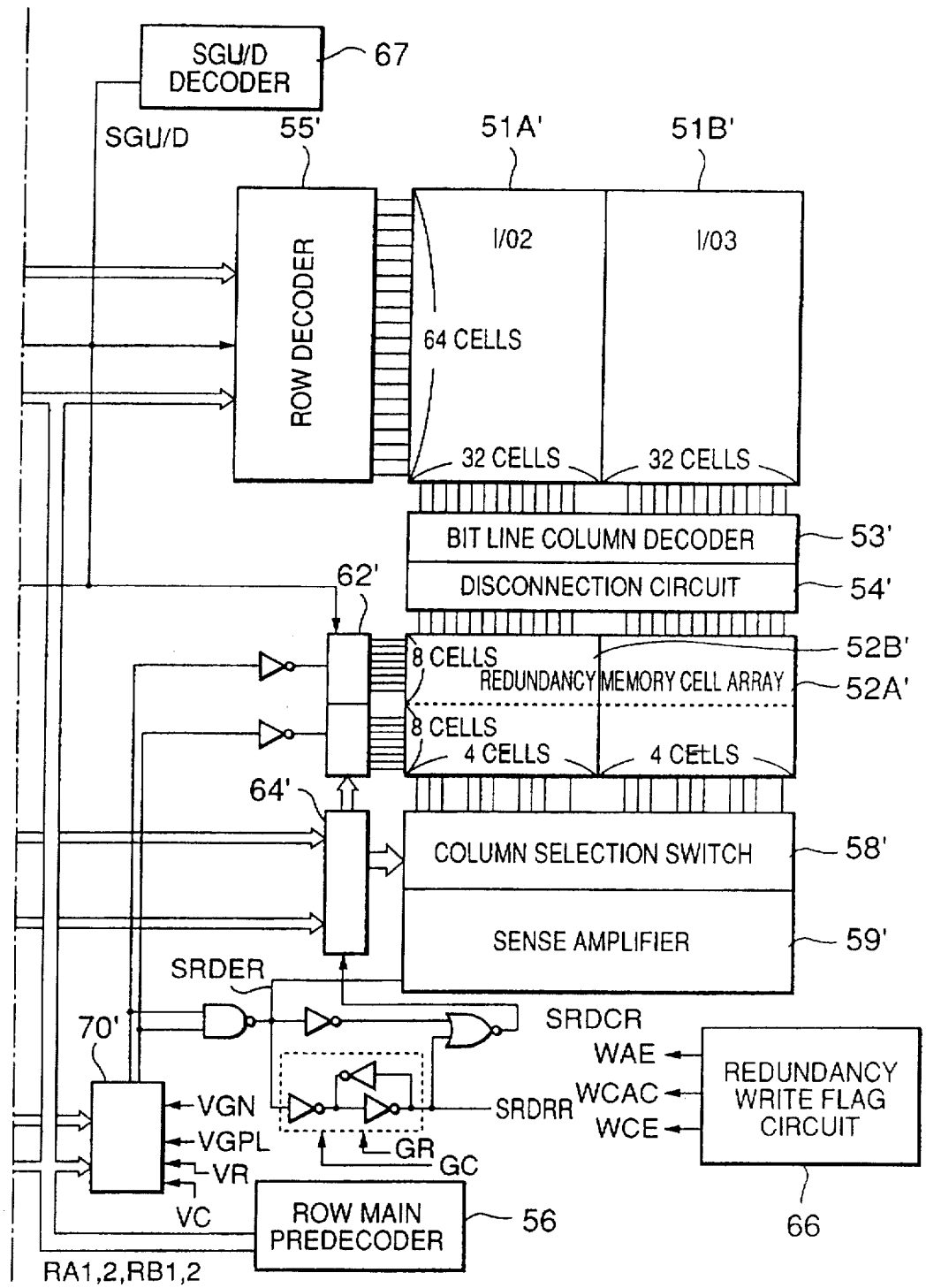

FIGS. 39A and 39B are block diagrams of still another embodiment of semiconductor memory according to the invention.

This embodiment is applicable to mask ROMs. In order to simplify the following description, assume that main memory cell arrays having thirty two cells in the row direction and sixty four cells in the column direction are used along with four I/O terminals.

Firstly, the configuration of the embodiment of semiconductor memory will be described.

This embodiment differs from the above described embodiment in that the row address memory circuit and the column address memory circuit of the above embodiment are put together to form a single address memory circuit and the row predecoder and the column predecoder are connected with each other by way of a disconnection circuit.

The main memory cell arrays 51A, 51B, 51A' and 51B' of the embodiment comprise a plurality of MOS transistors having different threshold values depending on if a data is stored there or not. Similarly, the redundancy memory cell arrays 52A, 52B, 52A' and 52B' of the embodiment comprise a plurality of PROMs having different threshold values depending on if a data is stored there or not. With such an arrangement, the main memory cell arrays and the redundancy memory cell arrays can share column lines and column selection switches so that the main and redundancy memory cell arrays can be brought close to each other to reduce the size of the semiconductor chip.

Since the main memory cells comprise MOS transistors and the redundancy memory cells comprise PROMs that are dimensionally different from the ROM transistors, the dimension of the PROMs in the row direction may well be made $2^n$ times as large as that of the main memory cells.

Thus, in this embodiment, if the dimension of the PROMs in the row direction is made eight times as large as that of the main memory cells and thirty two cells are arranged per row of the main memory cell arrays, the pitch of the columns of the redundancy memory cell arrays will be eight times as high as that of the columns of the main memory cell arrays when four cells are arranged per row of the redundancy memory cell arrays so that the redundancy memory cell arrays will have a width equal to that of the main memory cell arrays in the row direction.

Bit line column selection switches 53 and 53' and disconnection circuits 54 and 54' are arranged between the main memory cell arrays 51A, 51B, 51A' and 51B' and the redundancy memory cell arrays 52A, 52B, 52A' and 52B'.

The bit line column selection switches 53 and 53' are designed to reduce the number of columns of the main memory cell arrays 51A, 51B, 51A' and 51B' before connect them to the redundancy memory cell arrays 52A, 52B, 52A' and 52B' because the number of columns of the main memory cell arrays 51A, 51B, 51A' and 51B' are much larger than that of the redundancy memory cell arrays 52A, 52B, 52A' and 52B'.

Disconnection circuits 54 and 54' disconnect column lines between the main memory cell arrays and the redundancy memory cell arrays when data are written into or read out of memory cells of the redundancy memory cell arrays 52A, 52B, 52A' and 52B'.

Row decoders 55 and 55' select a word line of the main memory cell arrays 51A, 51B, 51A' and 51B' according to the output signals of row main predecoder 56 and row predecoder 57.

Column selection switch 58 selects a column line according to the output signal of column predecoder 60. Sense amplifier 59 amplifies the data read out of the main memory cell arrays or the redundancy memory cell arrays. The data of the sense amplifier 59 is produced to the outside by way of an output circuit.

Address memory circuits 70 and 70' store a signal for selecting a defective row or a defective block of the main memory cell arrays, compare the signal with the output signals of the row main predecoder 56 and the row predecoder 57 or the row main predecoder 56 and the column predecoder 60 and produces an output signal with level "L" if they agree with each other.

Selection circuits 62 and 62' select one of a plurality of control gates of the redundancy memory cell arrays according to the output signals of the address memory circuits 70 and 60'.

Address conversion circuits 64 and 64' select one of the plurality of control gates of the redundancy memory cell arrays according to the output signals of the address memory circuits 70 and 70' and controls the column selection switch 58 according to the output signal of the row predecoders 57 and 57'.

Disconnection circuits 71 and 72 are turned on or off according to if any of the main memory cell arrays is replaced either in the row direction or in the column direction, if a data is written into a redundancy memory cell or not, if a data is read out of a main memory cell array or not or if a data is read out of a redundancy memory cell array.

Redundancy control circuit 65, redundancy write flag circuit 66 and SGV/D decoder 67 generate given control signals and feed them to predetermined circuits.

Figure 40:
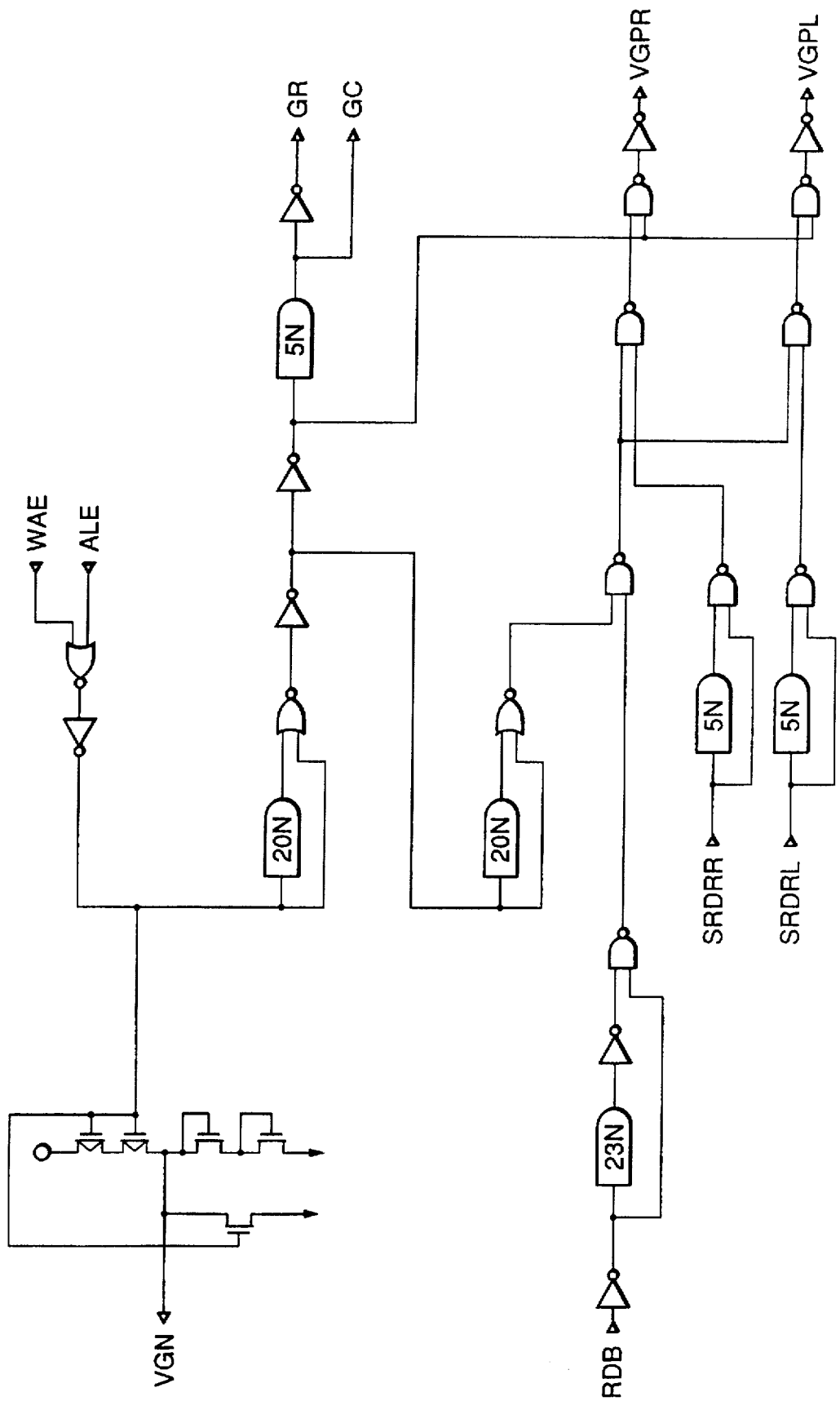
FIG. 40 is a circuit diagram of the redundancy control circuit of the above embodiment.
Figure 41:
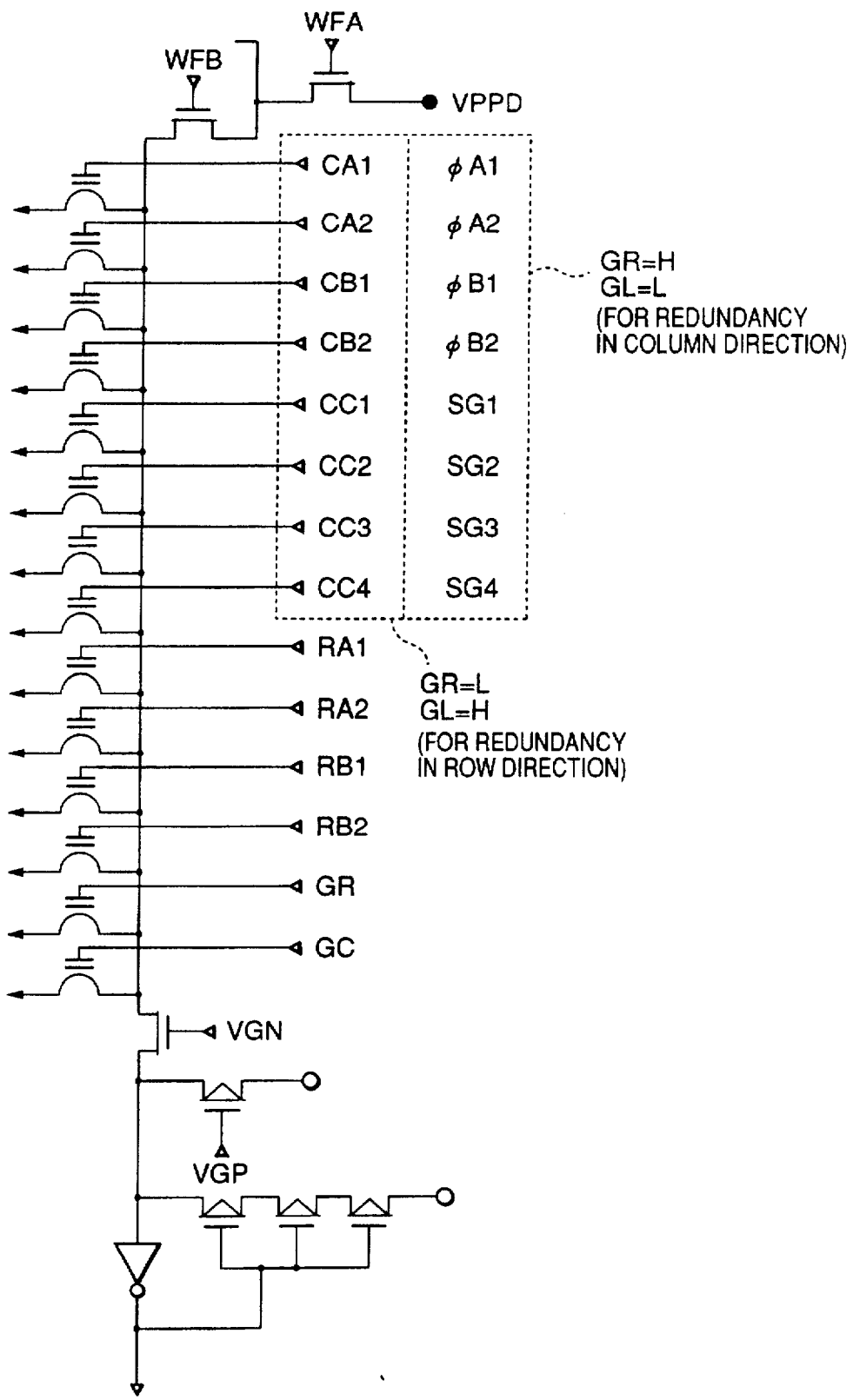
FIG. 41 is a graph showing the read sequence of the address memory circuit of the above embodiment.

FIG. 40 is a circuit diagram of the redundancy control circuit of the embodiment and FIG. 41 is a graph showing the read sequence of the address memory circuit of the embodiment.

This embodiment differs from the preceding embodiment in that the row address memory circuit and the column address memory circuit of the preceding embodiment are put together to form a single address memory circuit in this embodiment and a disconnection circuit is arranged in order to selectively feeding the address memory circuit with the output signal of the row predecoder and the output signal of the column predecoder.

The address sensing technique used in this embodiment will be described below.

Figure 42A:
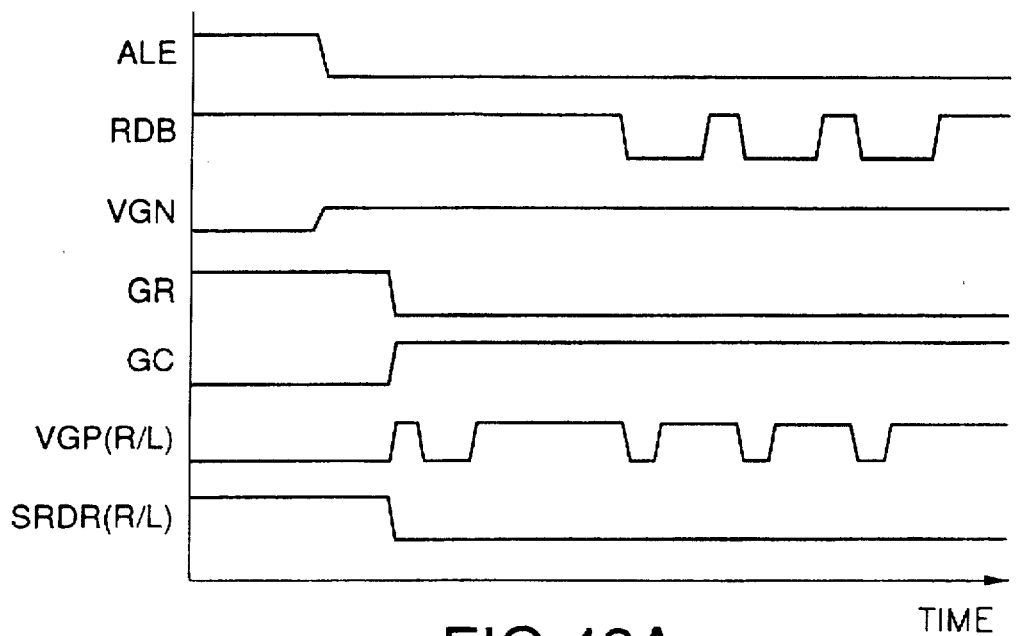
FIGS. 42A and 42B are graphs showing the address sensing sequence of the address memory circuit of the above embodiment.
Figure 42B:
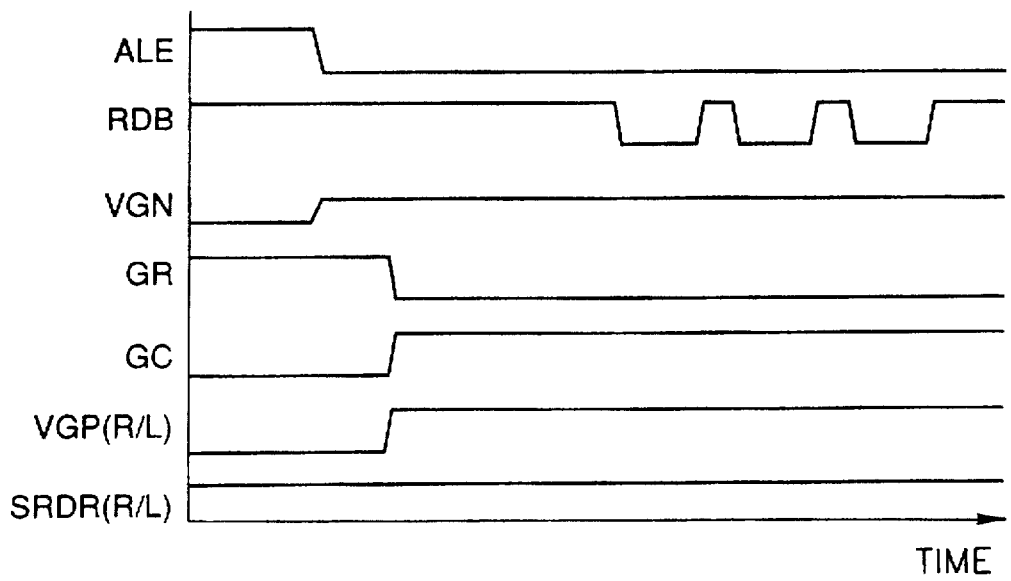

FIGS. 42A and 42B show graphs illustrating the address sensing sequence of this embodiment. Referring to FIGS. 42A and 42B, after ALE is brought from level "H" down to level "L", VGN is put to an intermediary potential and VGRR/L is brought to level "L" to detect a cell for storing an address. Since GR is at level "H" and CG is at level "L", the cell for storing an address stores the address for a relief operation in the row direction. Thus, a memory cell will be detected in the row direction.

If the operation is in a row redundancy mode, the signal of SRDRR/L remains at level "H" and, therefore, VGPR/L is held to level "H" by the circuit of FIG. 40 so that no block redundancy detection will take place.

If, on the other hand, the operation is not in a row redundancy mode, the signal of SRDRR/L goes to level "L" so that a block redundancy detection will be carried out by the circuit of FIG. 40. Then, since GR goes from level "L" to level "H", the cell for storing an address actually stores the address for a relief operation in the column direction. Thus, a memory cell relief operation will be conducted in the column direction.

The cell for storing an address in FIG. 41 differs from the one in FIG. 25 in that it comprises PROMs for receiving the signals of GR and GC at the gates in order to discriminate the row and the block.

The redundancy memory cell arrays are arranged at locations close to the ends of the main memory cell arrays along the column direction and the main memory cell arrays and the redundancy memory cell arrays share a common column selection switch in the above described embodiments.

However, the main memory cell arrays and the redundancy memory cell arrays may be arranged away from each other and have respective column selection switches independently as in the case of the embodiment that will be described below.

Figure 43:
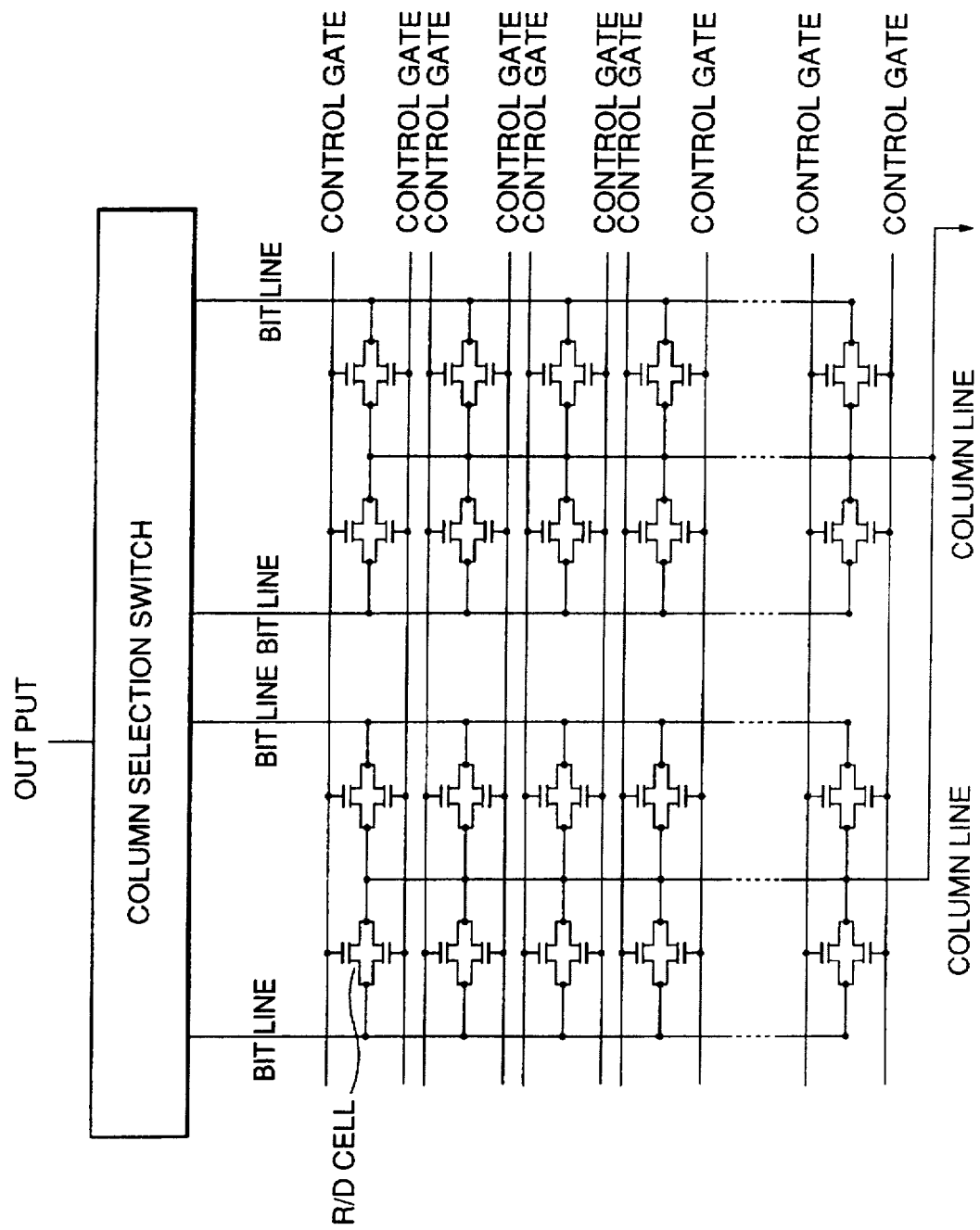
FIG. 43 is a circuit diagram of part of the above embodiment.

In this embodiment, the main memory cell arrays and the redundancy memory cell arrays are provided with respective column selection switches. As shown in FIG. 43, the decoder for selecting a redundancy memory cell is only required to select a bit line to be connected to the source of the redundancy memory cell. It is not necessary to decode the column lines, which may be connected to a common grounding terminal VSS.

Thus, no resistance intervenes the source of the redundancy memory cell to improve the efficiency of the write operation and reduce the time required for it. Additionally, each cell does not have to be provided with a column line and a pair of cells can share a common column line so that the length of the redundancy memory cell arrays can be reduced in the column direction. Additionally, since an independent column gate is provided in place of a column gate that requires a rewrite operation for each I/O, the redundancy memory cell arrays can be used with a single I/O to increase the number of relievable cells.

Figure 44A:
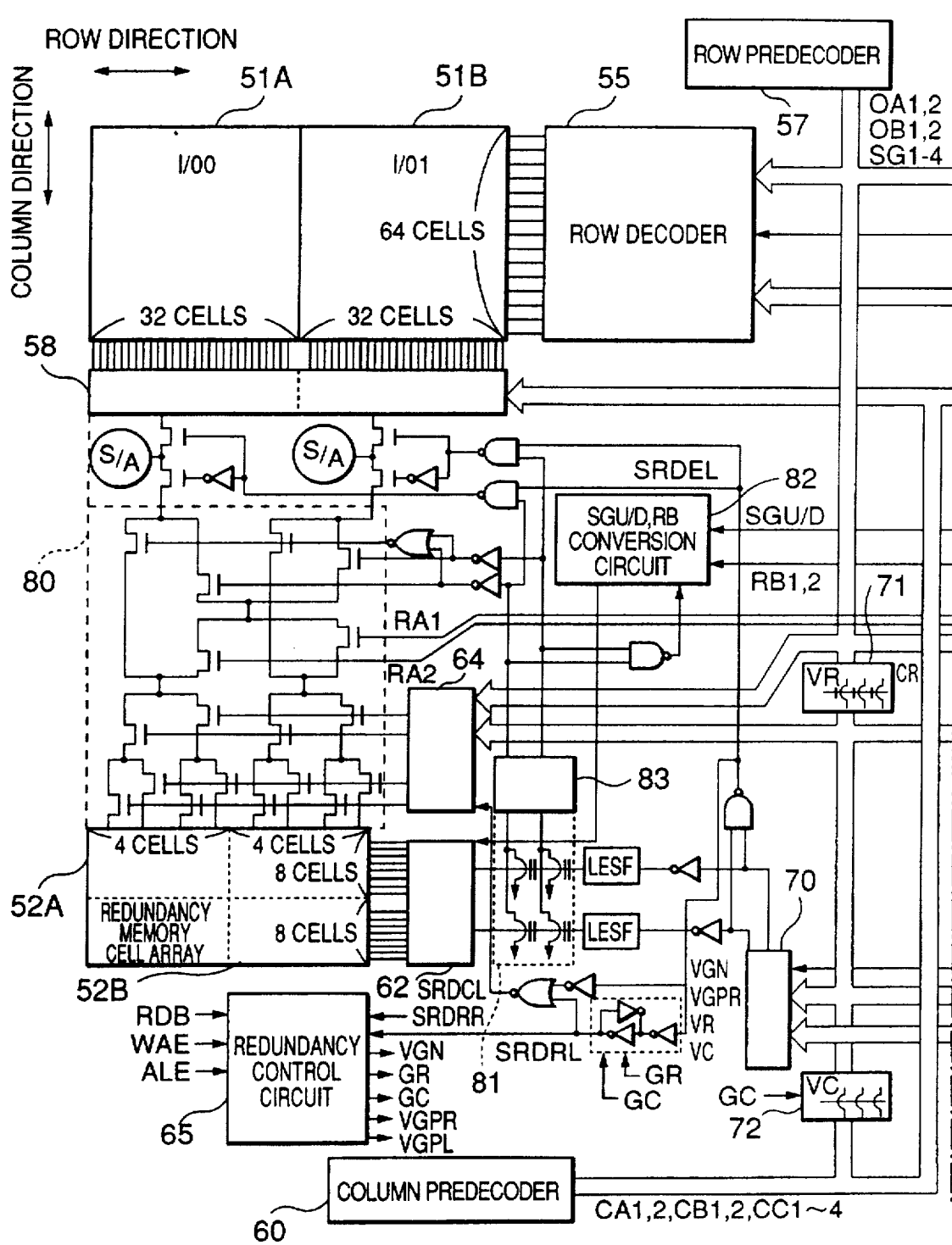
FIGS. 44A and 44B are block diagrams of a still another embodiment of semiconductor memory according to the invention.
Figure 44B:
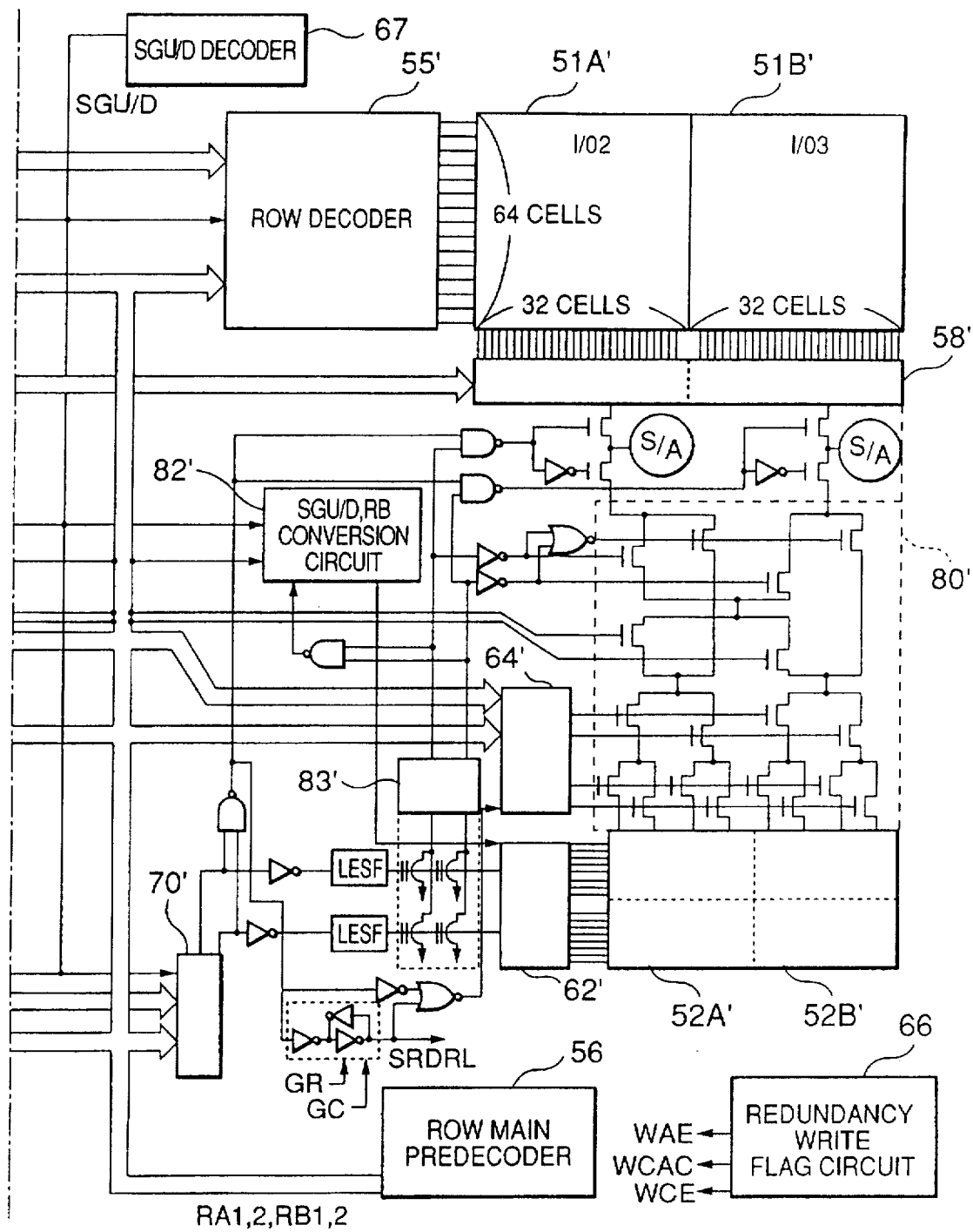

FIGS. 44A and 44B are block diagrams of a still another embodiment of semiconductor memory according to the invention.

In this embodiment, the redundancy memory cell arrays can be used for relief operations in terms of row, block and column. As in the case of the preceding embodiment, the address memory circuit is used for both row addresses and column addresses.

A row relief operation is conducted on a word line (sixty four cells) basis and a block relief operation is conducted for two cells in the row direction and sixteen cells in the column direction, whereas a column relief operation is carried on for a single cell in the row direction and sixty four cells in the column direction.

In this embodiment, there are provided two redundancy memory cell arrays for I/O0 and I/O1 and two redundancy memory cell arrays for I/O2 and I/O3. Additionally, it differs from the preceding embodiment in that no disconnection circuit is arranged between the main memory cell arrays and the redundancy memory cell arrays and they are switched in a redundancy mode by means of a transistor arranged upstream relative to the sense amplifier.

The method used for sensing an address in this embodiment is same as the one used for the above embodiment that comprises a common address memory circuit so that a column redundancy check operation is conducted simultaneously with a block redundancy check operation. The operational sequence is same as the one illustrated in FIGS. 42A and 42B.

Figure 45:
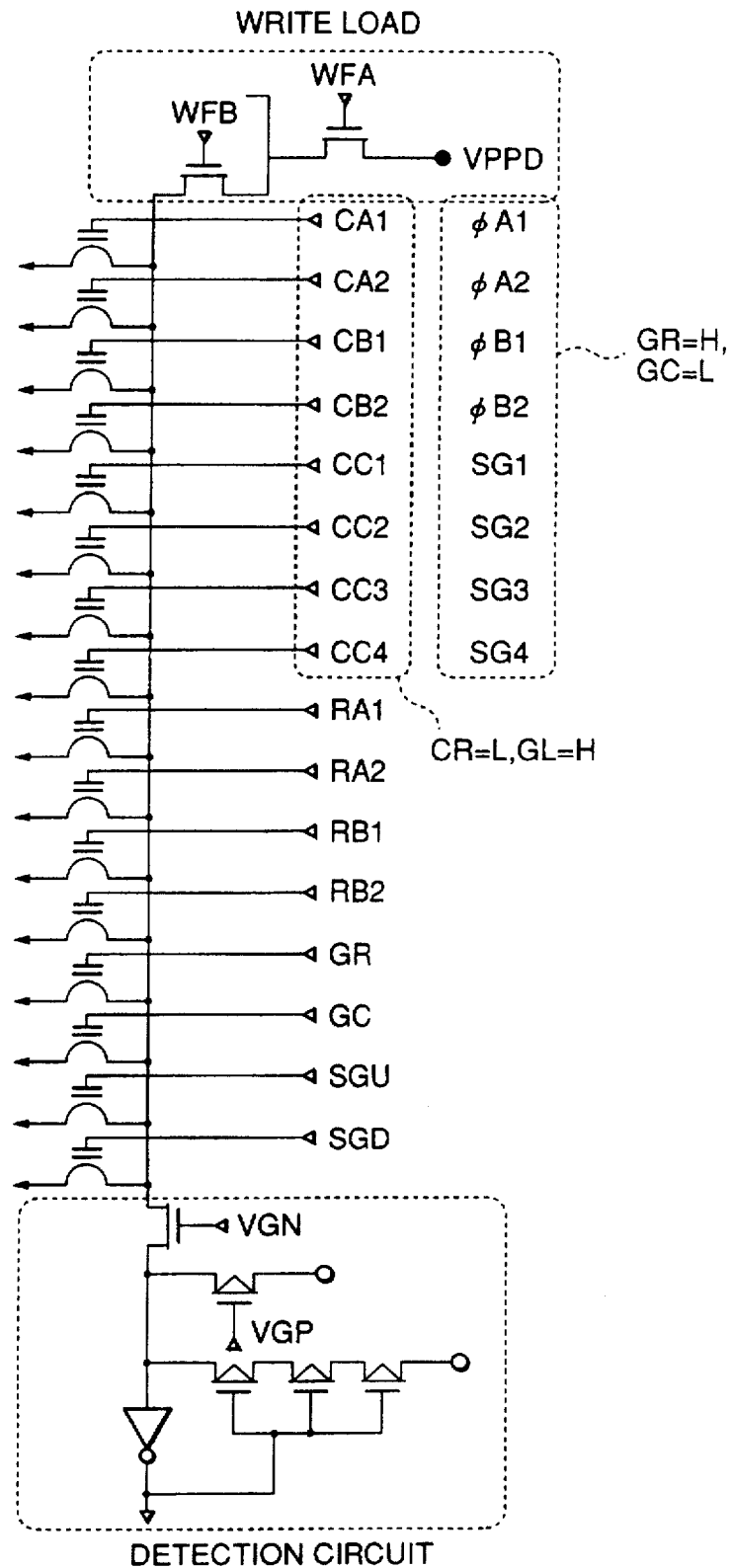
FIG. 45 is a circuit diagram of the address memory circuit of the above embodiment.
Figure 46:
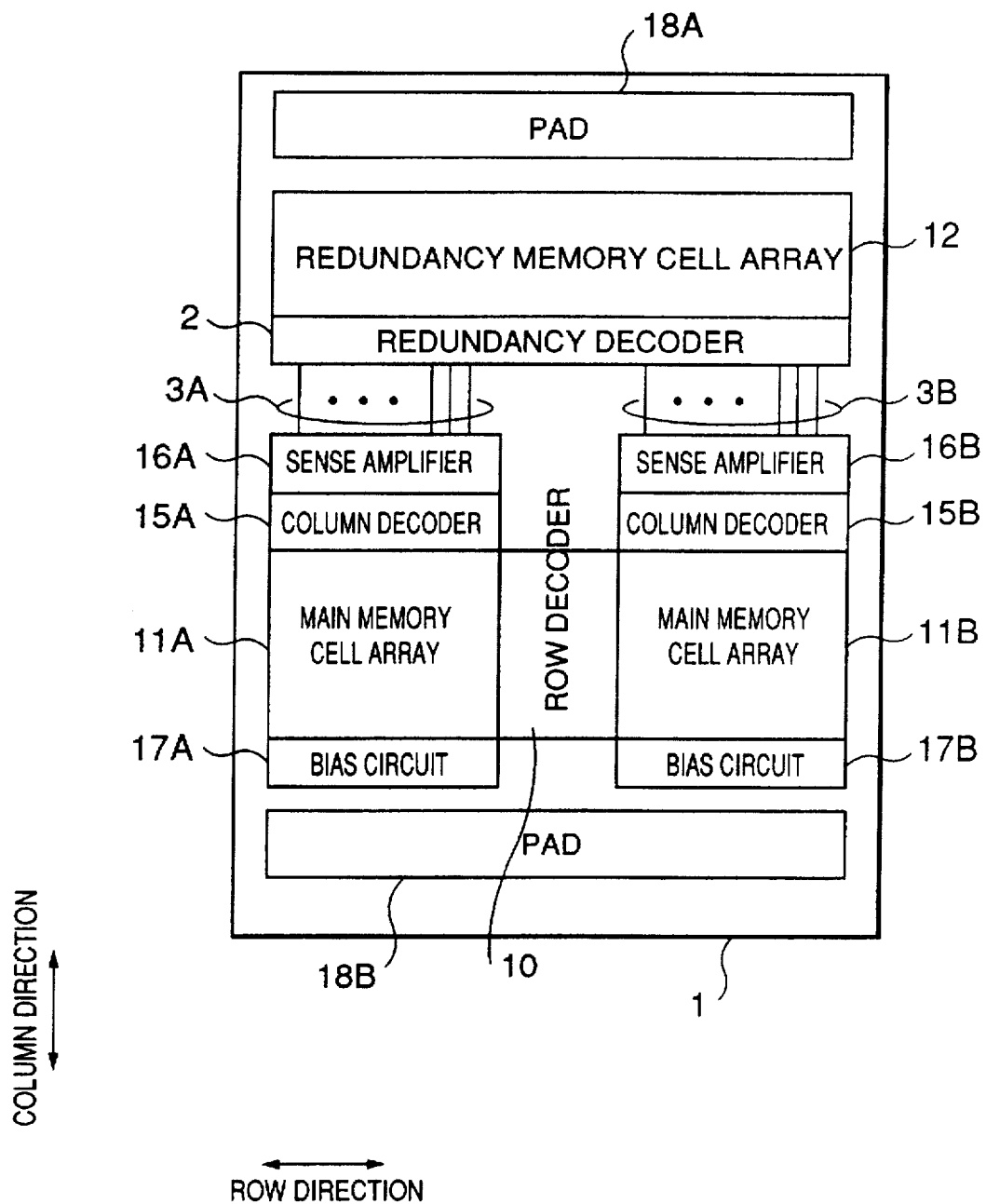
FIG. 46 schematically illustrates the floor plan of a known semiconductor memory.

As shown in FIG. 45, the number of cells for storing addresses is increased by two in order to discriminate two cells adjacently located in the column direction for a column relief operation. Both of these two cells are used for storing an address for a row or block relief operation because they are selected without using SGU and SGD. All the signals for main memory cell arrays, RA1, RA2, RB1 and RB2 are stored for a column relief operation because they are selected without using main memory cells.

For a row or block relief operation, the outputs of the redundancy memory cell arrays do not have to be allocated to the I/O sense amplifiers because the left or right side memory cell array is totally replaced as in the case of the preceding embodiments.

For a column relief operation, the use of I/O storing cells 81 and 81' and detection circuits 83 and 83' as shown in FIGS. 44A and 44B are required because the output of the redundancy memory cell array is connected to a sense amplifier.

For a row or block relief operation, no data is stored in the I/O storing cell 81. For a column relief operation, a data is stored in the I/O storing cell 81. A column relief operation is effected when the output of the I/O storing cell 81 is at level "L".

Signal SGU/D is entered into the selection circuits 62 and 62' for a row or block relief operation. Signal SGU/D is entered into SGU/D, RB conversion circuits 82 and 82'. The SGU/D, RB conversion circuits 82 and 82' produces signal SGU/D or signals RB1 and RB2.

As in the case of the embodiment comprising a common column gate, the signal of the column predecoder is entered into the column gates 80 and 80' of the redundancy memory cell arrays for relieving and the signal of the row predecoder is entered into the column gates 80 and 80' for relieving a block or a column.

While the above embodiments are described in terms of mask ROM, they may be used also as redundancy circuits for EPROM, EEPROM and DRAM.

As described above, a semiconductor memory according to the invention has the advantages summarized below.

Firstly, if a redundancy memory cell array is arranged at the end opposite to the main memory cell array in the column direction (or row direction) and a disconnection circuit for disconnecting bit lines and column lines is arranged between the main memory cell array and the redundancy memory cell array, while a column selection switch is arranged adjacently relative to the redundancy memory cell array, a single column selection switch is shared by the main memory cell array and the redundancy memory cell array to allow the use of a chip having a small surface area.

If the redundancy memory cells of mask ROMs are constituted by PROMs having a only one polysilicon layer, the gates of the main memory cells (MOS transistors) and the floating gates of the redundancy memory cells (PROMs) can be formed simultaneously without increasing the number of manufacturing steps, allowing the use of a chip having a small surface area.

Secondly, if a redundancy memory cell array is arranged only at an end of the main memory cell array in the column direction (or row direction) and the output lines of the row predecoder and the column predecoder by way of a group of transistors, the rows or columns of the main memory cell array can be relieved by controlling the transistor group for ON/OFF operations and taking the output of the row predecoder or that of the column predecoder, whichever appropriate, into the address memory circuit.

Thus, a chip having a small surface area can be used if compared with a semiconductor memory comprising redundancy memory cell arrays arranged at an end of the main memory cell array in the row direction and at an end of the main memory cell array in the column direction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:

a main memory cell array;

a row decoder for selecting a row of said main memory cell array according to a first input signal;

a redundancy memory cell array arranged at an end of said main memory cell array in the column direction and sharing common bit lines and common column lines with said main memory cell array;

a disconnection circuit arranged between said main memory cell array and said redundancy memory cell array for connecting the bit lines or the column lines of said main memory cell array to or disconnecting them from the bit lines or the column lines, whichever appropriate, of said redundancy memory cell array;

a column selection switch arranged adjacently relative to said redundancy memory cell array for selecting a column of said main memory cell array according to a second input signal and a column of said redundancy memory cell array according to said first or second input signal; and a redundancy circuit for selecting a row of said redundancy memory cell array according to said first or second input signal and for disconnecting the bit lines or the column lines of said main memory cell array from the bit lines or the columns lines, whichever appropriate, of said redundancy memory cell array by means of said disconnection circuit for the operation of selecting a row of said redundancy memory cell array.

2. A semiconductor memory according to claim 1, wherein said main memory cell array is constituted by mask ROMs adapted to read operations and said redundancy memory cell array is constituted by PROMs having an only one polysilicon layer.

3. A semiconductor memory according to claim 1, wherein each pair of memory cells of said redundancy memory cell array arranged adjacently in the column direction has common source/drain regions.

4. A semiconductor memory according to claim 1, wherein the memory cells of said redundancy memory cell array in a row direction equal in number to the memory cells of said main memory cell array in a row direction, which are multiplied by an integer.

5. A semiconductor memory according to claim 1, wherein said redundancy circuit has a memory section for storing data on a row having a defective memory cell of said main memory cell array;

the bit lines or the column lines of said main memory cell array and the bit lines or the column lines of said redundancy memory cell array being disconnected by said disconnection circuit and a row of said redundancy memory cell array is selected if the row whose data stored in said memory section agrees with the row selected by said first input signal.

6. A semiconductor memory according to claim 1, wherein said redundancy circuit has a memory section for storing data on a column having a defective memory cell of said main memory cell array; and the bit lines or the column lines of said main memory cell array and the bit lines or the column lines of said redundancy memory cell array are disconnected by said disconnection circuit and a row of said redundancy memory cell array is selected if the column whose data stored in said memory section agrees with the column selected by said second input signal;

said first input signal being fed to said column selection switch to select a column of said redundancy memory cell array according to said first input signal.

7. A semiconductor memory according to claim 1, wherein it further comprises signals lines connected to a first group of transistors for feeding said first input signal and signals lines connected to a second group of transistors for feeding said second input signal;

said column selection switch being connected between said first and second groups of transistors;

said first or second input signal being fed to said column selection switch by controlling said first and second groups of transistors for ON/OFF operations.

8. A semiconductor memory according to claim 1, wherein said redundancy circuit includes a memory section for storing data on a column having a defective memory cell of said main memory cell array; and the bit lines or the column lines of said main memory cell array and the bit lines or the column lines of said redundancy memory cell array are disconnected by said disconnection circuit and a row of said redundancy memory cell array is selected if the row or column whose data stored in said memory section agrees with the row or column, whichever appropriate, selected by said second input signal; and said first or second input signal being fed to said column selection switch to select a column of said redundancy memory cell array according to said first or second input signal, whichever appropriate.

9. A semiconductor memory according to claim 1, wherein it further comprises signals lines connected to a first group of transistors for feeding said first input signal, signals lines connected to a second group of transistors for feeding said second input signal and a third group of transistors connected between said first and second groups of transistors;

said column selection switch being connected between said first and third groups of transistors;

said disconnection circuit and a selection circuit for selecting a row of said redundancy memory cell array being connected between said second and third groups of transistors;

said first or second input signal being fed to said column selection switch and said selection circuit by controlling said first, second and third groups of transistors for ON/OFF operations.

10. A semiconductor memory according to claim 1, wherein said bit lines and said column lines are arranged alternately on said main memory cell array and said redundancy memory cell array;

said main memory cell array being constituted by memory cells connected between said bit lines and said column lines;

said redundancy memory cell array being constituted by memory cells connected between a pair of adjacently arranged column lines;

said bit lines and said column lines being connected to a sense amplifier;

said column lines being connected to a bias circuit.

11. A semiconductor memory according to claim 10, wherein said bias circuit applies the ground potential or a bias potential to said column lines for reading data from memory cells of said main memory cell array; and said bias circuit applies the ground potential to every other ones of said column lines and connects the remaining column lines to the sense amplifier for reading data from memory cells of said redundancy memory cell array.

12. A semiconductor memory according to claim 1, wherein it further comprises a write circuit for writing data in memory cells of said redundancy memory cell array by applying predetermined potentials to said column lines; and the bit lines or the column lines of said main memory cell array and the bit lines or the column lines, whichever appropriate, of said redundancy memory cell array are disconnected by said disconnection circuit while said write circuit are writing data into memory cells of said redundancy memory cell array.

13. A semiconductor memory according to claim 1, wherein it further comprises one or more than one first pads to which a potential is applied to write data into memory cells of said redundancy memory cell array and one or more than one second pads to which a supply potential is applied to operate said semiconductor memory;

said supply potential being applied to both said first and second pads after the completion of the operation of writing data into memory cells of said redundancy memory cell array.

14. A semiconductor memory according to claim 1, wherein it further comprises a decoder arranged between said redundancy memory cell array and said main memory cell array in order to make the number of bit lines or the column lines passing through said redundancy memory cell array smaller than the number of bit lines or the column lines, whichever appropriate, passing through said main memory cell array.

15. A semiconductor memory comprising:

a main memory cell array;

a row decoder for selecting a row of said main memory cell array;

a redundancy memory cell array arranged at an end of said main memory cell array in the column direction and sharing common bit lines and common column lines with said main memory cell array;

a disconnection circuit arranged between said main memory cell array and said redundancy memory cell array for connecting the bit lines or the column lines of said main memory cell array to or disconnecting them from the bit lines or the column lines, whichever appropriate, of said redundancy memory cell array; and a column selection switch arranged adjacently relative to said redundancy memory cell array for selecting a column of said main memory cell array or a column of said redundancy memory cell array.

16. A semiconductor memory according to claim 15, wherein it further comprises a bias circuit arranged at the opposite end of said main memory cell array in the column direction for applying the ground potential or a bias potential to the bit lines or the column lines of said main memory cell array and the bit lines or the column lines, whichever appropriate, of said redundancy memory cell array.

17. A semiconductor memory according to claim 15, wherein it further comprises a sense amplifier arranged adjacently relative to said column selection switch.

18. A semiconductor memory according to claim 15, wherein it further comprises a redundancy circuit for selecting a row of said redundancy memory cell array and for disconnecting the bit lines or the column lines of said main memory cell array from the bit lines or the columns lines, whichever appropriate, of said redundancy memory cell array by means of said disconnection circuit for the operation of selecting a row of said redundancy memory cell array.

19. A semiconductor memory according to claim 15, wherein said main memory cell array is constituted by mask ROMs adapted to read operations and said redundancy memory cell array is constituted by PROMs having an only one polysilicon layer.

20. A semiconductor memory according to claim 15, wherein each pair of memory cells of said redundancy memory cell array arranged adjacently in the column direction has common source/drain regions.

21. A semiconductor memory according to claim 15, wherein the memory cells of said redundancy memory cell array in a row direction equal in number to the memory cells of said main memory cell array in a row direction, which are multiplied by an integer.

22. A semiconductor memory according to claim 15, wherein said disconnection circuit is constituted by MOS transistors.

23. A semiconductor memory comprising:

a pair of main memory cell arrays;

a row decoder arranged between said pair of main memory cell arrays for selecting a row of said pair of main memory cell arrays;

a pair of redundancy memory cell arrays arranged at an end of said pair of main memory cell arrays in the column direction and sharing common bit lines and common column lines with said pair of main memory cell arrays;

a disconnection circuit arranged between said pair of main memory cell arrays and said pair of redundancy memory cell arrays for connecting the bit lines or the column lines of said pair of main memory cell arrays to or disconnecting them from the bit lines or the column lines, whichever appropriate, of said pair of redundancy memory cell arrays; and a pair of column selection switches arranged adjacently relative to said pair of redundancy memory cell arrays for selecting a column of said pair of main memory cell arrays or a column of said pair of redundancy memory cell arrays.

24. A semiconductor memory according to claim 23, wherein it further comprises a bias circuit arranged at the opposite end of said pair of main memory cell arrays in the column direction for applying the ground potential or a bias potential to the bit lines or the column lines of said pair of main memory cell arrays and the bit lines or the column lines, whichever appropriate, of said pair of redundancy memory cell arrays.

25. A semiconductor memory according to claim 23, wherein it further comprises a sense amplifier arranged adjacently relative to said pair of column selection switches.

26. A semiconductor memory according to claim 23, wherein it further comprises a redundancy circuit arranged between said pair of redundancy memory cell arrays for selecting a row of said pair of redundancy memory cell arrays and for disconnecting the bit lines or the column lines of said pair of main memory cell arrays from the bit lines or the columns lines, whichever appropriate, of said pair of redundancy memory cell arrays by means of said pair of disconnection circuits for the operation of selecting a row of said pair of redundancy memory cell arrays.

27. A semiconductor memory according to claim 23, wherein said pair of main memory cell arrays are constituted by mask ROMs adapted to read operations and said pair of redundancy memory cell arrays are constituted by PROMs having an only one polysilicon layer.

28. A semiconductor memory according to claim 23, wherein each pair of memory cells of said pair of redundancy memory cell arrays arranged adjacently in the column direction has common source/drain regions.

29. A semiconductor memory according to claim 23, wherein the memory cells of said pair of redundancy memory cell arrays in a row direction equal in number to the memory cells of said pair of main memory cell arrays in a row direction, which are multiplied by an integer.

30. A semiconductor memory according to claim 23, wherein said pair of disconnection circuits are constituted by MOS transistors.

31. A semiconductor memory comprising:

a main memory cell array constituted by mask ROMs adapted to read operations;

a redundancy memory cell array arranged at an end of said main memory cell array in the column direction, having bit lines or column lines commonly shared with said main memory cell array and constituted by PROMs having an only one polysilicon layer; and a disconnection circuit arranged between said main memory cell array and said redundancy memory cell array for connecting or disconnecting the bit lines or the column lines of said main memory cell array and the bit lines or the column lines, whichever appropriate, of said redundancy memory cell array;

each of said PROMs comprising:

a semiconductor substrate, a control gate constituted by a diffusion layer arranged in said semiconductor substrate and extending in the row direction, source/drain regions also constituted by said diffusion layer in said semiconductor substrate and arranged in the row direction and a floating gate formed on a channel between said control gate and said source/drain regions and constituted by an only one polysilicon layer.

32. A semiconductor memory according to claim 31, wherein each pair of memory cells of said redundancy memory cell array arranged adjacently in the column direction has common source/drain regions.

33. A semiconductor memory according to claim 31, wherein the memory cells of said redundancy memory cell array in a row direction equal in number to the memory cells of said main memory cell array in a row direction, which are multiplied by an integer.

34. A semiconductor memory according to claim 31, wherein said disconnection circuit is constituted by MOS transistors.

35. A semiconductor memory comprising:

a main memory cell array;

a row decoder for selecting a row of said main memory cell array according to a first input signal;

a redundancy memory cell array arranged at the end of said main memory cell array in the column direction and sharing common bit lines and common column lines with said main memory cell array;

a disconnection circuit arranged between said main memory cell array and said redundancy memory cell array for connecting the bit lines or the column lines of said main memory cell array to or disconnecting them from the bit lines or the column lines, whichever appropriate, of said redundancy memory cell array;

a column selection switch arranged adjacently relative to said redundancy memory cell array for selecting a column of said main memory cell array according to a second input signal and a column of said redundancy memory cell array according to said first or second input signal; and a redundancy circuit for selecting a row of said redundancy memory cell array according to said first input signal and selecting a column of said redundancy memory cell array according to said second input signal in order to replace a row of said main memory cell array with a row of said redundancy memory cell array and for selecting a row of said redundancy memory cell array according to said second input signal and selecting a column of said redundancy memory cell array according to said first input signal in order to replace a column of said main memory cell array with a row of said redundancy memory cell array, the column lines of said main memory cell array and the column lines of said redundancy memory cell array being disconnected by said disconnection circuit for selecting a row of said redundancy memory cell array.

36. A semiconductor memory according to claim 35, wherein said main memory cell array is constituted by mask ROMs adapted to read operations and said redundancy memory cell array is constituted by PROMs having an only one polysilicon layer.

37. A semiconductor memory according to claim 35, wherein each pair of memory cells of said redundancy memory cell array arranged adjacently in the column direction has common source/drain regions.

38. A semiconductor memory according to claim 35, wherein the memory cells of said redundancy memory cell array in a row direction equal in number to the memory cells of said main memory cell array in a row direction, which are multiplied by an integer.

39. A semiconductor memory according to claim 35, wherein said redundancy circuit has a memory section for storing data on a row having a defective memory cell of said main memory cell array; and the bit lines or the column lines of said main memory cell array and the bit lines or the column lines of said redundancy memory cell array being disconnected by said disconnection circuit and a row of said redundancy memory cell array is selected if the row whose data stored in said memory section agrees with the row selected by said first input signal.

40. A semiconductor memory according to claim 35, wherein said redundancy circuit has a memory section for storing data on a column having a defective memory cell of said main memory cell array; and the column lines of said main memory cell array and the column lines of said redundancy memory cell array are disconnected by said disconnection circuit and a row of said redundancy memory cell array is selected if the column whose data stored in said memory section agrees with the column selected by said second input signal;

said first input signal being fed to said column selection switch to select a column of said redundancy memory cell array according to said first input signal.

41. A semiconductor memory according to claim 35, wherein it further comprises signals lines connected to a first group of transistors for feeding said first input signal and signals lines connected to a second group of transistors for feeding said second input signal;

said column selection switch being connected between said first and second groups of transistors;

said first or second input signal being fed to said column selection switch by controlling said first and second groups of transistors for ON/OFF operations.

42. A semiconductor memory according to claim 35, wherein said redundancy circuit includes a memory section for storing data on a column having a defective memory cell of said main memory cell array; and the bit lines or the column lines of said main memory cell array and the bit lines or the column lines of said redundancy memory cell array are disconnected by said disconnection circuit and a row of said redundancy memory cell array is selected if the row or column whose data stored in said memory section agrees with the row or column, whichever appropriate, selected by said second input signal; and said first or second input signal being fed to said column selection switch to select a column of said redundancy memory cell array according to said first or second input signal, whichever appropriate.

43. A semiconductor memory according to claim 35, wherein it further comprises signal lines connected to a first group of transistors for feeding said first input signal, signal lines connected to a second group of transistors for feeding said second input signal and a third group of transistors connected between said first and second groups of transistors;

said column selection switch being connected between said first and third groups of transistors;

said disconnection circuit and a selection circuit for selecting a row of said redundancy memory cell array being connected between said second and third groups of transistors;

said first or second input signal being fed to said column selection switch and said selection circuit by controlling said first, second and third groups of transistors for ON/OFF operations.

44. A semiconductor memory according to claim 35, wherein it further comprises a write circuit for writing data in memory cells of said redundancy memory cell array by applying predetermined potentials to said column lines; and the bit lines or the column lines of said main memory cell array and the bit lines or the column lines, whichever appropriate, of said redundancy memory cell array are disconnected by said disconnection circuit while said write circuit are writing data into memory cells of said redundancy memory cell array.

45. A semiconductor memory according to claim 35, wherein it further comprises one or more than one first pads to which a potential is applied to write data into memory cells of said redundancy memory cell array and one or more than one second pads to which a supply potential is applied to operate said semiconductor memory;

said supply potential being applied to both said first and second pads after the completion of the operation of writing data into memory cells of said redundancy memory cell array.

46. A semiconductor memory comprising:

a main memory cell array;

a redundancy memory cell array;

a row pre-decoder for outputting a first signal;

a column pre-decoder for outputting a second signal;

a row decoder for selecting memory cells of one row of said main memory cell array in response to the first signal;

a column decoder for selecting memory cells of one column of said main memory cell array in response to the second signal;

a first selecting means, including an address memory circuit for storing a defective address of said main memory cell array, for selecting memory cells of one row of said redundancy memory cell array when one of the first and second signals represents the defective address;

a second selecting means for selecting one of the columns of said main memory cell array in response to one of the first and second signals; and switching means for supplying the second signal to said second selecting means to relieve memory cells of one row of said main memory cell array, and supplying the first signal to said second selecting means to relieve memory cells of one column of said main memory cell array.

47. A semiconductor memory according to claim 46, wherein said main memory array and said redundancy memory cell array are spaced part.

48. A semiconductor memory according to claim 46, further comprising sense amplifiers provided between said main memory cell array and said redundancy memory cell array.

49. A semiconductor memory according to claim 48, wherein said sense amplifiers are connected to column lines of said main memory cell array and to column lines of said redundancy memory cell array.

50. A semiconductor memory according to claim 49, further comprising a control circuit for determining whether data in said main memory cell array or data in said redundancy memory cell array is to be supplied to said sense amplifiers.

51. A semiconductor memory according to claim 46, wherein:

said switching means includes first and second switches connected in series between said row pre-decoder and said column pre-decoder, said first switch being provided closer to said column pre-decoder, said address memory circuit being connected to a node at which said first and second switches are connected; and when the memory cells of one row of said memory cell array are relieved, said first switch is turned on, and said second switch is turned off, supplying the first signal to said first selecting means, and when the memory cells of one column of said memory cell array are relieved, said first switch is turned off, and said second switch is turned on, supplying the second signal to said first selecting means.

\* \* \* \* \*